(12) United States Patent
Ladizinsky et al.

(10) Patent No.: US 9,768,371 B2
(45) Date of Patent: Sep. 19, 2017

(54) SYSTEMS AND METHODS FOR FABRICATION OF SUPERCONDUCTING INTEGRATED CIRCUITS

(71) Applicant: D-Wave Systems Inc., Burnaby (CA)

(72) Inventors: Eric Ladizinsky, Manhattan Beach, CA (US); Jeremy P. Hilton, Burnaby (CA); Byong Hyop Oh, San Jose, CA (US); Paul I. Bunyk, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 401 days.

(21) Appl. No.: 14/383,837

(22) PCT Filed: Mar. 7, 2013

(86) PCT No.: PCT/US2013/029680
§ 371 (c)(1),
(2) Date: Sep. 8, 2014

(87) PCT Pub. No.: WO2013/180780
PCT Pub. Date: Dec. 5, 2013

(65) Prior Publication Data
US 2015/0119252 A1 Apr. 30, 2015

Related U.S. Application Data

(60) Provisional application No. 61/608,379, filed on Mar. 8, 2012, provisional application No. 61/714,642, filed on Oct. 16, 2012.

(51) Int. Cl.
*H01L 39/00* (2006.01)
*H01L 39/24* (2006.01)
(Continued)

(52) U.S. Cl.
CPC .......... *H01L 39/2493* (2013.01); *B82Y 10/00* (2013.01); *H01L 39/025* (2013.01);
(Continued)

(58) Field of Classification Search
CPC ..... H01L 38/025; H01L 38/125; H01L 38/22; H01L 38/223; H01L 38/24; H01L 38/2406; H01L 38/2493
See application file for complete search history.

(56) References Cited

U.S. PATENT DOCUMENTS 5,084,438 A * 1/1992 Matsubara .......... H01L 39/2461
257/33
7,135,701 B2 11/2006 Amin et al.
(Continued)

FOREIGN PATENT DOCUMENTS

EP      0 466 611 A1    1/1992
JP         63-7675 A    1/1988
KR    2000-0026669 A    5/2000

OTHER PUBLICATIONS

Hinode et al., "Fabrication of reliable via conductors for niobium SFQ devices," *Physica C* 426-431:1533-1540, 2005.
(Continued)

*Primary Examiner* — Colleen Dunn
(74) *Attorney, Agent, or Firm* — Seed IP Law Group LLP

(57) ABSTRACT

Various techniques and apparatus permit fabrication of superconductive circuits. A niobium/aluminum oxide/niobium trilayer may be formed and individual Josephson Junctions (JJs) formed. A protective cap may protect a JJ during fabrication. A hybrid dielectric may be formed. A superconductive integrated circuit may be formed using a subtractive patterning and/or additive patterning. A superconducting metal layer may be deposited by electroplating and/or polished by chemical-mechanical planarization. The thickness of an inner layer dielectric may be controlled by a deposition process. A substrate may include a base of silicon and top layer including aluminum oxide. Depositing of superconducting metal layer may be stopped or paused to allow cooling before completion. Multiple layers may be
(Continued)

aligned by patterning an alignment marker in a superconducting metal layer.

6 Claims, 45 Drawing Sheets

(51) Int. Cl.
    *B82Y 10/00* (2011.01)
    *H01L 39/22* (2006.01)
    *H01L 39/02* (2006.01)
    *H01L 39/12* (2006.01)
    *G06N 99/00* (2010.01)
    *H01L 27/18* (2006.01)

(52) U.S. Cl.
    CPC ............ *H01L 39/125* (2013.01); *H01L 39/22* (2013.01); *H01L 39/223* (2013.01); *H01L 39/24* (2013.01); *H01L 39/2406* (2013.01); *G06N 99/002* (2013.01); *H01L 27/18* (2013.01)

(56) References Cited

U.S. PATENT DOCUMENTS

| | | | |
|---|---|---|---|
| 7,418,283 B2 | 8/2008 | Amin | |
| 7,533,068 B2 | 5/2009 | Maassen van den Brink et al. | |
| 7,619,437 B2 | 11/2009 | Thom et al. | |
| 7,639,035 B2 | 12/2009 | Berkley | |
| 7,843,209 B2 | 11/2010 | Berkley | |
| 7,876,248 B2 | 1/2011 | Berkley et al. | |
| 7,898,282 B2 | 3/2011 | Harris et al. | |
| 8,008,942 B2 | 8/2011 | van den Brink et al. | |
| 8,018,244 B2 | 9/2011 | Berkley | |
| 8,035,540 B2 | 10/2011 | Berkley et al. | |
| 8,098,179 B2 | 1/2012 | Bunyk et al. | |
| 8,190,548 B2 | 5/2012 | Choi | |
| 8,195,596 B2 | 6/2012 | Rose et al. | |
| 8,283,943 B2 | 10/2012 | van den Brink et al. | |
| 2003/0089987 A1* | 5/2003 | Parikh | H01L 21/7681 257/758 |
| 2005/0062131 A1* | 3/2005 | Murduck | H01C 7/006 257/536 |
| 2006/0197193 A1* | 9/2006 | Gu | H01L 21/76834 257/661 |
| 2011/0022820 A1 | 1/2011 | Bunyk et al. | |
| 2011/0065586 A1 | 3/2011 | Maibaum et al. | |
| 2011/0089405 A1* | 4/2011 | Ladizinsky | B82Y 10/00 257/31 |

OTHER PUBLICATIONS

International Search Report and Written Opinion mailed Jan. 13, 2014, for corresponding International Application No. PCT/US2013/029680, 16 pages.

Ladizinsky et al., "Systems and Methods for Fabrication of Superconducting Integrated Circuits," U.S. Appl. No. 61/608,379, filed Mar. 8, 2012, 101 pages.

Ladizinsky et al., "Systems and Methods for Fabrication of Superconducting Integrated Circuits," U.S. Appl. No. 61/714,642, filed Oct. 16, 2012, 104 pages.

\* cited by examiner

SYSTEMS AND METHODS FOR FABRICATION OF SUPERCONDUCTING INTEGRATED CIRCUITS

BACKGROUND

Field

The present systems and methods relate to the fabrication of integrated circuits for superconducting applications.

Approaches to Quantum Computation

There are several general approaches to the design and operation of quantum computers. One such approach is the "circuit" or "gate" model of quantum computation. In this approach, qubits are acted upon by sequences of logical gates that are the compiled representation of an algorithm. Much research has been focused on developing qubits with sufficient coherence to form the basic elements of circuit model quantum computers.

Another approach to quantum computation involves using the natural physical evolution of a system of coupled quantum devices as a computational system. This approach may not make use of quantum gates and circuits. Instead, the computational system may start from a known initial Hamiltonian with an easily accessible ground state and be controllably guided to a final Hamiltonian whose ground state represents the answer to a problem. This approach does not typically require long qubit coherence times and may be more robust than the circuit model. Examples of this type of approach include adiabatic quantum computation and quantum annealing.

Quantum Processor

Quantum computations may be performed using a quantum processor, such as a superconducting quantum processor. A superconducting quantum processor may comprise a superconducting integrated circuit including a number of qubits and associated local bias devices, for instance two or more superconducting qubits. Further details on systems and methods of exemplary superconducting quantum processors that may be fabricated according to the present systems and methods are described in U.S. Pat. No. 7,135,701, U.S. Pat. No. 7,418,283, U.S. Pat. No. 7,533,068, U.S. Pat. No. 7,619,437, U.S. Pat. No. 7,639,035, U.S. Pat. No. 7,898,282, U.S. Pat. No. 8,008,942, U.S. Pat. No. 8,190,548, U.S. Pat. No. 8,195,596, U.S. Pat. No. 8,283,943, and US Patent Application Publication 2011-0022820, each of which is incorporated herein by reference in its entirety.

Superconducting Qubits

Superconducting qubits are a type of superconducting quantum device that can be included in a superconducting integrated circuit. Superconducting qubits can be separated into several categories depending on the physical property used to encode information. For example, they may be separated into charge, flux and phase devices. Charge devices store and manipulate information in the charge states of the device. Flux devices store and manipulate information in a variable related to the magnetic flux through some part of the device. Phase devices store and manipulate information in a variable related to the difference in superconducting phase between two regions of the phase device. Recently, hybrid devices using two or more of charge, flux and phase degrees of freedom have been developed.

Superconducting integrated circuits may include single flux quantum (SFQ) devices. The integration of SFQ devices with superconducting qubits is discussed in, for example, U.S. Pat. No. 7,876,248, U.S. Pat. No. 8,035,540, U.S. Pat. No. 8,098,179, and US Patent Publication Number 2011-0065586, each of which is incorporated herein by reference in its entirety.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting "classical" processors. Due to their natural physical properties, superconducting classical processors may be capable of higher switching speeds and shorter computation times than non-superconducting processors, and therefore it may be more practical to solve certain problems on superconducting classical processors. The present systems and methods are particularly well-suited for use in fabricating both superconducting quantum processors and superconducting classical processors.

Integrated Circuit Fabrication

Traditionally, the fabrication of superconducting integrated circuits has not been performed at state-of-the-art semiconductor fabrication facilities. This may be due to the fact that some of the materials used in superconducting integrated circuits can contaminate the semiconductor facilities. For instance, gold may be used as a resistor in superconducting circuits, but gold can contaminate a fabrication tool used to produce CMOS wafers in a semiconductor facility. Consequently, superconducting integrated circuits containing gold are typically not processed by tools which also process CMOS wafers.

Superconductor fabrication has typically been performed in research environments where standard industry practices could be optimized for superconducting circuit production. Superconducting integrated circuits are often fabricated with tools that are traditionally used to fabricate semiconductor chips or integrated circuits. Due to issues unique to superconducting circuits, not all semiconductor processes and techniques are necessarily transferable to superconductor chip manufacture. Transforming semiconductor processes and techniques for use in superconductor chip and circuit fabrication often requires changes and fine adjustments. Such changes and adjustments typically are not obvious and may require a great deal of experimentation. The semiconductor industry faces problems and issues not necessarily related to the superconducting industry. Likewise, problems and issues that concern the superconducting industry are often of little or no concern in standard semiconductor fabrication.

Any impurities within superconducting chips may result in noise which can compromise or degrade the functionality of the individual devices, such as superconducting qubits, and of the superconducting chip as a whole. Since noise is a serious concern to the operation of quantum computers, measures should be taken to reduce dielectric noise wherever possible.

The art of integrated circuit fabrication typically involves multiple processes that may be sequenced and/or combined to produce a desired effect. Exemplary systems and methods for superconducting integrated circuit fabrication that may be combined, in whole or in part, with at least some embodiments of the present systems and methods are described in US Patent Publication Number 2011-0089405, which is incorporated herein by reference in its entirety.

Etching

Etching removes layers of, for example, substrates, dielectric layers, oxide layers, electrically insulating layers and/or metal layers according to desired patterns delineated by photoresists or other masking techniques. Two exemplary etching techniques are wet chemical etching and dry chemical etching.

Wet chemical etching or "wet etching" is typically accomplished by submerging a wafer in a corrosive bath such as an acid bath. In general, etching solutions are housed in polypropylene, temperature-controlled baths. The baths are usually equipped with either a ring-type plenum exhaust ventilation or a slotted exhaust at the rear of the etch station. Vertical laminar-flow hoods are typically used to supply uniformly-filtered, particulate-free air to the top surface of the etch baths.

Dry chemical etching or "dry etching" is commonly employed due to its ability to better control the etching process and reduce contamination levels. Dry etching effectively etches desired layers through the use of gases, either by chemical reaction such as using a chemically reactive gas or through physical bombardment, such as plasma etching, using, for example, argon atoms.

Plasma etching systems have been developed that can effectively etch, for example, silicon, silicon dioxide, silicon nitride, aluminum, tantalum, tantalum compounds, chromium, tungsten, gold, and many other materials. Two types of plasma etching reactor systems are in common use—the barrel reactor system and the parallel plate reactor system. Both reactor types operate on the same principles and vary primarily in configuration only. The typical reactor consists of a vacuum reactor chamber made usually of aluminum, glass, or quartz. A radiofrequency or microwave energy source (referred to collectively as RF energy source) is used to activate fluorine-based or chlorine-based gases which act as etchants. Wafers are loaded into the chamber, a pump evacuates the chamber, and the reagent gas is introduced. The RF energy ionizes the gas and forms the etching plasma, which reacts with the wafers to form volatile products which are pumped away.

Physical etching processes employ physical bombardment. For instance, argon gas atoms may be used to physically bombard a layer to be etched, and a vacuum pump system is used to remove dislocated material. Sputter etching is one physical technique involving ion impact and energy transfer. The wafer to be etched is attached to a negative electrode, or "target," in a glow-discharge circuit. Positive argon ions bombard the wafer surface, resulting in the dislocation of the surface atoms. Power is provided by an RF energy source. Ion beam etching and milling are physical etching processes which use a beam of low-energy ions to dislodge material. The ion beam is extracted from an ionized gas (e.g., argon or argon/oxygen) or plasma, created by an electrical discharge.

Reactive ion etching (RIE) is a combination of chemical and physical etching. During RIE, a wafer is placed in a chamber with an atmosphere of chemically reactive gas (e.g., $CF_4$, $CCl_4$, $CHF_3$, and many other gases) at a low pressure. An electrical discharge creates an ion plasma with an energy of a few hundred electron volts. The ions strike the wafer surface vertically, where they react to form volatile species that are removed by the low pressure in-line vacuum system.

BRIEF SUMMARY

A method of forming a trilayer Josephson junction may be summarized as including depositing a superconducting trilayer including a base electrode layer, an insulating layer, and a counter electrode layer; depositing a photoresist mask pattern over the superconducting trilayer; etching a pattern into the superconducting trilayer to form at least one Josephson junction, wherein etching a pattern into the superconducting trilayer to form at least one Josephson junction includes removing at least two portions of the counter electrode layer and removing at least two portions of the insulating layer to expose at least two portions of the base electrode layer. Removing at least two portions of the counter electrode layer may include using a combination of SF6, BCl3, and Cl2 to remove at least two portions of the counter electrode layer, and removing at least two portions of the insulating layer may include using a combination of SF6, BCl3, and Cl2 to remove at least two portions of the insulating layer.

A method of forming a superconducting trilayer may be summarized as including depositing a first layer of niobium; depositing a layer of aluminum oxide over at least a portion of the first layer of niobium via atomic layer deposition; and depositing a second layer of niobium over at least a portion of the layer of aluminum oxide. The method may further include depositing a layer of aluminum over at least a portion of the first layer of niobium; and depositing the layer of aluminum oxide over at least a portion of the layer of aluminum.

A method of forming a superconducting trilayer within a chamber may be summarized as including depositing a base layer of niobium within the chamber; depositing a layer of aluminum oxide over at least a portion of the base layer of niobium within the chamber; filling the chamber with an inert gas to thermalize the base layer of niobium and the aluminum oxide layer; pumping the inert gas out of the chamber; and depositing a top layer of niobium over at least a portion of the aluminum oxide layer within the chamber. Filling the chamber with an inert gas may include filing the chamber with argon.

A method of depositing a protective cap over a Josephson junction may be summarized as including depositing a superconducting trilayer including an aluminum oxide layer; patterning the superconducting trilayer to expose at least a portion of the aluminum oxide layer; pre-cleaning the exposed portion of the aluminum oxide layer; and depositing the protecting cap over the trilayer. Pre-cleaning the exposed portion of the aluminum oxide layer may include pre-cleaning the exposed portion of the aluminum oxide layer with ions. Pre-cleaning the exposed portion of the aluminum oxide layer may include pre-cleaning the exposed portion of the aluminum oxide layer via a gentle, anisotropic low pressure etch.

A method of depositing a hybrid dielectric may be summarized as including depositing a first dielectric layer comprising a first dielectric material; depositing a second dielectric layer over at least a portion of the first dielectric layer, wherein the second dielectric layer comprises a second dielectric material; and depositing a third dielectric layer over at least a portion of the second dielectric layer, wherein the third dielectric layer comprises a third dielectric material. Depositing a third dielectric material may include depositing a same type of material as the first dielectric material. Depositing a first dielectric material may include depositing a non-oxide dielectric, and depositing a second dielectric material may include depositing an oxide dielectric.

A superconducting integrated circuit may be summarized as including a first superconducting metal layer; a hybrid dielectric layer that overlies the first superconducting metal layer, wherein the hybrid dielectric layer comprises a first layer of silicon nitride that directly overlies the first superconducting metal layer, a layer of silicon dioxide that directly overlies the first layer of silicon nitride, and a second layer of silicon nitride that directly overlies the layer of silicon dioxide; and a second superconducting metal layer that overlies the hybrid dielectric layer, wherein the second superconducting metal layer directly overlies the second layer of silicon nitride in the hybrid dielectric layer.

A method of fabricating a superconducting integrated circuit may be summarized as including depositing a first dielectric layer; depositing a negative photoresist mask over the first dielectric layer that traces out a negative pattern of a desired circuit pattern such that the desired circuit pattern corresponds to regions of the first dielectric layer that are not directly covered by the negative photoresist mask; etching the desired circuit pattern into the first dielectric layer to produce open features in the first dielectric layer; depositing a first superconducting metal layer over the first dielectric layer to at least partially fill the open features in the first dielectric layer; planarizing the first superconducting metal layer; depositing a second dielectric layer to produce a desired inner layer dielectric thickness, wherein the inner layer dielectric thickness is controlled by a deposition process; and depositing a second superconducting metal layer above the second dielectric layer. Depositing a first superconducting metal layer may include depositing the first superconducting metal layer via electroplating.

A method of fabricating a superconducting integrated circuit may be summarized as including patterning a first superconducting metal layer; depositing a first dielectric layer over the first superconducting metal layer; depositing a first negative photoresist mask over the first dielectric layer, wherein the first negative photoresist mask provides a negative of a location of at least one via such that the location of the at least one via corresponds to a region of the first dielectric layer that is not directly covered by the first negative photoresist mask; etching the first dielectric layer to produce at least one hole corresponding to that at least one via, wherein the at least one hole exposes a portion of the first superconducting metal layer; depositing a second superconducting metal layer over the first dielectric layer to at least partially fill the at least one hole and provide a first portion of at least a first via; planarizing the second superconducting metal layer; depositing a second dielectric layer; depositing a second negative photoresist mask over the second dielectric layer that traces out a negative of a desired circuit pattern such that the desired circuit pattern corresponds to regions of the second dielectric layer that are not directly covered by the second negative photoresist mask; etching the desired circuit pattern into the second dielectric layer to produce open features in the second dielectric layer; depositing a third negative photoresist mask over the second dielectric layer, wherein the third negative photoresist mask provides a negative of a location of at least one via such that the location of the at least one via corresponds to a region of the second dielectric layer that is not directly covered by the third negative photoresist mask, and the location of the at least one via is within an open feature in the second dielectric layer; etching the second dielectric layer to produce at least one hole corresponding to the at least one via, wherein the at least one hole exposes a portion of the first portion of the first via; depositing a third superconducting metal layer over the second dielectric layer to at least partially fill the at least one hole in the second dielectric layer and provide a second portion of the first via and to at least partially fill the open features in the second dielectric layer; and planarizing the third superconducting metal layer. At least one of depositing a second superconducting metal and depositing a third superconducting metal layer may include electroplating. At least one of planarizing the second superconducting metal layer and planarizing the third superconducting metal layer may include chemical mechanical planarization.

A substrate for use in a superconducting integrated circuit may be summarized as including a base layer comprising silicon; and a top layer comprising aluminum oxide. The base layer may include at least one of: undoped silicon, doped silicon, sapphire, and quartz. The base layer may be thicker than the top layer.

A method of depositing a superconducting metal layer in an integrated circuit may be summarized as including depositing a first portion of the superconducting metal layer; stopping the depositing of the first portion of the superconducting metal layer to prevent excessive heating; cooling the superconducting metal layer; and depositing a second portion of the superconducting metal layer over the first portion of the superconducting metal layer. The method may further include stopping the depositing of the second portion of the superconducting metal layer to prevent excessive heating; cooling the superconducting metal layer; and depositing a third portion of the superconducting metal layer over the second portion of the superconducting metal layer.

A method of aligning multiple layers in a multilayered superconducting integrated circuit may be summarized as including patterning a first superconducting metal layer to include at least one alignment mark; depositing a first dielectric layer over the first superconducting metal layer; patterning the first dielectric layer to expose the at least one alignment mark; depositing a second superconducting metal layer over the first dielectric layer such that an impression of the at least one alignment mark is formed on an exposed surface of the second superconducting metal layer; and aligning a photoresist mask to the impression of the at least one alignment mark on the second superconducting metal layer. The method may further include depositing the photoresist mask over the second superconducting metal layer.

A method of fabricating a superconducting integrated circuit may be summarized as including depositing a first superconducting metal layer; depositing a superconducting protective capping layer over the first superconducting metal layer; patterning both the first superconducting metal layer and the superconducting protective capping layer over the first superconducting metal layer; depositing a dielectric layer over the patterned superconducting protective capping layer; etching a hole through the dielectric layer to expose a portion of at least one of the superconducting protective capping layer or the first superconducting metal layer; and depositing a second superconducting metal layer over the dielectric layer such that at least a portion of the second superconducting metal layer at least partially fills the hole through the dielectric layer and forms a superconducting electrical connection with at least one of the superconducting protective capping layer or the first superconducting metal layer. Depositing a superconducting protective capping layer over the first superconducting metal layer may include depositing a titanium nitride layer over the first superconducting metal layer.

A superconducting integrated circuit may be summarized as including a first patterned superconducting metal layer; a superconducting protective capping layer positioned over the first patterned superconducting metal layer, wherein the superconducting protective capping layer is patterned to match a pattern in the first patterned superconducting metal layer; a dielectric layer positioned over the superconducting protective capping layer; a second patterned superconducting metal layer positioned over the dielectric layer; and a superconducting via that extends through the dielectric layer and superconductingly electrically couples a portion of the second patterned superconducting metal layer to at least one of a portion of the superconducting protective capping layer or a portion of the first superconducting metal layer. The superconducting protective capping layer may include titanium nitride.

A method of fabricating a Josephson junction pentalayer may be summarized as including depositing a first superconducting metal layer; depositing a first insulating barrier over the first superconducting metal layer, wherein the first insulating barrier has a first thickness; depositing a second superconducting metal layer over the first insulating barrier; depositing a second insulating barrier over the second superconducting metal layer, wherein the second insulating barrier has a second thickness that is different from the first thickness of the first insulating barrier; and depositing a third superconducting metal layer over the second insulating barrier. Depositing a second insulating barrier over the second superconducting metal layer, wherein the second insulating barrier has a second thickness that is different from the first thickness of the first insulating barrier, may include depositing a second insulating barrier over the second superconducting metal layer, wherein the second insulating barrier has a second thickness that is larger than the first thickness of the first insulating barrier.

A superconducting integrated circuit may be summarized as including a Josephson junction pentalayer including a first superconducting metal layer; a first insulating barrier having a first thickness, wherein the first insulating barrier is positioned over the first superconducting metal layer; a second superconducting metal layer positioned over the first insulating barrier; a second insulating barrier having a second thickness, wherein the second insulating barrier is positioned over the second superconducting metal layer; and a third superconducting metal layer positioned over the second insulating barrier; a dielectric layer positioned over the Josephson junction pentalayer; a superconducting wiring layer positioned over the dielectric layer; and at least one superconducting via that superconductingly electrically couples at least a portion of the superconducting wiring layer to at least a portion of the Josephson junction pentalayer. The second thickness of the second insulating barrier may be greater than the first thickness of the first insulating barrier. At least a first portion of the Josephson junction pentalayer may be patterned to form a first Josephson junction including: a first portion of the third superconducting metal layer; a first portion of the second insulating barrier; a first portion of the second superconducting metal layer; a first portion of the first insulating barrier; and a first portion of the first superconducting metal layer, and at least one superconducting via may superconductingly electrically couple a first portion of the second superconducting wiring layer to the first portion of the third superconducting metal layer. At least a second portion of the Josephson junction pentalayer may be patterned to form a second Josephson junction including: a second portion of the second superconducting metal layer; a second portion of the first insulating barrier; and a second portion of the first superconducting metal layer, and at least one superconducting via may superconductingly electrically couple a second portion of the second superconducting wiring layer to the second portion of the second superconducting metal layer. At least a first portion of the Josephson junction pentalayer may be patterned to form a first Josephson junction including: a first portion of the second superconducting metal layer; a first portion of the first insulating barrier; and a first portion of the first superconducting metal layer, and at least one superconducting via may superconductingly electrically couple a first portion of the second superconducting wiring layer to the first portion of the second superconducting metal layer.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION

Figure 1A:
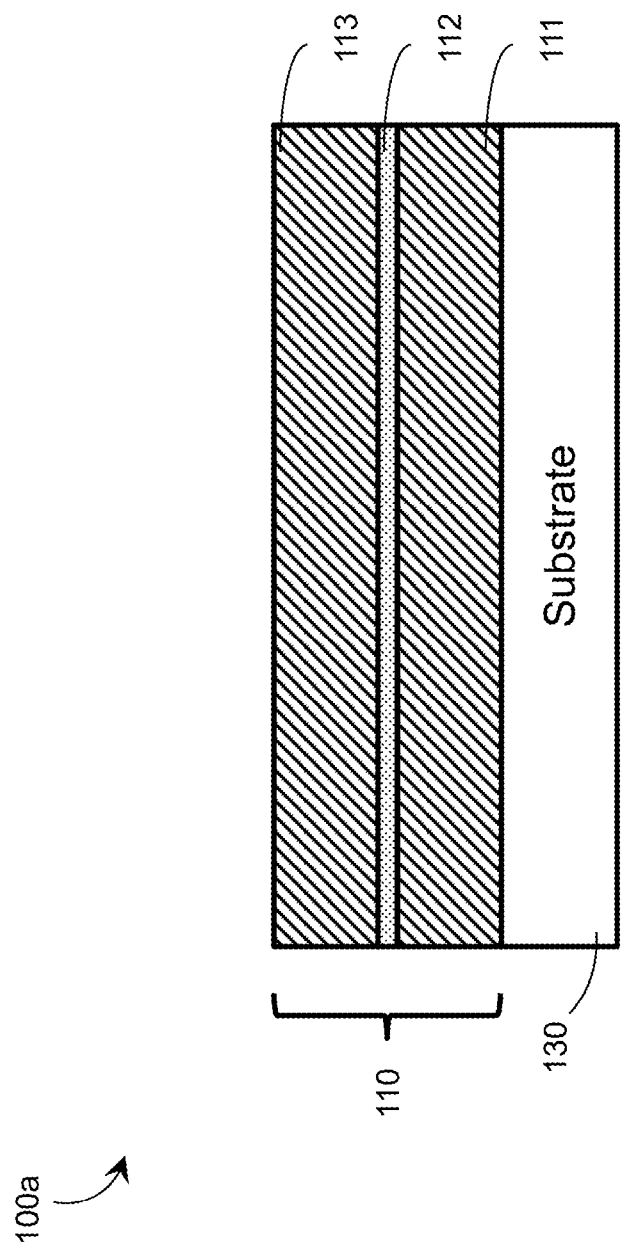
FIG. 1A is an elevational, partially sectioned, view of a portion of a superconducting integrated circuit including an unpatterned trilayer, according to one illustrated embodiment.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with superconductive circuits or structures, quantum computer circuits or structures and/or cryogenic cooling systems such as dilution refrigerators have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in this specification and the appended claims the terms "carried by," "carried on," or variants thereof, and similarly the terms "over" and "above," mean that one structure is directly or indirectly supported in at least some instances by another structure, for example directly on a surface thereof, spaced above or below a surface thereof by one or more intervening layers or structures or located therein.

The headings and Abstract of the Disclosure provided herein are for convenience only and do not interpret the scope or meaning of the embodiments.

Unless the specific context requires otherwise, throughout this specification the terms "deposit," "deposited," "deposition," and the like are generally used to encompass any method of material deposition, including but not limited to physical vapor deposition (PVD), chemical vapor deposition (CVD), plasma-enhanced PVD, plasma-enhanced CVD, and atomic layer deposition (ALD).

The various embodiments described herein provide systems and methods for fabricating superconducting integrated circuits. As previously described, in the art superconducting integrated circuits tend to be fabricated in research environments outside of state-of-the-art semiconductor fabrication facilities, even though superconducting integrated circuits are typically fabricated using many of the same tools and techniques that are traditionally used in the semiconductor fabrication industry. Due to issues unique to superconducting circuits, semiconductor processes and techniques generally need to be modified for use in superconductor chip and circuit fabrication. Such modifications typically are not obvious and may require some experimentation.

A Josephson junction is a common element in superconducting integrated circuits. Physically, a Josephson junction is a small interruption in an otherwise continuous superconducting current path, typically realized by a thin insulating barrier sandwiched in between two superconducting electrodes. In superconducting integrated circuits, Josephson junctions are typically fabricated as a stack comprising a superconducting base electrode overlaid with a thin insulating layer, which is then overlaid with a superconducting counter electrode. Thus, a Josephson junction is usually formed as a three-layer, or "trilayer," structure. A trilayer may be deposited completely over an entire wafer (i.e., in the same way that metal wiring and dielectric layers are deposited) and then patterned to define individual Josephson junctions.

FIG. 1A shows a sectional view of a portion of a superconducting integrated circuit 100*a* including an unpatterned trilayer 110. Trilayer 110 is carried on a substrate 130 and comprises: a superconducting base electrode 111 formed of, for example, niobium Nb; an insulating barrier 112 formed of, for example, an aluminum oxide AlOx; and a superconducting counter electrode 113 formed of, for example, niobium Nb. Substrate 130 may comprise silicon, sapphire, quartz, silicon dioxide, or any similar suitable material. In some embodiments, the upper surface of a niobium base electrode 111 may be covered with a thin layer of aluminum (not illustrated) upon which aluminum oxide layer 112 is grown (thus, a "trilayer" may in fact comprise four layers: a niobium base electrode, a layer of aluminum, a layer of aluminum oxide grown upon the layer of aluminum, and a niobium counter electrode). Trilayer 110 may be patterned by, for example, a lithographic photoresist masking and plasma etching process to form individual Josephson junctions. In some applications, counter electrode 113 may be patterned to define individual junctions and base electrode 111 may be used as a wiring layer providing electrical connections between junctions. During the patterning of counter electrode 113, aluminum oxide layer 112 may be used as an etch-stop and the niobium of counter electrode 113 may be etched using a chemistry that does not etch through aluminum oxide layer 112.

Figure 1B:
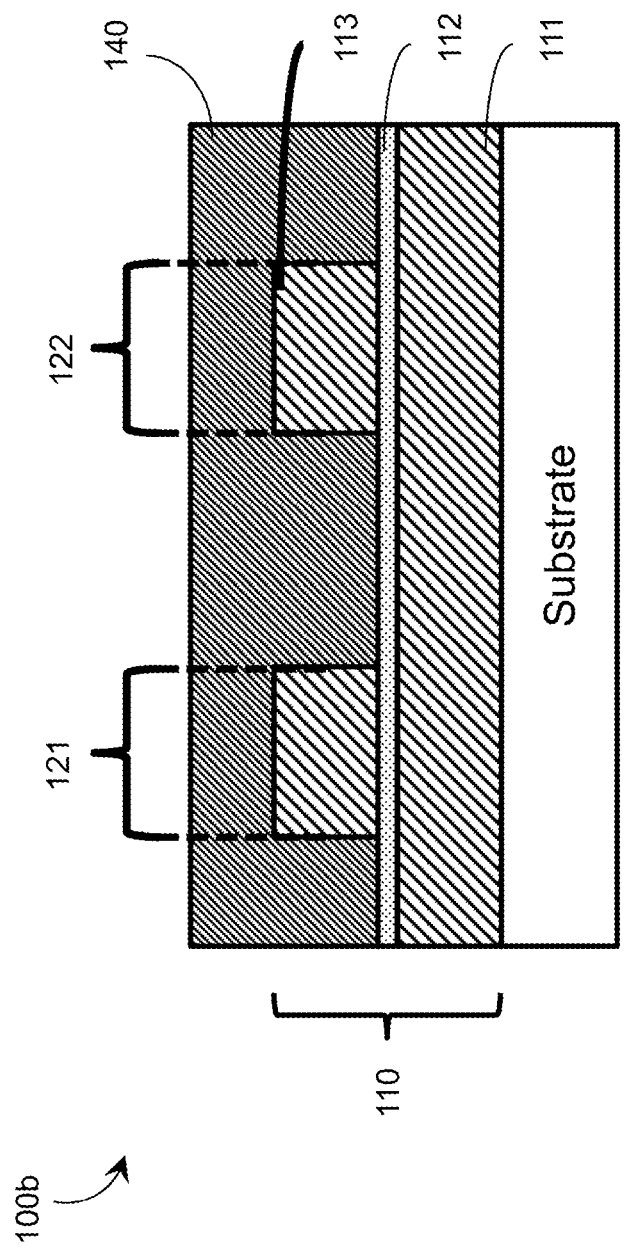
FIG. 1B is an elevational, partially sectioned, view of the portion of a superconducting integrated circuit of FIG. 1A after further processing operation(s) and which includes a patterned trilayer and a counter electrode, according to one illustrated embodiment.

FIG. 1B shows a sectional view of a portion of a superconducting integrated circuit 100*b* including a patterned trilayer 110. FIG. 1B depicts superconducting integrated circuit 100*a* from FIG. 1A after counter electrode 113 has been etched to define individual Josephson junctions 121 and 122 while using aluminum oxide layer 112 as an etch-stop. Dielectric layer 140 (which may comprise, e.g., silicon dioxide) has also been deposited over trilayer 110. When aluminum oxide layer 112 is used as an etch-stop, the regions of aluminum oxide layer 112 that are outside of the individual Josephson junctions 121 and 122 may be left in place (i.e., unetched). However, Applicants have recognized that in applications where Josephson junctions 121 and 122 and/or the superconducting wiring in base electrode 111 are particularly sensitive to noise (e.g., in applications employing superconducting qubits such as in a superconducting quantum processor), the interface between niobium base electrode 111 and aluminum oxide layer 112 and/or the interface between aluminum oxide layer 112 and dielectric layer 140 may introduce unwanted and unnecessary noise into the system. In accordance with the present systems and methods, such noise may be avoided by removing the regions of aluminum oxide layer 112 that are outside of the individual Josephson junctions 121 and 122 and thereby reducing the total number of material interfaces in the integrated circuit structure.

Figure 1C:
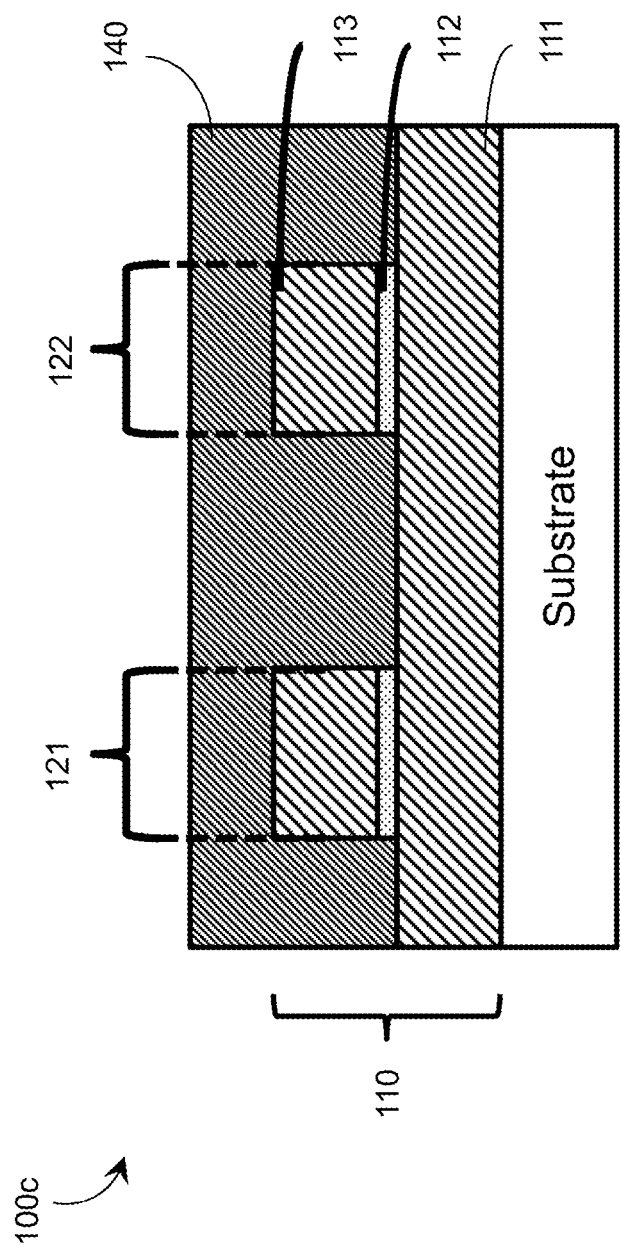
FIG. 1C is an elevational, partially sectioned, view of a portion of a superconducting integrated circuit of FIG. 1B after further processing operation(s) and which includes individual Josephson junctions, according to one illustrated embodiment.

FIG. 1C shows a sectional view of a portion of a superconducting integrated circuit 100*c* including a patterned trilayer 110 from which excess aluminum oxide 112 has been removed in accordance with the present systems and methods. FIG. 1C depicts superconducting integrated circuit 100*a* from FIG. 1A after counter electrode 113 has been etched to define individual Josephson junctions 121 and 122 without using aluminum oxide layer 112 as an etch-stop. Thus, integrated circuit 100c differs from integrated circuit 100b in that regions of aluminum oxide layer 112 that are outside of the individual Josephson junctions 121 and 122 have been etched away in integrated circuit 100c. Regions of aluminum oxide layer 112 that are outside of the individual Josephson junctions 121 and 122 may be etched away, for example, during the patterning and etching of niobium counter electrode 113 by employing an etching chemistry that does not use aluminum oxide layer 112 as an etch-stop. $SF_6$ may be used to etch niobium and a combination of $BCl_3$, $Cl_2$, and $N_2$ may be used to etch aluminum. In accordance with the present systems and methods, niobium counter electrode 113 may be etched using a combination of $SF_6$, $BCl_3$, $Cl_2$, and/or $N_2$ because such an etch chemistry may also remove the regions of aluminum oxide layer 112 that are outside of the individual Josephson junctions 121 and 122. Removing aluminum oxide during the etch of individual Josephson junctions may reduce the number of material interfaces in a superconducting integrated circuit and, as a result, reduce noise that may otherwise have an adverse effect on circuit performance. In accordance with the present systems and methods, regions of aluminum oxide layer 112 that are outside of the individual Josephson junctions 121 and 122 may also be removed in a separate process act or operation after the Josephson junction 121 and 122 have been defined by employing a separate etch specifically designed to remove aluminum oxide.

Furthermore, in accordance with the present systems and methods, any superconducting fabrication process that involves etching niobium (even if the process is not to pattern Josephson junctions and/or remove aluminum oxide layers) may benefit from a modified niobium-etching chemistry that employs a combination of $SF_6$ with $BCl_3$, $Cl_2$, and/or $N_2$ because such may result in a smoother, flatter niobium surface profile compared to a $SF_6$ etch on its own, and particularly smoother, flatter niobium sidewalls.

Figure 2:
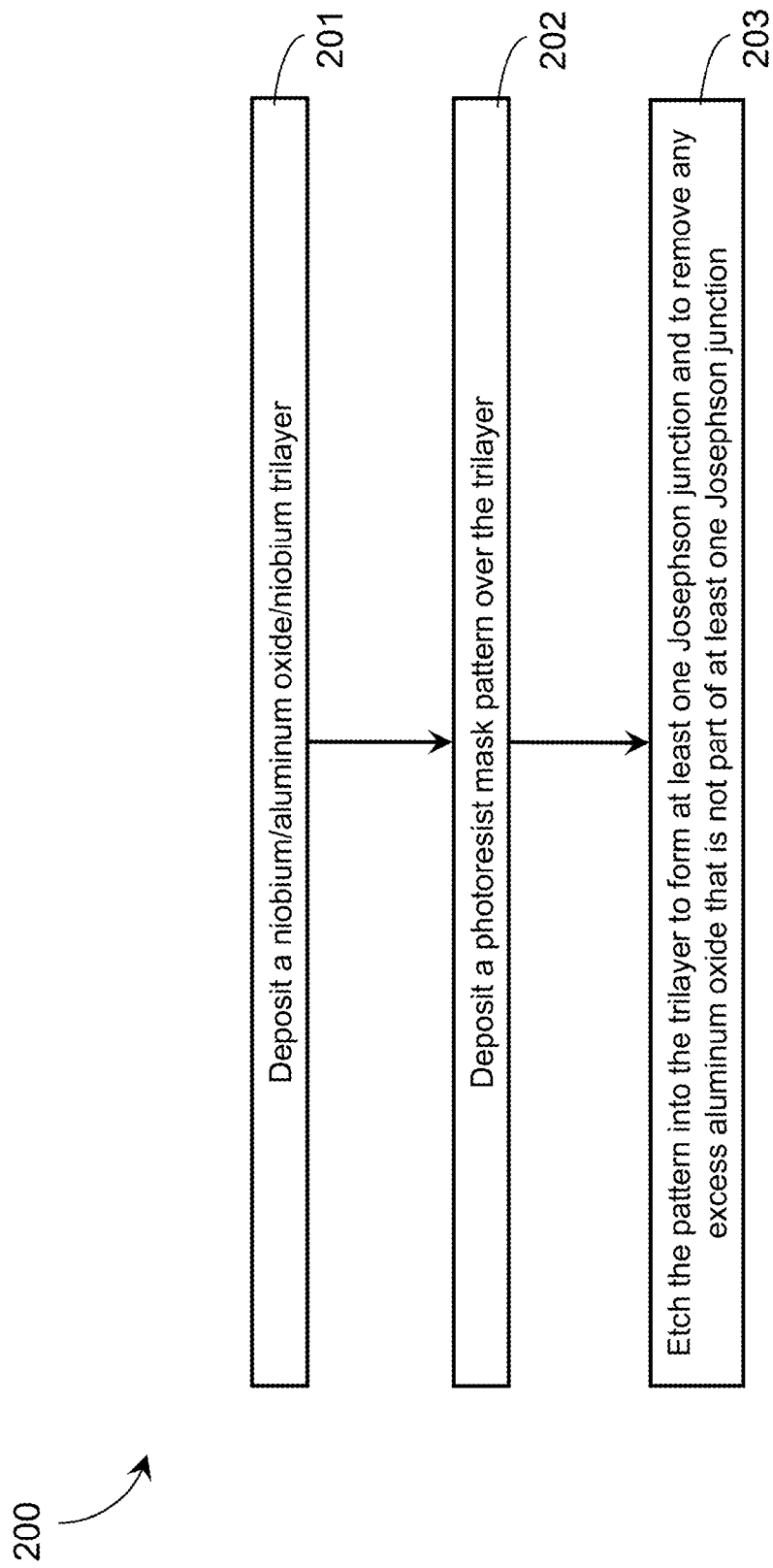
FIG. 2 is a flow diagram showing a method of fabricating a Josephson junction from a niobium/aluminum oxide/niobium trilayer, according to one illustrated embodiment.

The process of removing excess aluminum oxide during Josephson junction fabrication (i.e., in going from FIG. 1A to FIG. 1C) is summarized in FIG. 2. FIG. 2 shows a method 200 of fabricating a Josephson junction from a niobium/aluminum oxide/niobium trilayer in accordance with the present systems and methods. Method 200 includes three acts 201-203, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 201, an Nb—AlOx-Nb trilayer is deposited, e.g., employing techniques described previously. At 202, a photoresist mask pattern is deposited over or on top of the trilayer. The photoresist mask layer may cover some portions of the trilayer and leave other portions of the trilayer uncovered. Those portions of the trilayer that are uncovered will be etched away during the etch process (see act 203), while those portions of the trilayer that are covered will remain after the etch process. At 203, the pattern defined by the photoresist mask is etched into the trilayer to form at least one Josephson junction. Where a Josephson junction is formed, a portion of aluminum oxide will be sandwiched in between two portions of niobium metal (i.e., a patterned counter electrode over a base electrode). Where no Josephson junction is formed, the niobium counter electrode layer of the trilayer is etched away (i.e., stripped) and at least the portion of aluminum oxide that underlies the stripped counter electrode is also etched away such that any excess aluminum oxide that is not part of at least one Josephson junction is removed.

In processes that employ niobium etching, the photoresist mask typically needs to be removed after the niobium etching has been completed. The etching chemistry that is used to etch the niobium cannot, by design, etch the photoresist mask or the process would fail to pattern the niobium. However, the photoresist mask does typically need to be removed once the niobium etching is complete in order to, for example, allow via connections to be made to subsequent niobium layers added to the circuit (e.g., additional niobium layers carried on the etched niobium layer). In the art, the photoresist mask (and related polymers that may be formed by interactions between the photoresist mask and the niobium itself) is typically stripped away via an $O_2$ plasma etching/bombardment process. However, an $O_2$ plasma on its own may not be sufficient to remove some of the polymers that result from the adhesion of the photoresist mask to the niobium metal. In accordance with the present systems and methods, a modified photoresist-stripping process may employ a combination of $CF_4$ and $O_2$ plasma to more reliably remove photoresist mask residue (e.g., polymers formed by interactions between the photoresist mask and the niobium metal) from the surface of niobium metal.

In the fabrication of a Nb—AlOx-Nb trilayer, a first layer of niobium may be deposited and a thin layer of aluminum may be deposited over the first layer of niobium. The aluminum is then exposed to $O_2$ gas to grow a layer of aluminum oxide on the upper surface of the aluminum. It is typically desired to produce a very specific and uniform aluminum oxide thickness at this stage. The thickness of the AlOx layer ultimately affects the critical current of any Josephson junctions in the resulting superconducting integrated circuit and is therefore an important fabrication parameter. In this process, the thickness of the AlOx layer is determined by several parameters, including the duration of the exposure to the $O_2$ gas, the concentration of the $O_2$ gas, the temperature, the pressure, etc. Thus, given the $O_2$ concentration, the pressure, the temperature, etc., an $O_2$ exposure time is calculated to produce the desired AlOx thickness. Once the calculated $O_2$ exposure time has elapsed, a second layer of niobium is deposited over the aluminum oxide layer to complete the Nb—AlOx-Nb trilayer. This process for fabricating Nb—AlOx-Nb trilayers is well-established, but ultimately provides limited control of the thickness of the AlOx layer produced. The AlOx thickness is determined indirectly through a calculation involving many inputs, and each of these inputs carries some uncertainty which affects the resulting thickness of AlOx produced. For example, any variation in the pressure, temperature, $O_2$ concentration, $O_2$ exposure time, etc. will impact the thickness of the AlOx layer produced. Accordingly, there remains a need in the art for a method of fabricating Nb—AlOx-Nb trilayers that achieves improved AlOx thickness control.

Figure 3:
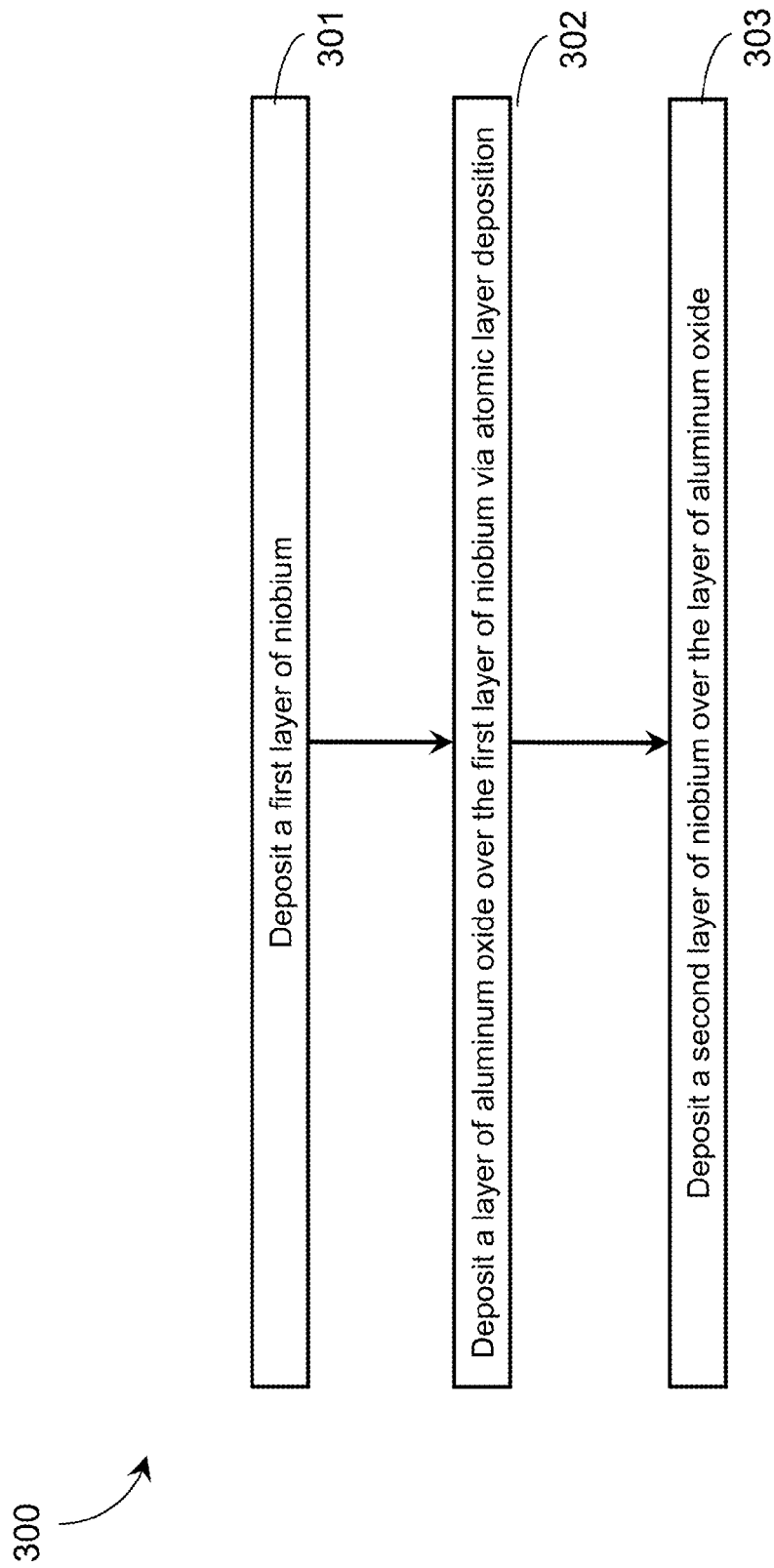
FIG. 3 is a flow diagram showing a method of fabricating a niobium/aluminum oxide/niobium trilayer, according to one illustrated embodiment.

In accordance with the present systems and methods, improved AlOx thickness control in the fabrication of Nb—AlOx-Nb trilayers may be achieved by directly depositing the aluminum oxide layer via atomic layer deposition. FIG. 3 shows a method 300 for fabricating a niobium/aluminum oxide/niobium trilayer in accordance with the present systems and methods. Method 300 includes three acts 301-303, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 301, a first layer of niobium is deposited via a standard deposition process such as chemical vapor deposition, physical vapor deposition, or similar. The niobium may be deposited over a substrate or over any other layer of an integrated circuit (such as over a dielectric layer, or over another metal layer). The upper surface of the niobium is preferably smooth and substantially uniform. If the desired smoothness cannot be achieved during the deposition process alone then the upper surface of the niobium may be planarized and/or polished via a chemical-mechanical planarization process (e.g., CMP). At 302, a layer of aluminum oxide is deposited over the smooth upper surface of the first niobium layer via atomic layer deposition. Atomic layer deposition allows the aluminum oxide layer to be actively built and may enable improved control of the thickness of the aluminum oxide layer compared to the $O_2$ exposure process known in the art and described above. In some embodiments, the adhesion of the aluminum oxide layer to the niobium layer may be increased by first depositing a thin aluminum layer (e.g., via CVD, PVD, or ALD) over the smooth upper surface of the niobium layer and then depositing the aluminum oxide layer via atomic layer deposition over the thin aluminum layer (such a thin aluminum layer may be planarized or polished to improve smoothness, if necessary). At 303, a second layer of niobium is deposited over the aluminum oxide layer via a standard deposition process (e.g., CVD or PVD). The deposition of the second niobium layer completes the Nb—AlOx-Nb trilayer which may be used to form one or more Josephson junctions in a superconducting integrated circuit.

Trilayer deposition (and specifically the aluminum oxide deposition/growth process) is particularly sensitive to temperature. The existence of a non-uniform temperature (e.g., a temperature gradient) across a wafer may result in non-uniform aluminum oxide thickness across the wafer. Such a non-uniform temperature can result during a heating process and/or a cooling process alike. For example, a wafer may be heated during an aluminum oxide deposition process and may cool before the subsequent niobium deposition process. During this cooling, the aluminum oxide layer may continue to form and grow. It is therefore desirable to ensure substantially uniform cooling of the wafer in between the aluminum oxide deposition/growth and the subsequent niobium deposition of a trilayer fabrication process. In accordance with the present systems and methods, uniformity during such cooling may be enhanced by filling the deposition chamber with an inert gas (e.g., argon) to provide a thermalization medium having a substantially uniform pressure across the wafer. In some embodiments, trilayers may be deposited on multiple wafers in the same chamber simultaneously and filling the chamber with an inert cooling gas (e.g., argon) may improve uniformity of temperature across multiple wafers.

Figure 4:
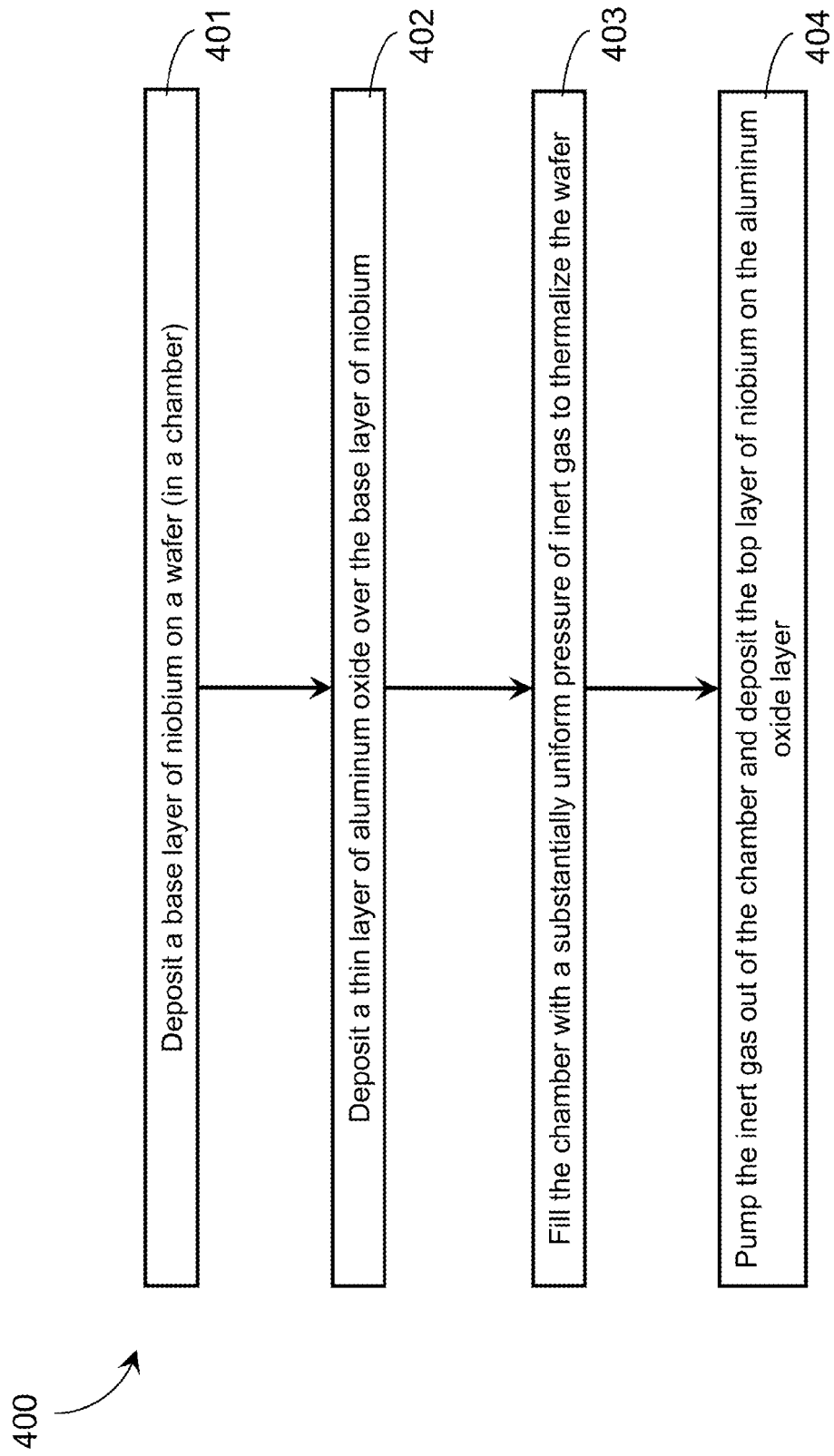
FIG. 4 is a flow diagram showing a method of forming a niobium/aluminum oxide/niobium trilayer, according to one illustrated embodiment.

FIG. 4 shows a method 400 for forming a niobium/aluminum oxide/niobium trilayer in accordance with the present systems and methods. Method 400 includes four acts 401-404, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 401, a base layer of niobium is deposited over a wafer. The niobium may be deposited via any known deposition technique, including CVD, PVD, ALD, and the like. The deposition may be carried out in a sealed chamber. At 402, an aluminum oxide layer is deposited over the niobium base layer. In some embodiments, "depositing an aluminum oxide layer" may include depositing a thin layer of aluminum directly on the niobium base layer and then growing an aluminum oxide layer on the thin layer of aluminum (e.g., by exposing the aluminum layer to oxygen gas). At 403, the chamber is filled with a substantially uniform pressure of an inert gas (such as, for example, argon). The inert gas provides a medium through which thermal energy may be dissipated and ensures the wafer (and in particular, the aluminum oxide layer located on the surface of the wafer) has a substantially uniform temperature as the aluminum oxide layer cools. At 404, the inert gas is pumped out of the chamber and the top layer of niobium is deposited over the aluminum oxide layer. The uniform cooling process of act 403 may improve aluminum oxide thickness uniformity across the wafer.

Figure 5:
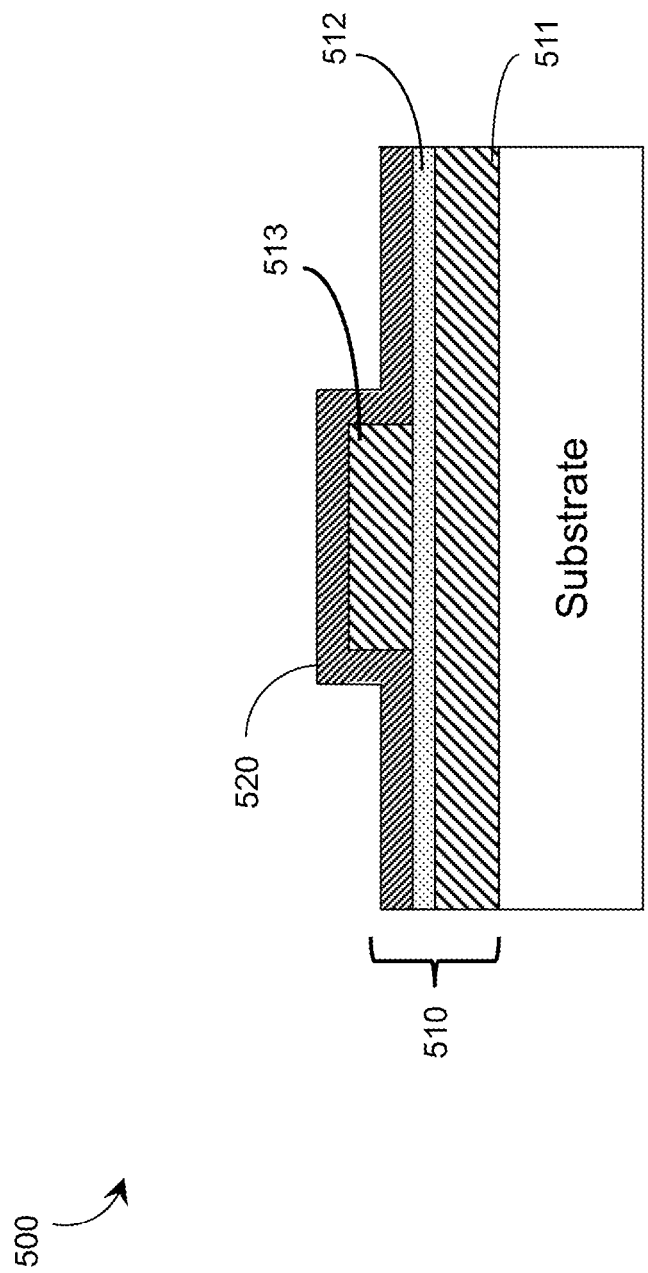
FIG. 5 is an elevational, partially sectioned, view of a portion of a superconducting integrated circuit including a Josephson junction covered by a protective cap, according to one illustrated embodiment.

A Josephson junction may be formed in a Nb—AlOx-Nb trilayer by patterning the counter electrode as described in FIGS. 1A to 1C. US Patent Publication 2011-0089405 (which is incorporated herein by reference in its entirety) further describes protecting a formed Josephson junction from subsequent processing acts by depositing a cap (formed of, e.g., silicon nitride SiN) over top of the Josephson junction counter electrode. FIG. 5 shows a sectional view of a portion of a superconducting integrated circuit 500 including a Josephson junction 510 covered by a protective cap 520. As described in US Patent Publication 2011-0089405, cap 520 may be formed of, for example, silicon nitride, hydrogenated amorphous silicon, an organic polymer dielectric material or a similar dielectric material. Josephson junction 510 includes base electrode 511 (formed of superconducting metal, such as niobium), insulating barrier 512 (formed of, e.g., aluminum oxide), and counter electrode 513 (formed of superconducting metal, such as niobium). A challenge in depositing cap 520 in superconducting integrated circuit 500 is that the cap material may not adhere very well to aluminum oxide layer 512. This challenge may be overcome by etching away excess aluminum oxide as described previously and illustrated in FIG. 1C (compared to FIG. 1B). However, in circuits where removing excess aluminum oxide is not practical, adhesion between cap 520 and aluminum oxide layer 512 may be improved by pre-cleaning the upper surface of aluminum oxide layer 512 to, among other things, remove moisture and any other particles that may contaminate the exposed surface of aluminum oxide layer 512. This pre-cleaning may include, for example, battering the exposed surface of aluminum oxide layer 512 with ions and/or employing a gentle, anisotropic low pressure etch.

Figure 6:
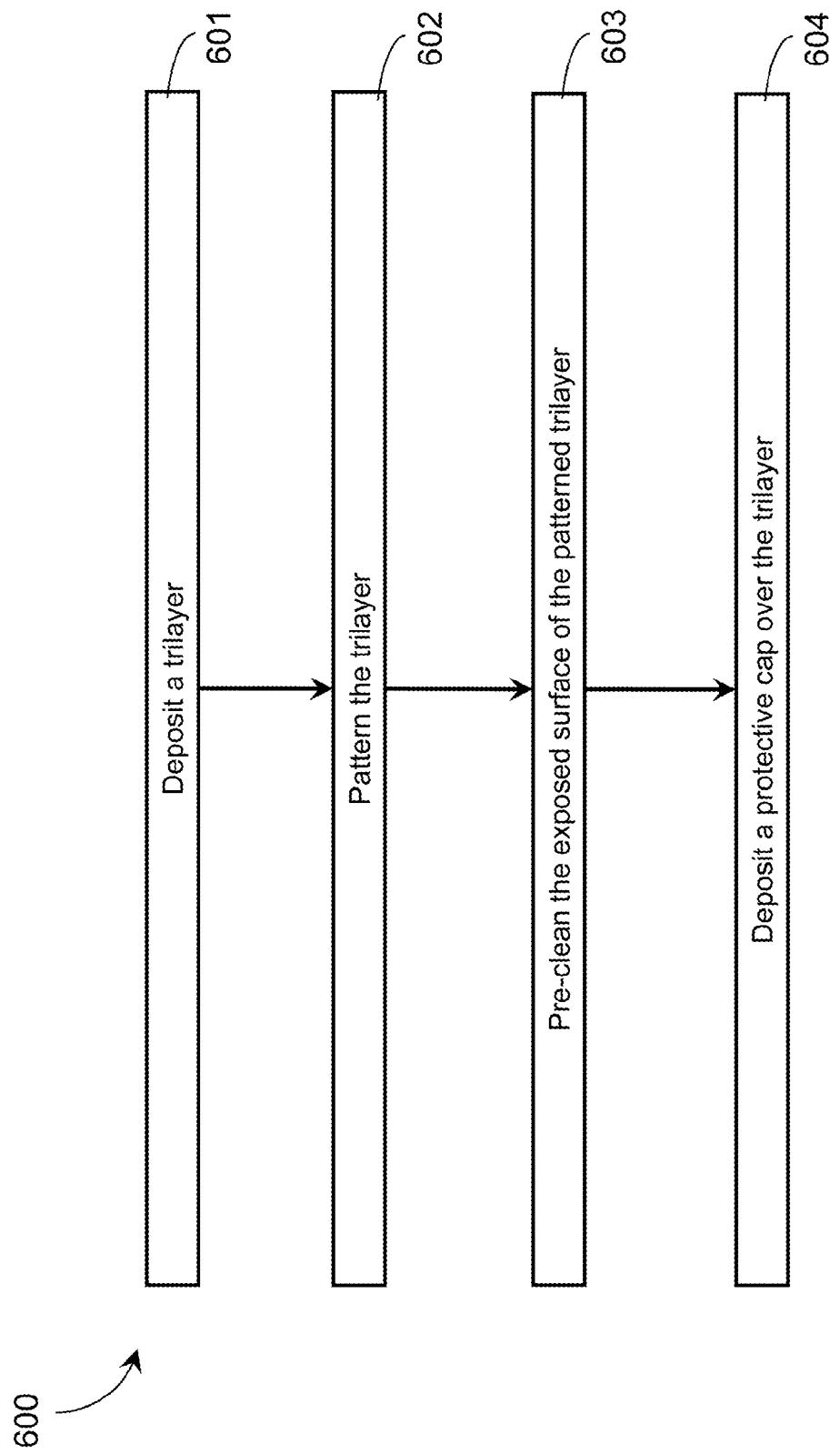
FIG. 6 is a flow diagram showing a method of depositing a protective cap over a trilayer Josephson junction, according to one illustrated embodiment.

FIG. 6 shows a method 600 for depositing a protective cap over a trilayer Josephson junction in accordance with the present systems and methods. Method 600 includes four acts 601-604, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 601, a trilayer is deposited (e.g., over a wafer, or over a surface of a dielectric layer, or over a surface of a metal layer, etc.) as described previously. The trilayer may include, for example, a Nb/AlOx/Nb trilayer. At 602, the trilayer is patterned by, for example, a lithographic process as described previously. At 603, the exposed surface of the patterned trilayer (e.g., the upper surface) is pre-cleaned in accordance with the present systems and methods. The exposed surface of the trilayer may include both superconducting metal surfaces (i.e., niobium counter electrode surfaces) and insulating barrier surfaces (i.e., aluminum oxide surfaces). As previously described, this precleaning may include, for example, battering the exposed surfaces of the aluminum oxide layer with ions and/or employing a gentle, anisotropic low pressure etch. At 604, a protective cap is deposited over the trilayer. The cap may include, for example, silicon nitride and may help to protect the trilayer (and in particular, the aluminum oxide layer) from being degraded in subsequent processing. The pre-cleaning at 603 may improve adhesion between the cap and the aluminum oxide layer.

Cap 520 described above comprises a layer of material (e.g., SiN) that overlies a Josephson junction (510) in order to protect the Josephson junction (and especially the aluminum oxide layer 512) from subsequent processing operations. In accordance with the present systems and methods, a similar "capping" technique may be used to reduce noise in superconducting integrated circuits by shielding wiring layers from oxides that may be present in dielectric layers (e.g., silicon dioxide) and/or prevent wiring layers from oxidizing during the deposition of oxide dielectric layers (e.g., silicon dioxide). For example, hybrid dielectrics may be employed to effectively sandwich metal wiring layers between non-oxide caps (such as SiN) both above and below dielectric layers.

Figure 7:
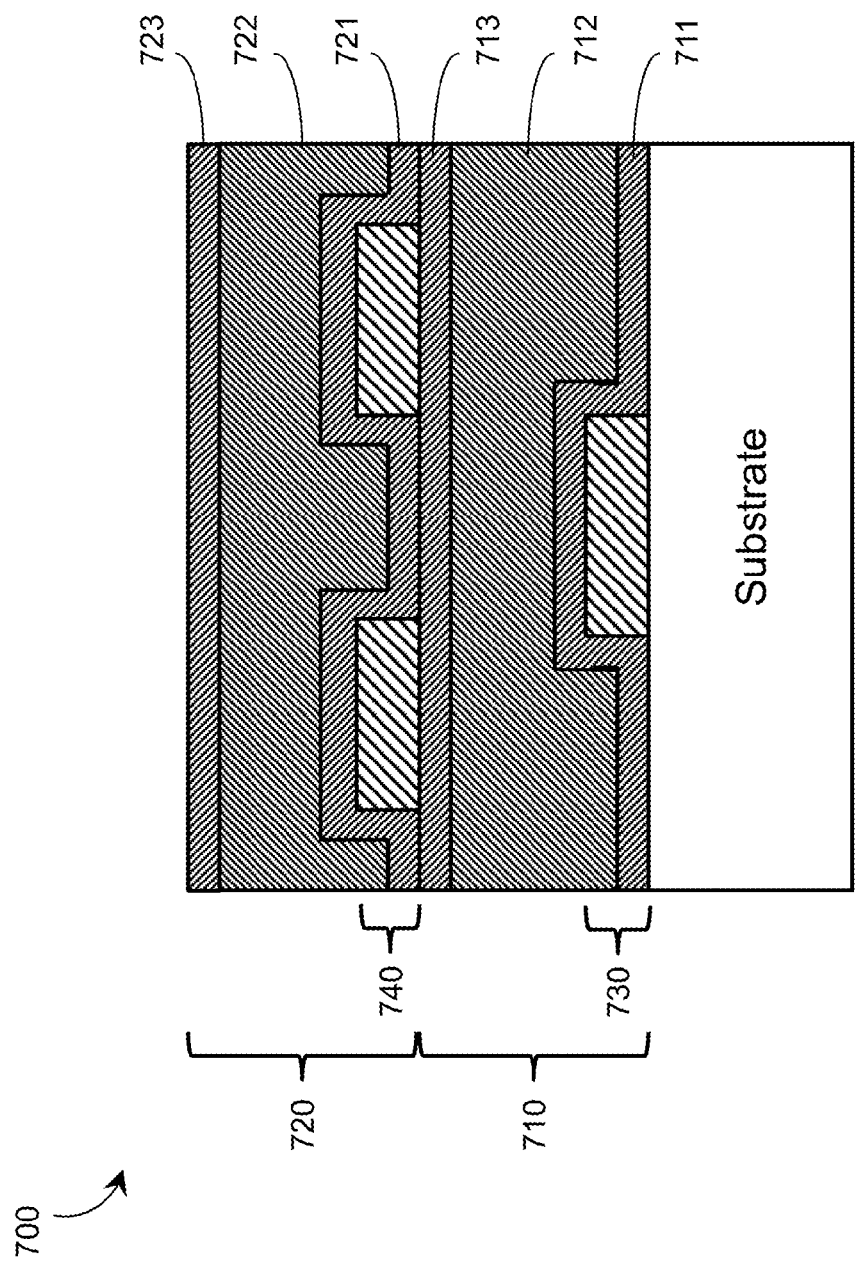
FIG. 7 is an elevational, partially sectioned, view of a portion of a superconducting integrated circuit including hybrid dielectric layers, according to one illustrated embodiment.

FIG. 7 is a sectional view of a portion of a superconducting integrated circuit 700 including hybrid dielectric layers 710 and 720 in accordance with the present systems and methods. Superconducting integrated circuit 700 includes metal wiring layers 730 and 740, each of which includes a patterned conductor formed of a superconducting material, such as niobium or aluminum. Hybrid dielectric layer 710 is itself comprised of three layers: a base layer of non-oxide dielectric material 711 (e.g., SiN), a layer of silicon dioxide 712, and a top layer of non-oxide dielectric material 713 (e.g., SiN). Hybrid dielectric layer 720 is similarly comprised of three layers: a base layer of non-oxide dielectric material 721 (e.g., SiN), a layer of silicon dioxide 722, and a top layer of non-oxide dielectric material 723 (e.g., SiN). Non-oxide dielectric layer 711 shields metal wiring layer 730 from silicon dioxide layer 712. Similarly, non-oxide dielectric layers 713 and 721 shield metal wiring layer 740 from silicon dioxide layers 712 and 722, respectively. Thus, hybrid dielectric layers 710 and 720 enable isolation of metal wiring layers 730 and 740 from the oxides present in silicon dioxide layers 712 and 722 and may therefore help to reduce noise in superconducting integrated circuit 700. Similarly, hybrid dielectric layers 710 and 720 help to prevent oxidation of metal wiring layers 730 and 740, respectively, during deposition of silicon dioxide layers 712 and 722. Those of skill in the art will appreciate that the circuit details of integrated circuit 700 are illustrative only and similar hybrid dielectric processing may be employed in a superconducting integrated circuit that includes Josephson junctions (e.g., trilayers) and/or via connections between metal wiring layers.

Figure 8:
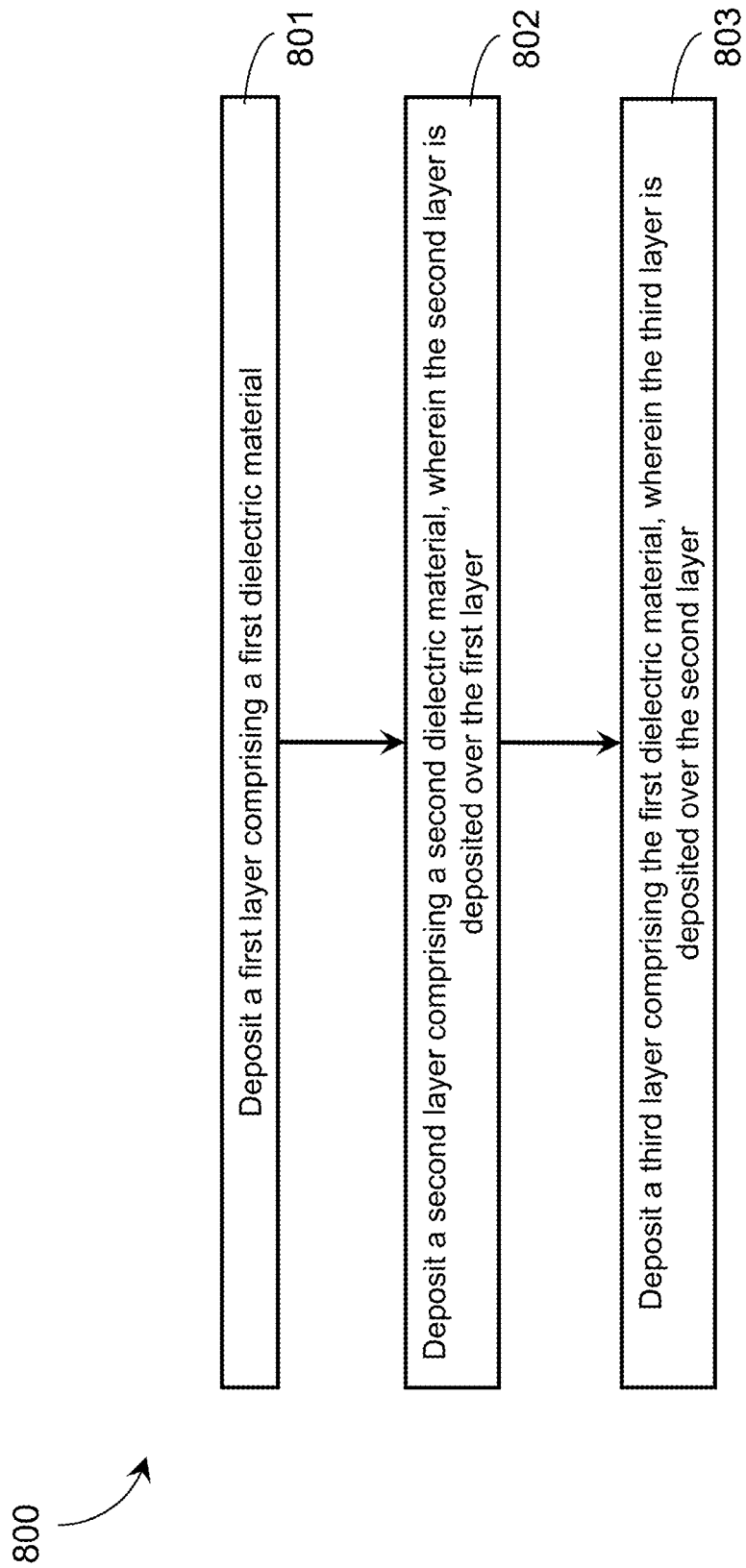
FIG. 8 is a flow diagram showing a method of depositing a hybrid dielectric, according to one illustrated embodiment.

FIG. 8 shows a method 800 for depositing a hybrid dielectric in accordance with the present systems and methods. Method 800 includes three acts 801-803, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 801, a first layer comprising a first dielectric material is deposited. The first dielectric material may include a non-oxide dielectric, such as silicon nitride and the first layer may be deposited by any deposition process, including CVD, PVD, and/or ALD. The first layer may be deposited, for example, on top of or over a metal layer in an integrated circuit. At 802, a second layer comprising a second dielectric material may be deposited on top of or over the first layer. The second dielectric material may include an oxide dielectric, such as silicon dioxide and the second layer may be deposited by any deposition process, including CVD, PVD, and/or ALD. At 803, a third layer comprising the first dielectric material may be deposited on top of or over the second layer. In some embodiments, the third layer may comprise a third dielectric material that is a non-oxide dielectric. In some embodiments, at least one layer may be polished or planarized after being deposited, before another layer is deposited thereon. For example, the first layer may be polished or planarized before the second layer is deposited thereon. In some embodiments, a metal layer (e.g., a superconducting metal layer) may be deposited over the third layer. If the integrated circuit includes additional metal layers, then each metal layer may be separated from upper and/or lower metal layers by a respective hybrid dielectric formed by method 800.

In the semiconductor industry, a process known as "additive patterning" or "Damascene" processing has been developed to process materials that cannot be directly patterned by standard photoresist masking and plasma etching techniques. For example, semiconductor integrated circuits that employ copper interconnections (as opposed to, for example, aluminum interconnections) are typically fabricated by this additive patterning approach because copper is incompatible with standard photoresist masking and plasma etching techniques. Copper may be preferable to aluminum in some semiconducting applications because copper is a better conductor than aluminum, meaning that copper circuits use less energy and can include smaller components.

In additive patterning, the underlying dielectric layer is patterned with open features (e.g., trenches) and then a thick layer of the conductor is deposited over the dielectric such that it completely fills the open features of the pattern. Chemical-mechanical planarization/polishing (CMP) is then employed to remove the excess conductor down to the level of the top of the underlying dielectric. The result is a patterned conductor produced by filling in a pattern in the dielectric as opposed to the more traditional approach of etching a pattern directly into the conductor itself. In other words, "additive patterning" is a process whereby a conductor is added to an existing pattern. Conversely, standard photoresist masking and plasma etching techniques provide "subtractive patterning" whereby portions of a conductor are subtracted (i.e., etched) away to produce a pattern.

As described above, additive patterning is used in the semiconductor industry in order to pattern materials (e.g., copper) that are not compatible with standard photoresist masking and plasma etching techniques. In accordance with the present systems and methods, a technique that is similar in some respects may be employed in the fabrication of superconducting integrated circuits, albeit motivated by completely different reasons than those of the semiconductor industry.

In a multilayered integrated circuit (either semiconducting or superconducting), successive layers of conductive wiring are typically separated from one another by inner layer dielectrics ("ILDs"). ILDs provide structural support for the whole circuit while electrically insulating adjacent conductive layers. The thickness of an ILD determines the distance between two adjacent conductive layers in the circuit, and this distance influences, among other things, inductive and capacitive coupling between the adjacent conductive layers. In semiconducting integrated circuits, inductive and capacitive coupling between adjacent conductive layers are typically not crucial design features. Conversely, in superconducting integrated circuits inductive and/or capacitive coupling between conductive layers can be crucial features of the circuit design. Superconducting integrated circuits are often designed to propagate signals in the form of magnetic flux quanta (e.g., via Single Flux Quantum logic) and often employ deliberate inductive couplings to transfer these magnetic signals. These deliberate inductive couplings can exist between adjacent conductive layers in the circuit and their strength is therefore dependent on the corresponding ILD thickness. Circuits that manipulate magnetic signals are also particularly sensitive to unintended inductive couplings between wiring and circuit elements, often referred to as "crosstalks." The avoidance and/or minimization of unwanted crosstalks is a crucial aspect of superconducting integrated circuit design. Poor control over ILD thickness can give rise to crosstalks between wiring layers that degrade or completely inhibit circuit performance. For at least these reasons, some implementations of superconducting integrated circuits can greatly benefit from improved ILD thickness control.

In accordance with the present systems and methods, improved ILD thickness control may be achieved in the fabrication of a superconducting integrated circuit by employing an additive patterning or Damascene fabrication process. In order to clarify the distinctive features of a superconducting additive patterning process, a typical standard subtractive patterning process is first described.

Figure 9A:
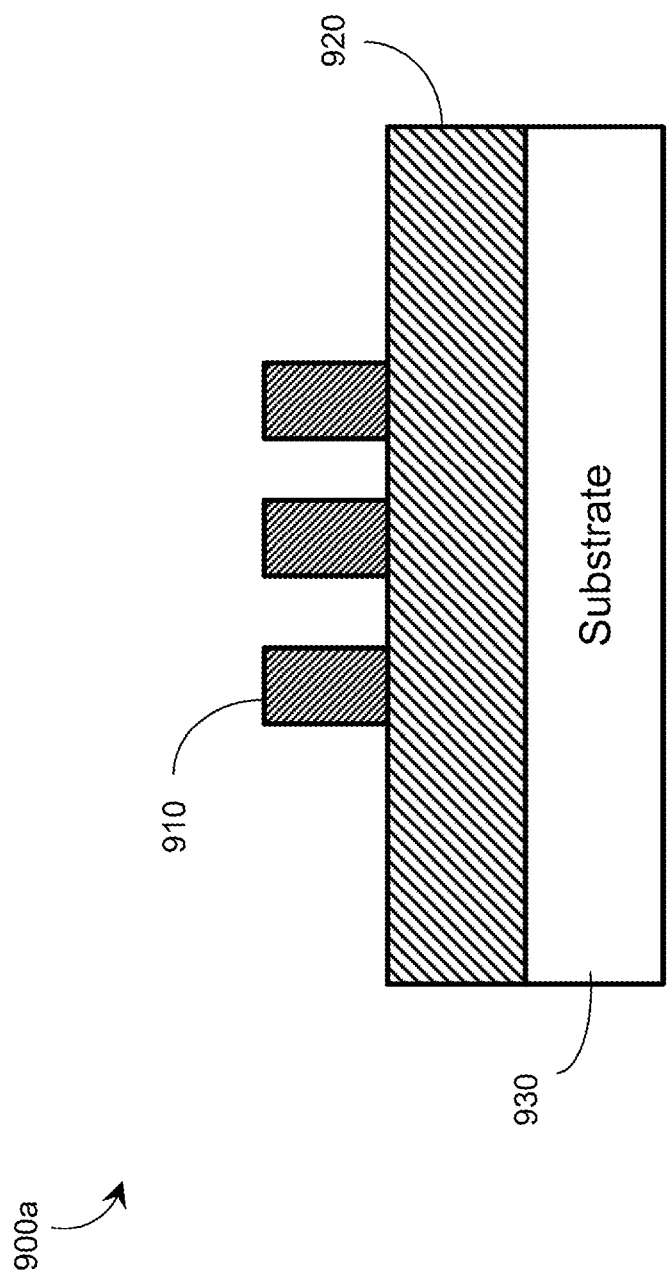
FIG. 9A is an elevational, partially sectioned, view of a portion of a superconducting integrated circuit during a masking stage of a subtractive patterning process, according to one illustrated embodiment.

FIG. 9A is a sectional view of a portion of an exemplary superconducting integrated circuit 900a during a masking stage of a subtractive patterning process. Integrated circuit 900a includes a substrate 930 (formed of, for example, silicon, silicon dioxide, sapphire, or a similar substance), superconducting metal layer 920 (formed of, for example, niobium), and photoresist mask 910. In the subtractive patterning process, mask 910 overlies metal layer 920 and effectively traces out the desired circuit pattern in metal layer 920. In other words, the desired circuit pattern corresponds to regions of metal layer 920 that are covered by photoresist mask 910. Those regions of metal layer 920 that are not directly covered by mask 910 will be etched away and will not form part of the circuit, whereas those regions of metal layer 920 that are directly covered by mask 910 will remain after etching and become the circuit pattern.

Figure 9B:
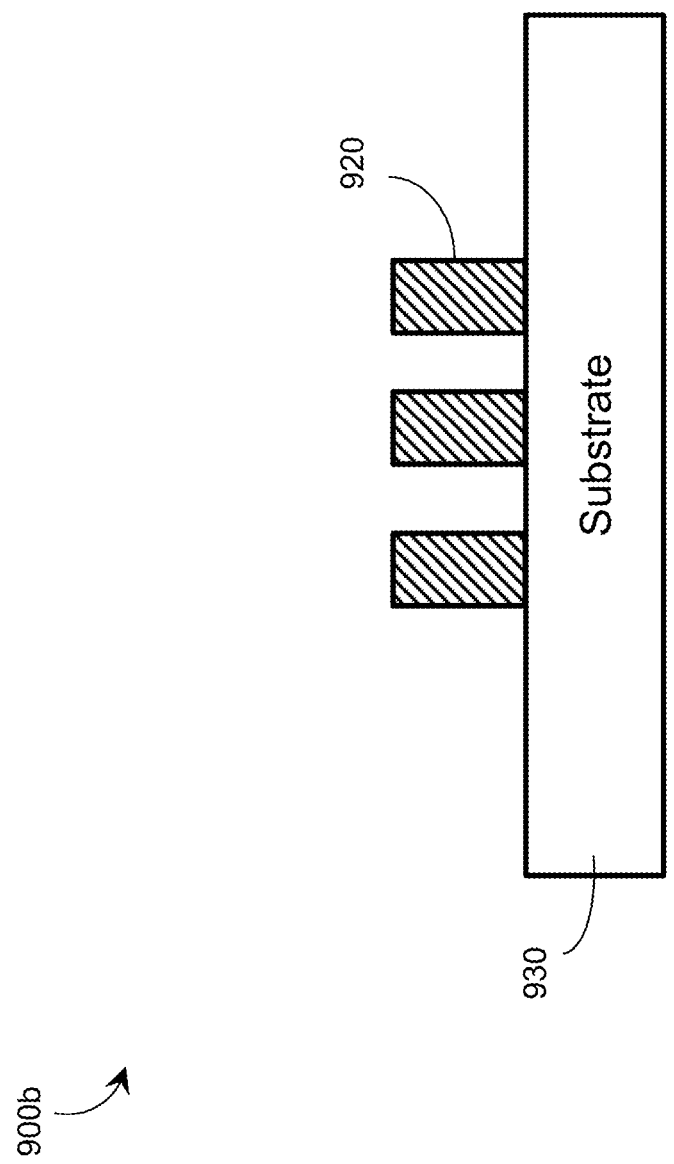
FIG. 9B is an elevational, partially sectioned, view of a portion of the superconducting integrated circuit of FIG. 9A after an etching stage of the subtractive patterning process, according to one illustrated embodiment.

FIG. 9B is a sectional view of a portion of an exemplary superconducting integrated circuit 900b. FIG. 9B depicts superconducting integrated circuit 900a from FIG. 9A after an etching stage of a subtractive patterning process. Superconducting integrated circuit 900b includes substrate 930 and superconducting metal layer 920, but photoresist mask 910 from FIG. 9A has been stripped away. By comparison to superconducting integrated circuit 900a from FIG. 9A, all that remains of metal layer 920 in superconducting integrated circuit 900b of FIG. 9B are those regions of metal layer 920 that were directly covered by photoresist mask 910. Metal layer 920 has been subtractively patterned by using, e.g., plasma etching to subtract regions of metal layer 920 that were not covered by photoresist mask 910. As discussed in more detail below, the superconducting metal layer 920 and the photoresist mask 910 are typically etched/removed via different processes.

Figure 9C:
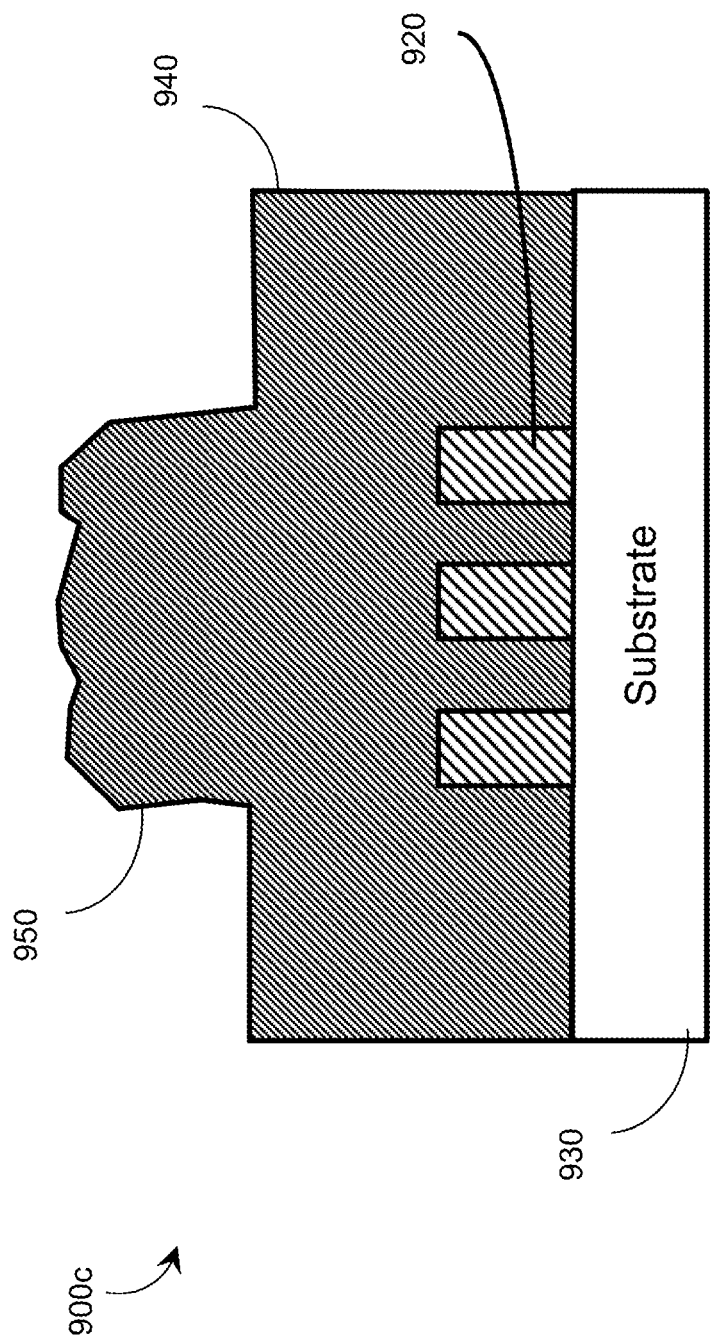
FIG. 9C is an elevational, partially sectioned, view of a portion of the superconducting integrated circuit of FIG. 9B after a dielectric deposition stage of the subtractive patterning process, according to one illustrated embodiment.

FIG. 9C is a sectional view of a portion of an exemplary superconducting integrated circuit 900c. FIG. 9C depicts superconducting integrated circuit 900b from FIG. 9B after a dielectric deposition stage of a subtractive patterning process. Superconducting integrated circuit 900c includes substrate 930 and patterned superconducting metal layer 920, but superconducting integrated circuit 900c also includes dielectric layer 940 deposited (e.g., by chemical vapor deposition, atomic layer deposition, or another known technique) over top of patterned metal layer 920 and substrate 930. Dielectric layer 940 serves to protect metal layer 920 from the external environment and insulate metal layer 920 from subsequent metal layers that may be added to integrated circuit 900c. The pattern in metal layer 920 typically produces features and non-uniformities (e.g., 950) on the surface of dielectric layer 940, which need to be smoothed out before additional layers can be deposited.

Figure 9D:
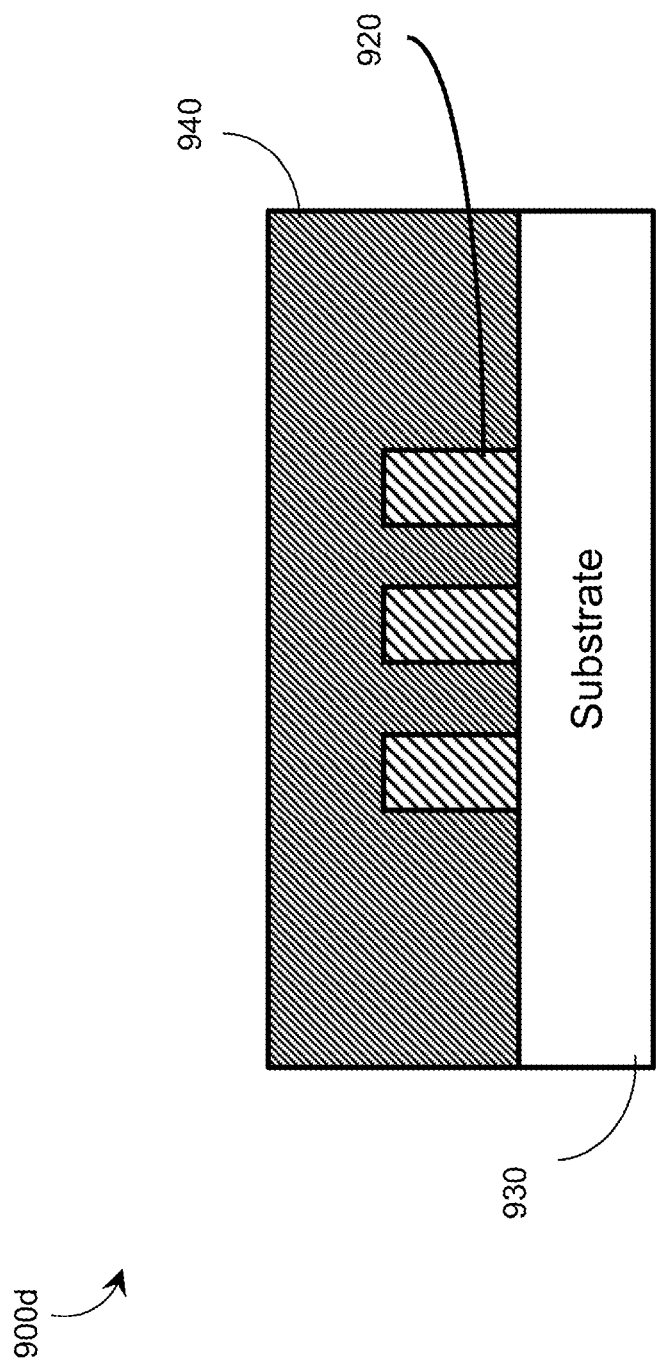
FIG. 9D is an elevational, partially sectioned, view of a portion of the superconducting integrated circuit of FIG. 9C after a dielectric planarization stage of the subtractive patterning process, according to one illustrated embodiment.

FIG. 9D is a sectional view of a portion of an exemplary superconducting integrated circuit 900d. FIG. 9D depicts superconducting integrated circuit 900c from FIG. 9C after a dielectric planarization stage of a subtractive patterning process. Superconducting integrated circuit 900d includes substrate 930, patterned superconducting metal layer 920, and dielectric layer 940. By comparison to superconducting integrated circuit 900c from FIG. 9C, dielectric layer 940 of integrated circuit 900d has been planarized to remove any unwanted non-uniformities (e.g., 950 from FIG. 9C) resulting from the underlying pattern in metal layer 920. This dielectric planarization may be completed by, for example, a CMP process.

Figure 9E:
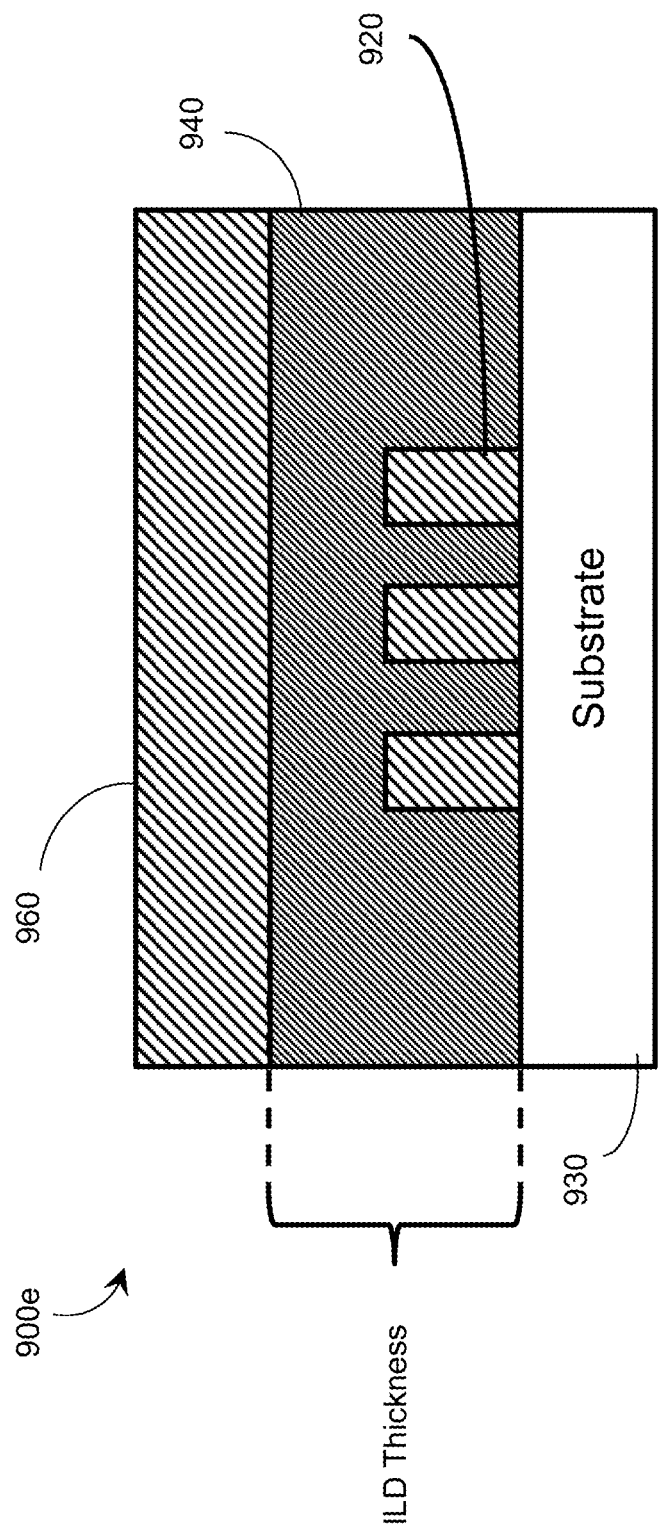
FIG. 9E is an elevational, partially sectioned, view of a portion of the superconducting integrated circuit of FIG. 9D after a second superconducting metal layer has been deposited, according to one illustrated embodiment.

FIG. 9E is a sectional view of a portion of an exemplary superconducting integrated circuit 900e. FIG. 9E depicts superconducting integrated circuit 900d from FIG. 9D after a second superconducting metal layer 960 has been deposited. Superconducting integrated circuit 900e further includes substrate 930, patterned first superconducting metal layer 920, and dielectric layer 940. Second metal layer 960 is separated from first metal layer 920 by dielectric 940, where the distance between second metal layer 960 and first metal layer 920 is directly related to the thickness of dielectric layer 940. Dielectric layer 940 is an inner layer dielectric and the ILD thickness is illustrated in FIG. 9E. The upper surface of dielectric layer 940 was planarized to remove unwanted features (e.g., 950 from FIG. 9C), thus the ILD thickness of layer 940 is determined by this planarization in the subtractive patterning process.

The subtractive patterning process illustrated in FIGS. 9A through 9E is commonly used in both the semiconductor and the superconductor fabrication industries. However, an aspect of this process that is particularly disadvantageous to the fabrication of superconducting (as opposed to semiconducting) integrated circuits is that the thickness of each ILD ends up being defined by a planarization process such as CMP. Planarizing a dielectric layer down to a specific layer thickness is a difficult process to control, at least in part because there is no reference point to indicate when the desired thickness has been reached. In accordance with the present systems and methods, an additive patterning process may be employed to enhance ILD thickness control in the fabrication of integrated circuits, and this benefit has particular utility in the fabrication of superconducting integrated circuits. An additive patterning process enables enhanced control of ILD thickness because in an additive patterning process, the ILD thickness is substantially determined by a dielectric deposition operation (via, e.g., chemical vapor deposition, physical vapor deposition, atomic layer deposition, or a similar process) as opposed to a planarization/polishing operation. In accordance with the present systems and methods, a dielectric deposition process provides better ILD thickness control than a dielectric planarization process.

Figure 10A:
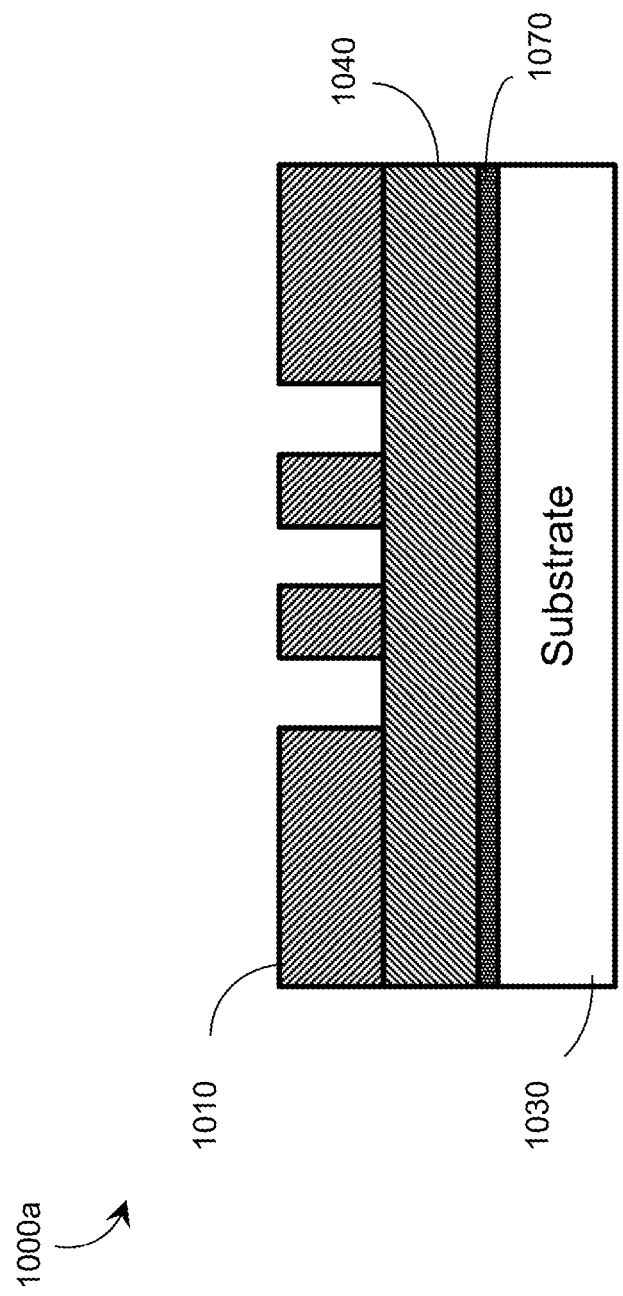
FIG. 10A is an elevational, partially sectioned, view of a portion of a superconducting integrated circuit during a masking stage of an additive patterning process, according to one illustrated embodiment.

FIG. 10A is a sectional view of a portion of an exemplary superconducting integrated circuit 1000a during a masking stage of an additive patterning process in accordance with the present systems and methods. Integrated circuit 1000a includes a substrate 1030 (formed of, for example, silicon, silicon dioxide, sapphire, or a similar substance), dielectric layer 1040 (formed of, e.g., silicon dioxide), negative photoresist mask 1010, and an etch-stop layer 1070 (which may comprise, for example, silicon nitride). In the additive patterning process, mask 1010 overlies dielectric layer 1040 and effectively traces out the negative or inverse of the desired circuit pattern in dielectric layer 1040. In other words, the desired circuit pattern corresponds to regions of dielectric layer 1040 that are not covered by photoresist mask 1010. Those regions of dielectric layer 1040 that are not directly covered by mask 1010 will be etched away to form open features (e.g., trenches) while those regions of dielectric layer 1040 that are directly covered by mask 1010 will remain after etching.

Figure 10B:
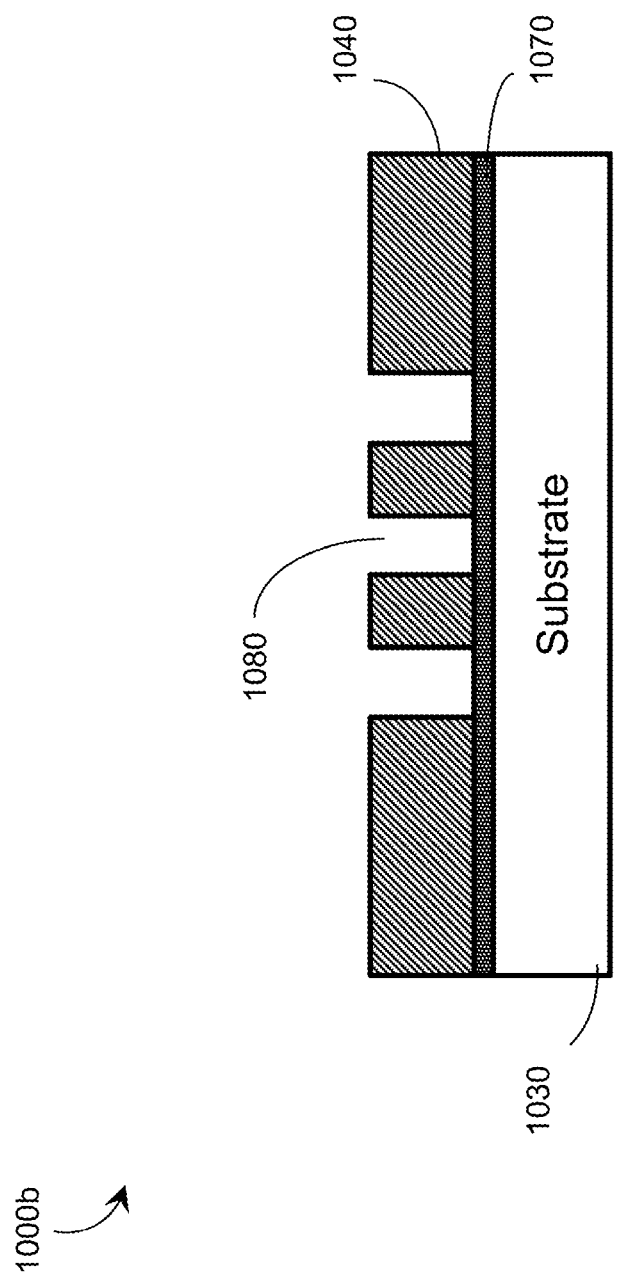
FIG. 10B is an elevational, partially sectioned, view of the portion of the superconducting integrated circuit of FIG. 10A after an etching stage of an additive patterning process, according to one illustrated embodiment.

FIG. 10B is a sectional view of a portion of an exemplary superconducting integrated circuit 1000b in accordance with the present systems and methods. FIG. 10B depicts superconducting integrated circuit 1000a from FIG. 10A after an etching stage of an additive patterning process. Superconducting integrated circuit 1000b includes substrate 1030, dielectric layer 1040, and etch-stop layer 1070, but negative photoresist mask 1010 from FIG. 10A has been stripped away. By comparison to superconducting integrated circuit 1000a from FIG. 10A, dielectric layer 1040 in superconducting integrated circuit 1000b of FIG. 10B has been etched to produce open features (e.g., trenches) 1080 that trace out the desired circuit pattern into dielectric layer 1040. Those regions of dielectric layer 1040 that were directly covered by photoresist mask 1010 remain unetched. The etching into dielectric layer 1040 may be controlled by, for example, etch-stop layer 1070, which provides an interface between dielectric layer 1040 and substrate 1030 through which the etch will not pass. Some embodiments may not include etch-stop layer 1070 and/or may use substrate 1030 as an etch-stop.

Figure 10C:
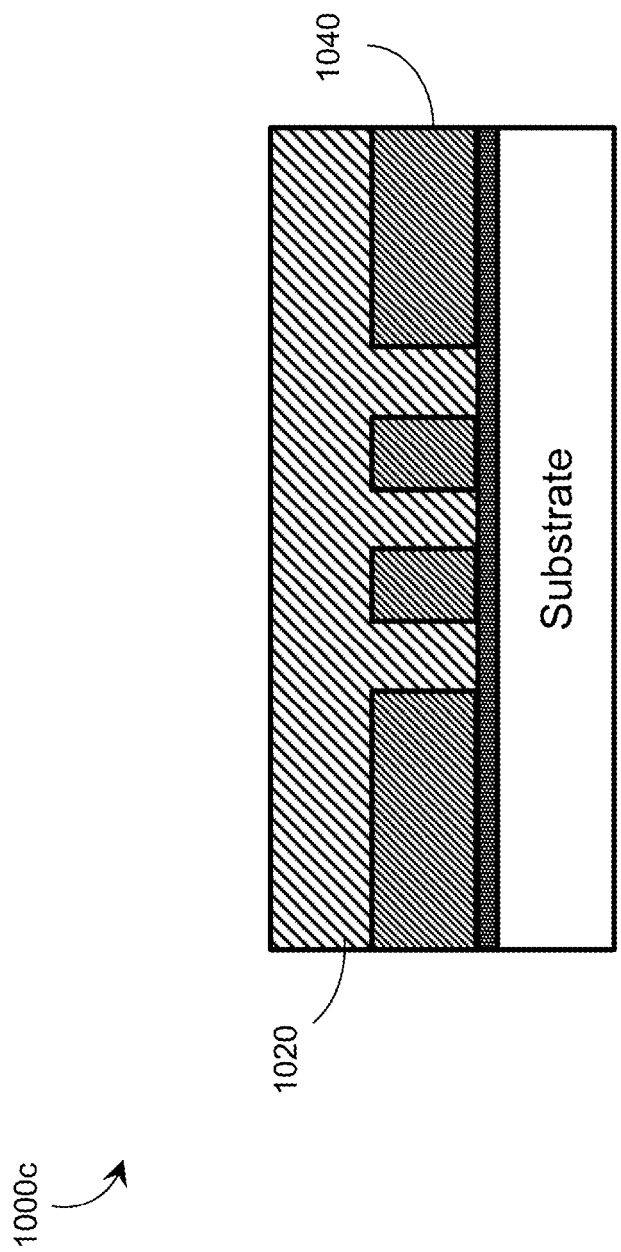
FIG. 10C is an elevational, partially sectioned, view of the portion of the superconducting integrated circuit of FIG. 10B after a metal deposition stage of an additive patterning process, according to one illustrated embodiment.

FIG. 10C is a sectional view of a portion of an exemplary superconducting integrated circuit 1000c in accordance with the present systems and methods. FIG. 10C depicts superconducting integrated circuit 1000b from FIG. 10B after a metal deposition stage of an additive patterning process. In addition to the features from FIG. 10B, superconducting integrated circuit 1000c also includes superconducting metal layer 1020 deposited (e.g., by electroplating) over top of patterned dielectric layer 1040. Superconducting metal layer 1020 may comprise, for example, niobium or another material capable of superconducting in operation. The deposition of metal layer 1020 fills the open features (e.g., 1080 from FIG. 10B) in dielectric layer 1040 with superconducting metal. The pattern in dielectric layer 1040 thus serves as a mold for patterning metal layer 1020.

Figure 10D:
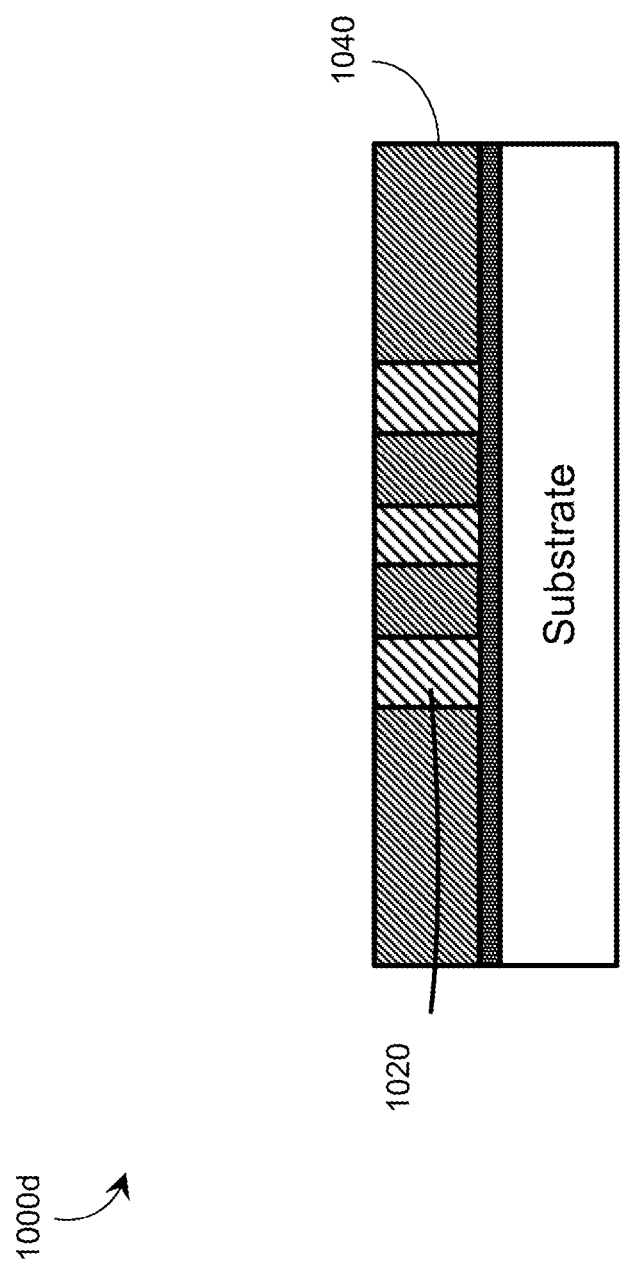
FIG. 10D is an elevational, partially sectioned, view of the portion of the superconducting integrated circuit of FIG. 10C after a metal planarization stage of an additive patterning process, according to one illustrated embodiment.

FIG. 10D is a sectional view of a portion of an exemplary superconducting integrated circuit 1000d in accordance with the present systems and methods. FIG. 10D depicts superconducting integrated circuit 1000c from FIG. 10C after a metal planarization stage of an additive patterning process. By comparison to superconducting integrated circuit 1000c from FIG. 10C, metal layer 1020 of integrated circuit 1000d has been planarized/polished (e.g., by CMP or a similar process) to remove excess metal down to the top of dielectric layer 1040. After this planarization operation, all that remains of metal layer 1020 are those portions of metal layer 1020 that fill the open features (e.g., 1080 from FIG. 10B) of dielectric layer 1040. Thus, metal layer 1020 has been patterned by adding it to the mold in dielectric layer 1040 and polishing away any excess metal. The planarization/polishing of metal layer 1020 may be configured to stop once the interface between metal layer 1020 and dielectric layer 1040 is reached. A person of skill in the art will appreciate that planarization/polishing of metal layer 1020 may require a specialized slurry that is distinct/modified from the slurry used to planarize/polish a dielectric layer.

Figure 10E:
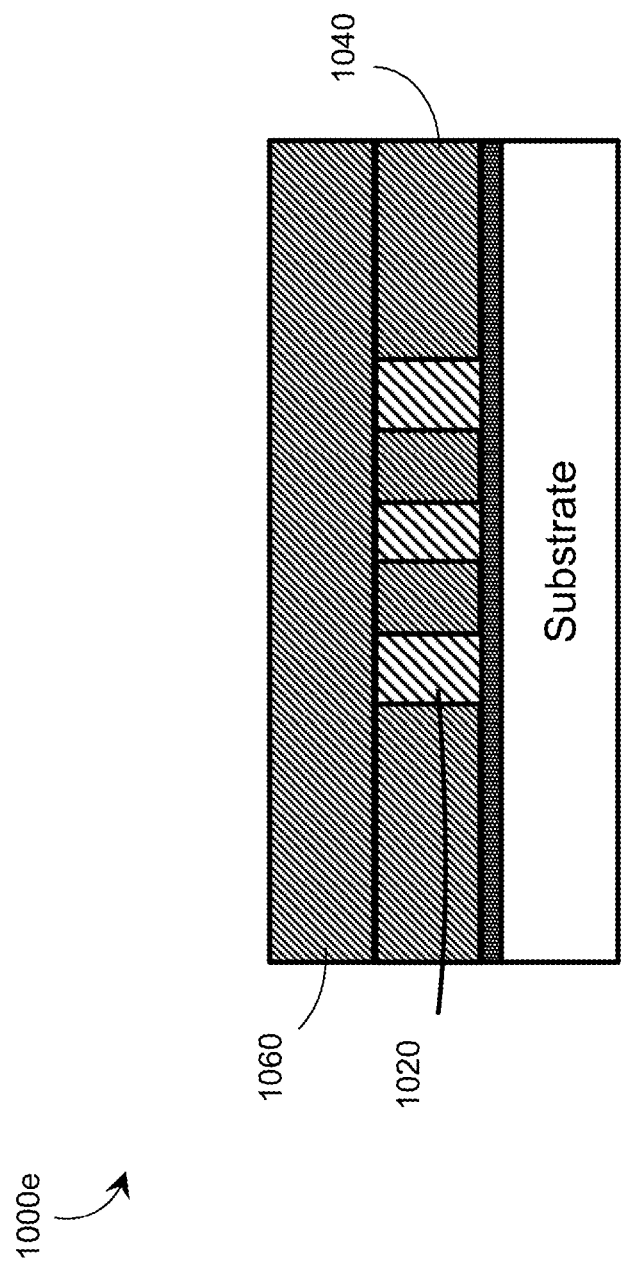
FIG. 10E is an elevational, partially sectioned, view of the portion of the superconducting integrated circuit of FIG. 10D after a dielectric layer has been deposited, according to one illustrated embodiment.

FIG. 10E is a sectional view of a portion of an exemplary superconducting integrated circuit 1000e in accordance with the present systems and methods. FIG. 10E depicts superconducting integrated circuit 1000d from FIG. 10D after a dielectric layer 1060 has been deposited. Dielectric layer 1060 covers metal layer 1020 and may be deposited by CVD, PVD, ALD, or any other known method of dielectric deposition. The combination of dielectric layer 1040 and dielectric layer 1060 together forms an inner layer dielectric ("ILD"), whose thickness is substantially determined by the deposition of dielectric layer 1060. As previously described, greater thickness control may be achieved via a deposition process compared to a planarization process, thus the thickness of the ILD formed by dielectric layers 1040 and 1060 may be controlled to greater precision than the thickness of the ILD formed by dielectric layer 940 from FIG. 9E. In some embodiments, the uppermost surface of dielectric layer 1060 may be polished/planarized enough to provide a smooth surface without having a substantial effect on the thickness of dielectric layer 1060.

Figure 10F:
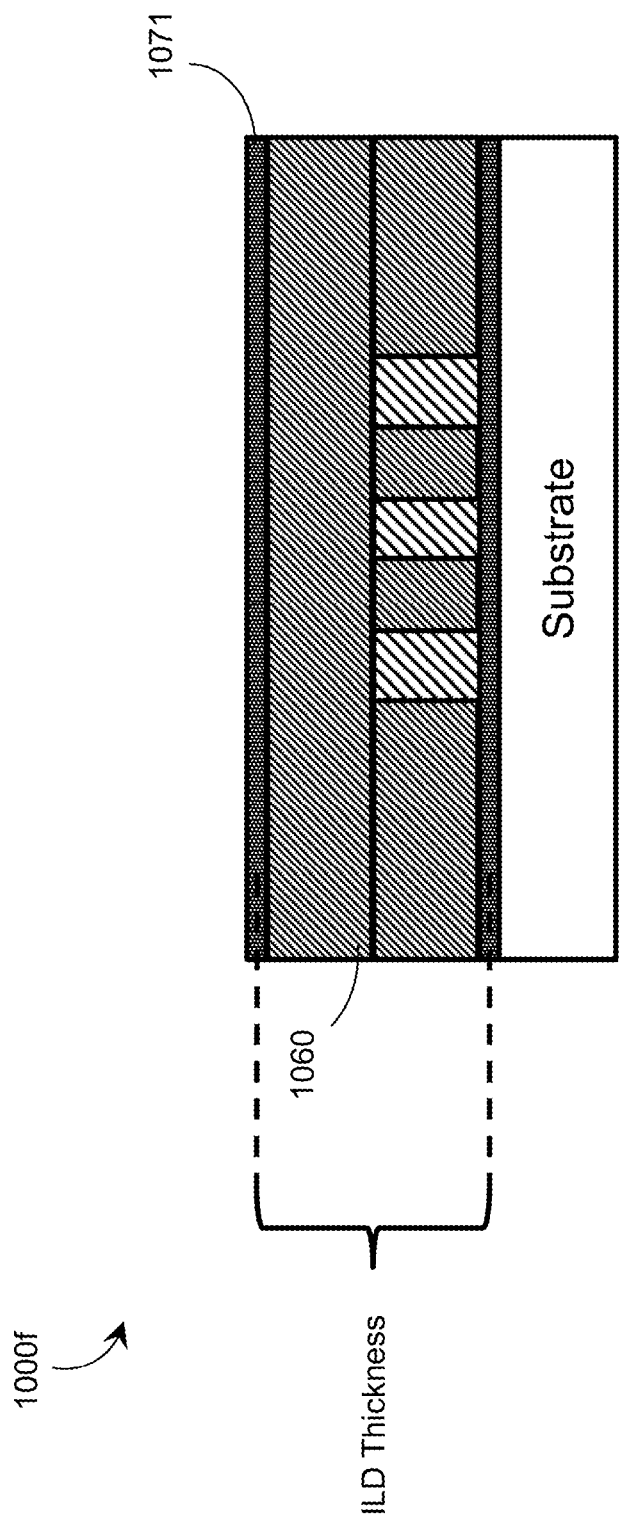
FIG. 10F is an elevational, partially sectioned, view of the portion of the superconducting integrated circuit of FIG. 10E after an etch-stop layer has been deposited, according to one illustrated embodiment.

FIG. 10F is a sectional view of a portion of an exemplary superconducting integrated circuit 1000f in accordance with the present systems and methods. FIG. 10F depicts superconducting integrated circuit 1000e from FIG. 10E after an etch-stop layer 1071 has been deposited. Etch-stop layer 1071 covers dielectric layer 1060 and may be formed of, e.g., silicon nitride deposited by CVD, PVD, ALD, or any other known method of dielectric deposition. Etch-stop layer 1071 ensures that the patterning (i.e., etching) of additional dielectric layers deposited above etch-stop layer 1071 will not pass through into dielectric layer 1060. Those of skill in the art will appreciate that the definition of ILD thickness may or may not include the thickness of one of more etch-stop layers.

Figure 10G:
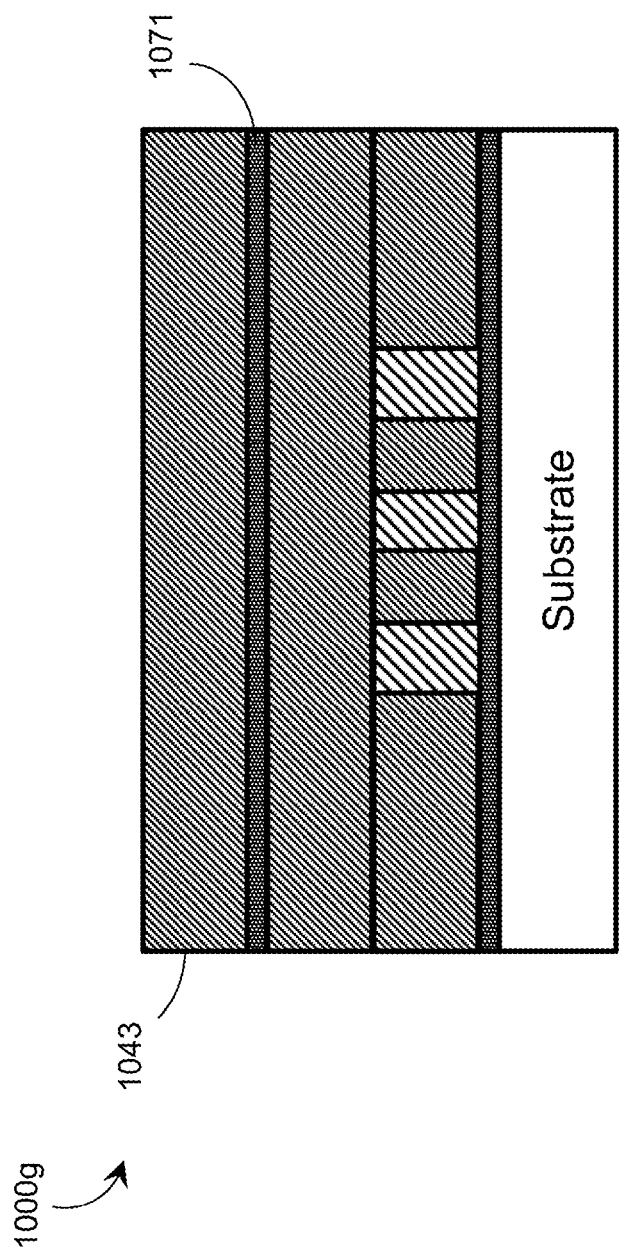
FIG. 10G is an elevational, partially sectioned, view of the portion of the superconducting integrated circuit of FIG. 10F after a dielectric layer has been deposited, according to one illustrated embodiment.

FIG. 10G is a sectional view of a portion of an exemplary superconducting integrated circuit 1000g in accordance with the present systems and methods. FIG. 10G depicts superconducting integrated circuit 1000f from FIG. 10F after a dielectric layer 1043 has been deposited. Dielectric layer 1043 may comprise, for example, silicon dioxide deposited via CVD, PVD, ALD, or the like. Dielectric layer 1043 is deposited over etch-stop layer 1071.

Figure 10H:
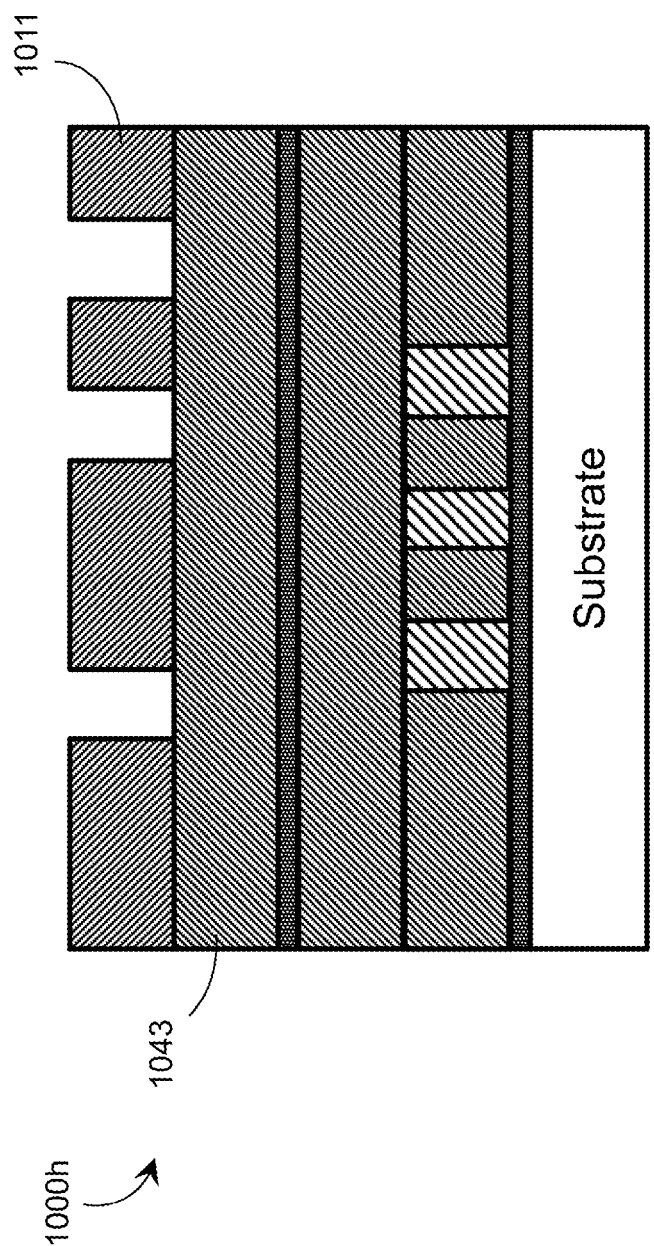
FIG. 10H is an elevational, partially sectioned, view of the portion of the superconducting integrated circuit of FIG. 10G after a negative photoresist mask has been deposited over the dielectric layer, according to one illustrated embodiment.

FIG. 10H is a sectional view of a portion of an exemplary superconducting integrated circuit 1000h in accordance with the present systems and methods. FIG. 10H depicts superconducting integrated circuit 1000g from FIG. 10G after a negative photoresist mask 1011 has been deposited over dielectric layer 1043. In the additive patterning process, mask 1011 overlies dielectric layer 1043 and effectively traces out the negative or inverse of the desired circuit pattern in dielectric layer 1043. In other words, the desired circuit pattern corresponds to regions of dielectric layer 1043 that are not covered by negative photoresist mask 1011. Those regions of dielectric layer 1043 that are not directly covered by mask 1011 will be etched away to form open features (e.g., trenches) while those regions of dielectric layer 1043 that are directly covered by mask 1011 will remain after etching.

Figure 10I:
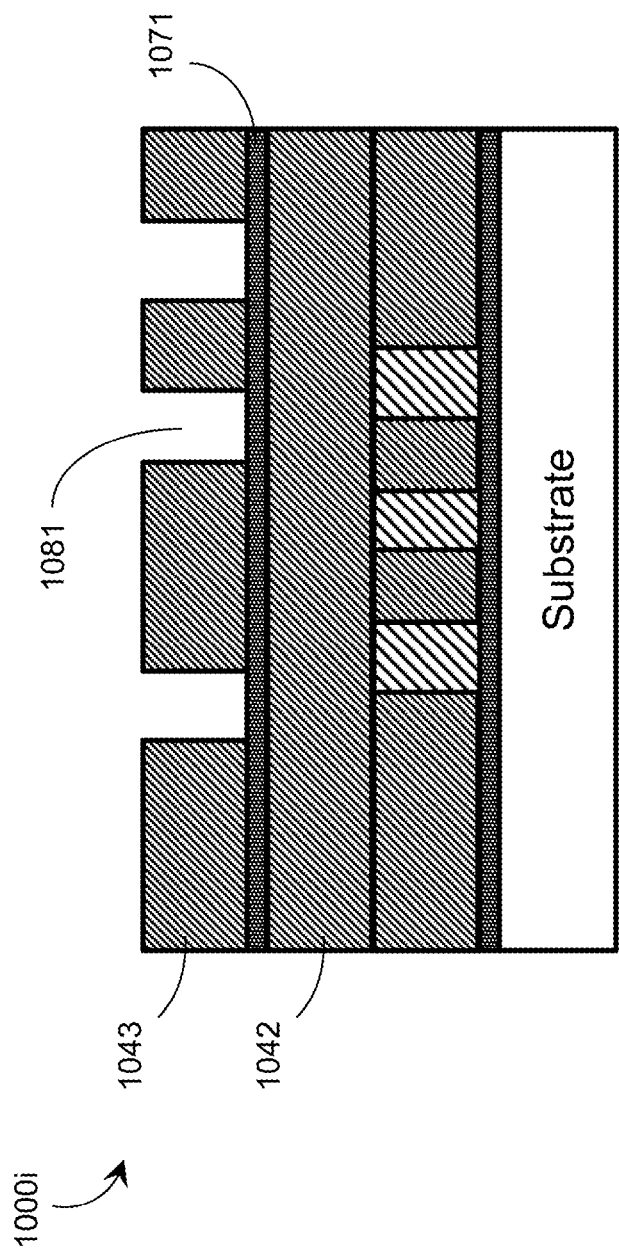
FIG. 10I is an elevational, partially sectioned, view of the portion of the superconducting integrated circuit of FIG. 10H after an etching stage of an additive patterning process, according to one illustrated embodiment.

FIG. 10I is a sectional view of a portion of an exemplary superconducting integrated circuit 1000*i* in accordance with the present systems and methods. FIG. 10I depicts superconducting integrated circuit 1000*h* from FIG. 10H after an etching stage of an additive patterning process. In superconducting integrated circuit 1000*i*, negative photoresist mask 1011 from FIG. 10H has been stripped away. By comparison to superconducting integrated circuit 1000*h* from FIG. 10H, dielectric layer 1043 in superconducting integrated circuit 1000*i* of FIG. 10I has been etched to produce open features (e.g., trenches) 1081 that trace out the desired circuit pattern into dielectric layer 1043. Those regions of dielectric layer 1043 that were directly covered by photoresist mask 1011 remain unetched. The etching into dielectric layer 1043 is controlled by etch-stop layer 1071, which provides an interface between dielectric layer 1043 and dielectric layer 1042 through which the etch will not pass.

Figure 10J:
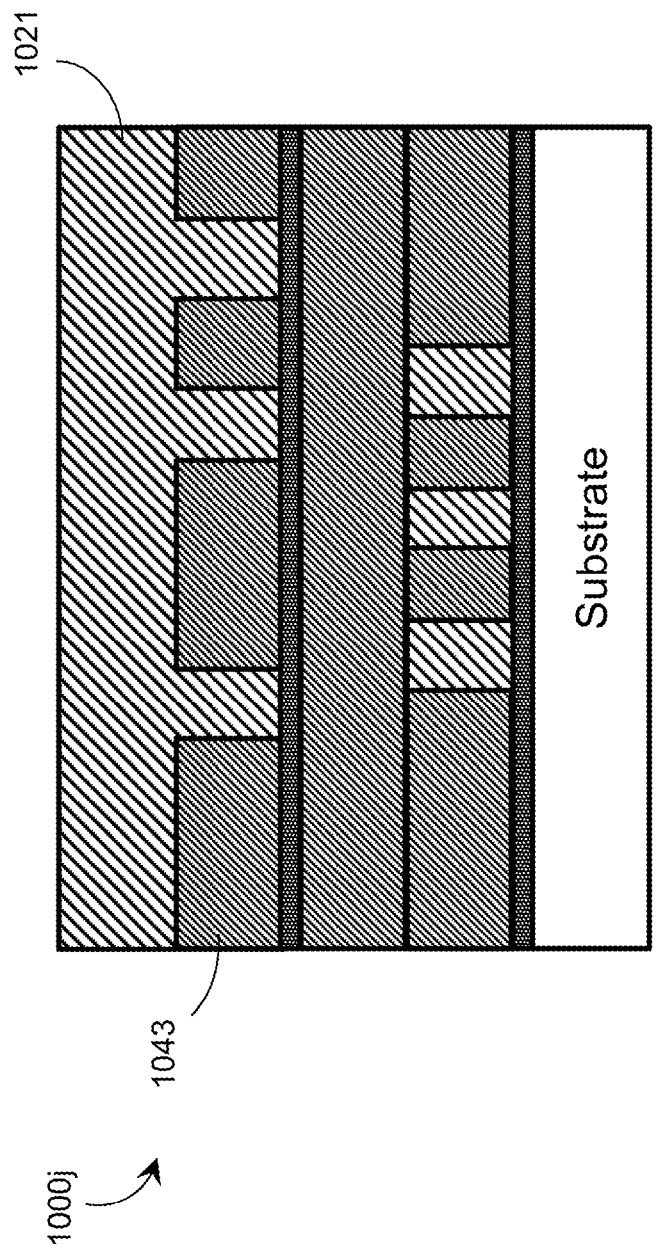
FIG. 10J is an elevational, partially sectioned, view of the portion of the superconducting integrated circuit of FIG. 10I after a metal deposition stage of an additive patterning process, according to one illustrated embodiment.

FIG. 10J is a sectional view of a portion of an exemplary superconducting integrated circuit 1000*j* in accordance with the present systems and methods. FIG. 10J depicts superconducting integrated circuit 1000*i* from FIG. 10I after a metal deposition stage of an additive patterning process. In addition to the features from FIG. 10I, superconducting integrated circuit 1000*j* also includes superconducting metal layer 1021 deposited (e.g., by electroplating) over top of patterned dielectric layer 1043. Superconducting metal layer 1021 may comprise, for example, niobium or another material capable of superconducting in operation. The deposition of metal layer 1021 fills the open features (e.g., 1081 from FIG. 10I) in dielectric layer 1043 with superconducting metal. The pattern in dielectric layer 1043 thus serves as a mold for patterning metal layer 1021.

Figure 10K:
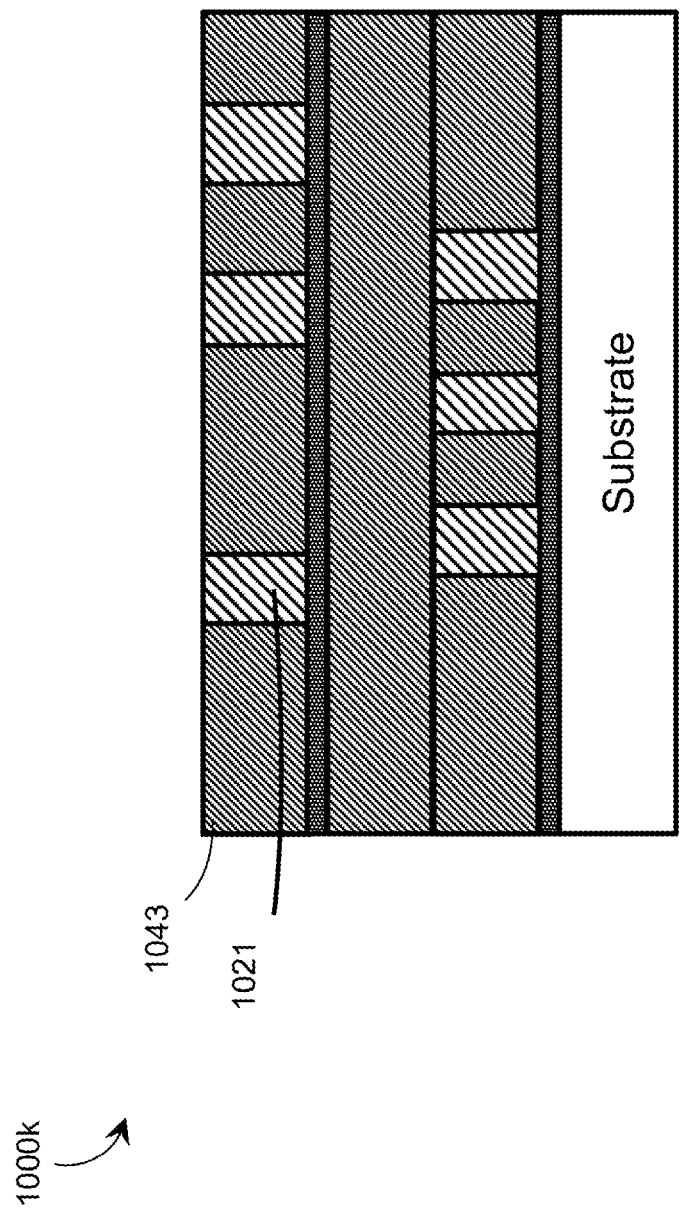
FIG. 10K is an elevational, partially sectioned, view of the portion of the superconducting integrated circuit of FIG. 10J after a metal planarization stage of an additive patterning process, according to one illustrated embodiment.

FIG. 10K is a sectional view of a portion of an exemplary superconducting integrated circuit 1000*k* in accordance with the present systems and methods. FIG. 10K depicts superconducting integrated circuit 1000*j* from FIG. 10J after a metal planarization stage of an additive patterning process. By comparison to superconducting integrated circuit 1000*j* from FIG. 10J, metal layer 1021 of integrated circuit 1000*k* has been planarized/polished (e.g., by CMP or a similar process) to remove excess metal down to the top of dielectric layer 1043. After this planarization operation, all that remains of metal layer 1021 are those portions of metal layer 1021 that fill the open features (e.g., 1081 from FIG. 10I) of dielectric layer 1043. Thus, metal layer 1021 has been patterned by adding it to the mold in dielectric layer 1043 and polishing away any excess metal. The planarization/polishing of metal layer 1021 may be configured to stop once the interface between metal layer 1021 and dielectric layer 1043 is reached.

As previously described, an additive patterning process may improve control of ILD thickness in a superconducting integrated circuit. Once the ILD thickness has been defined, subsequent processing acts may employ either an additive patterning or a subtractive patterning approach as determined by the requirements of the circuit being fabricated. For example, FIGS. 10G-10K depict a second superconducting metal layer being patterned by an additive patterning approach, which may be advantageous in some circuits (e.g., in circuits that will include at least a third metal layer and, consequently, a second ILD, over second metal layer 1021). However, in alternative embodiments (e.g., in circuits where second metal layer 1021 is the topmost metal layer and there is no ILD defined above second metal layer 1021), the deposition and patterning of second metal layer 1021 may employ a subtractive patterning approach if preferred without adversely affecting ILD thickness control in the circuit.

The operations, acts or steps described in FIGS. 10A-10K may be repeated for additional dielectric and wiring layers (with additional via connections as desired) above layers 1043 and 1021 to provide as many layers as necessary in any specific integrated circuit design. The operations, acts or steps described in FIGS. 10A-10K are summarized in FIG. 11.

Figure 11:
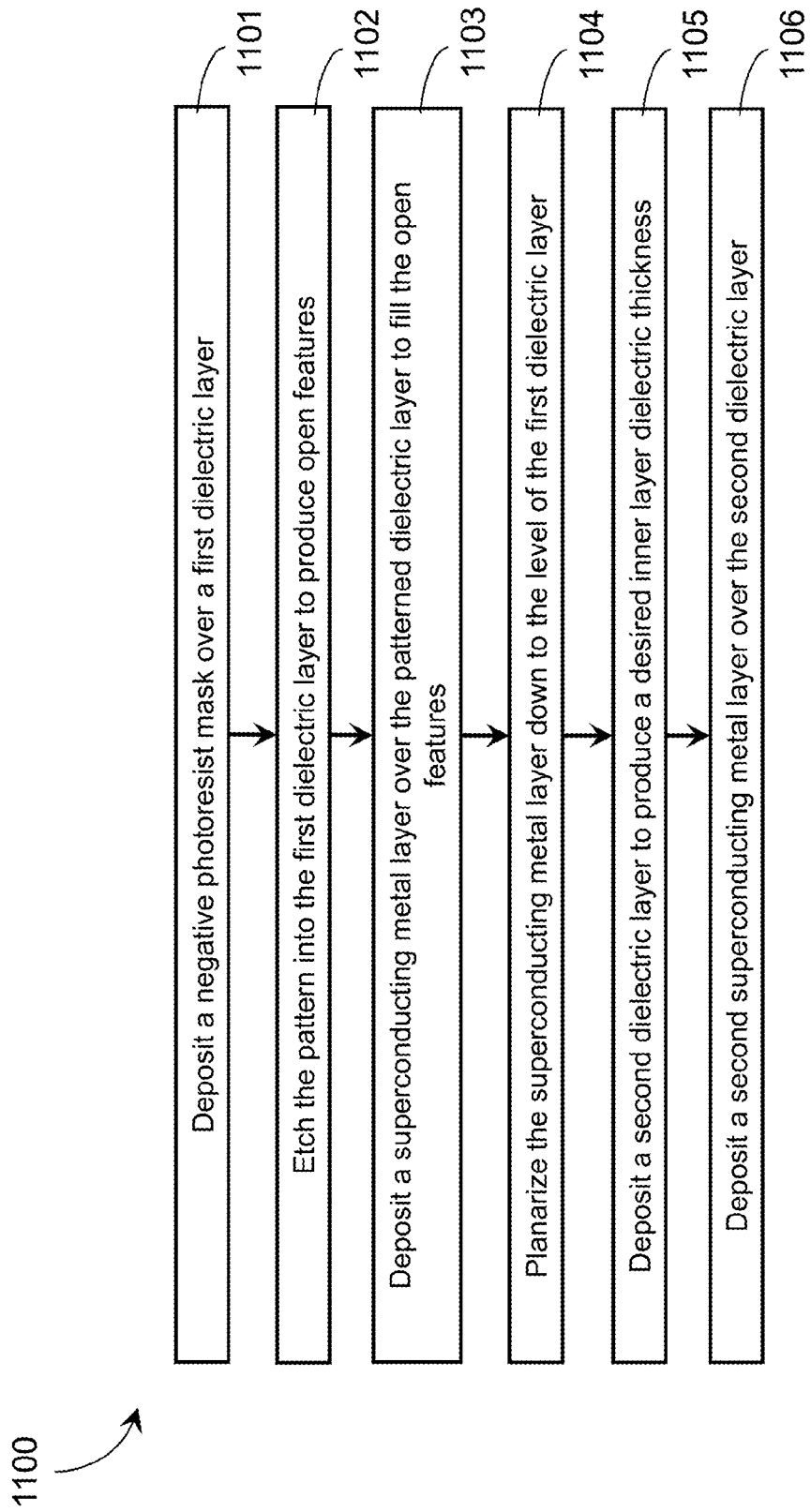
FIG. 11 is a flow diagram showing a method of employing an additive patterning technique in a superconducting integrated circuit fabrication process to realize improved ILD thickness control, according to one illustrated embodiment.

FIG. 11 shows a method 1100 for employing an additive patterning technique in a superconducting integrated circuit fabrication process to realize improved ILD thickness control in accordance with the present systems and methods. Method 1100 includes six operations or acts 1101-1106, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 1101, a negative photoresist mask is deposited over a first dielectric layer. As described in the context of FIG. 10A, the negative photoresist mask traces out the inverse of the desired circuit pattern. The desired circuit pattern corresponds to regions of the first dielectric layer that are not covered by the photoresist mask. At 1102, the pattern provided by the negative photoresist mask is etched into the first dielectric layer to produce open features (e.g., trenches). In some embodiments, the first dielectric layer may overlie an etch-stop layer through which the etch at 1102 does not pass. At 1103, a superconducting metal layer is deposited on or over the patterned dielectric layer to fill the open features in the first dielectric layer. The superconducting metal layer may comprise, e.g., niobium and, as described above, the niobium may be deposited by electroplating, or by standard niobium deposition techniques depending on the requirements and properties of the specific circuit being fabricated. In order to fill the open features of the first dielectric layer, excess superconducting metal may be deposited such that the first dielectric layer is completely coated in superconducting metal. At 1104, the superconducting metal layer is planarized (e.g., by a CMP process) down to the level of the first dielectric layer such that all that remains of the superconducting metal layer are the portions thereof that fill the open features in the first dielectric layer. At 1105, a second dielectric layer is deposited to produce a desired ILD thickness. The second dielectric layer is deposited on top of or over the superconducting metal layer (and consequently, over the first dielectric layer) to a height that at least approximately corresponds to the desired inner layer dielectric thickness. The second dielectric layer may be deposited by, for example, CVD, PVD, ALD, or a similar process. The second dielectric layer may be planarized to provide a smooth surface, if necessary. At 1106, a second superconducting metal layer is deposited on top of or over the second dielectric layer, such that the second superconducting metal layer is separated from the first superconducting metal layer by at least the ILD thickness. In some embodiments, the second superconducting metal layer may be deposited directly on top of or over the second dielectric layer (and, e.g., patterned by a standard subtractive patterning approach: e.g., FIGS. 9A through 9E). In other embodiments, an etch-stop layer may first be deposited directly on top of the second dielectric layer; a third dielectric layer may be deposited on top of or over the etch-stop layer; the third dielectric layer may be patterned with a negative mask to produce open features; and the second superconducting metal layer may then be deposited (still on top of or over the second dielectric layer) on top of or over the third dielectric layer to fill the open features in the third dielectric layer.

FIGS. 10A through 10K depict a superconducting additive patterning process wherein electroplating may be used to deposit superconducting metal (e.g., niobium) layers and the thickness of the ILD that separates two metal layers is substantially controlled by a dielectric deposition process (e.g., CVD, PVD, ALD, or the like) as opposed to being completely controlled by a planarization/polishing process. FIGS. 10A through 10K, as well as FIG. 11, depict a superconducting Damascene process. However, a person of skill in the art will appreciate that the process depicted in FIGS. 10A through 10K (and FIG. 11) is simplified in that it does not provide any via connections between separate metal layers. In accordance with the present systems and methods, an additive process may also be employed to fabricate a superconducting integrated circuit having via connections between metal layers. For example, a superconducting dual Damascene process may be employed to fill both via holes and open features in dielectric layers with superconducting metal. In accordance with the present systems and methods, a superconducting dual Damascene process may include separate via masking/etching and wiring masking/etching acts. In some embodiments, open vias and wiring features may be filled with superconducting metal simultaneously. In some embodiments, vias may be masked, etched, and filled in multiple stages.

A superconducting integrated circuit that employs multiple superconducting layers often requires superconducting interconnections between layers. These interconnections are known as "vias." Hinode et al., Physica C 426-432 (2005) 1533-1540 discusses some of the difficulties unique to superconducting vias. For example, niobium is a superconducting metal that is commonly employed as a conductor in superconducting integrated circuits, but niobium does not naturally fill via holes very well. This can result in poor contacts between wiring layers of superconducting integrated circuits that employ niobium. In particular, niobium poorly fills holes that have a depth-to-width aspect ratio greater than about 0.7:1, or 70%. A person of skill in the art will appreciate that it is the inherent chemical and/or physical nature of niobium that prevents it from properly filling high aspect ratio holes.

Circuit size is a common design consideration in both semiconductor and superconductor integrated circuits, with the goal often being to fit denser and more sophisticated circuits within limited spatial dimensions. Higher aspect ratio vias are desirable because they can allow for more densely-packed circuits to be developed. According to the state of the art, the inability to produce high aspect ratio superconducting vias currently limits the density and miniaturization of superconducting integrated circuits that employ niobium. In accordance with the present systems and methods, high aspect ratio (i.e., greater than about 0.7:1) niobium vias may be fabricated by employing a "superconducting additive patterning," "superconducting Damascene," and/or "superconducting dual Damascene" process.

The various embodiments described herein provide systems and methods for a superconducting dual Damascene process. A superconducting dual Damascene process employs additive patterning and may be similar to the superconducting Damascene process depicted in FIGS. 10A through 10K and FIG. 11, with the additional feature that a superconducting dual Damascene process provides superconducting via connections between separate superconducting wiring layers. Via connections may be patterned and formed, for example, within a patterned dielectric before the open features in the dielectric are filled with superconducting metal. Thus, at each metal wiring layer in a multilayered integrated circuit, a superconducting dual Damascene process may include a wiring masking/etching operation to produce wiring features, followed by a separate via masking/etching operation such that vias may be etched within the wiring features.

Figure 12A:
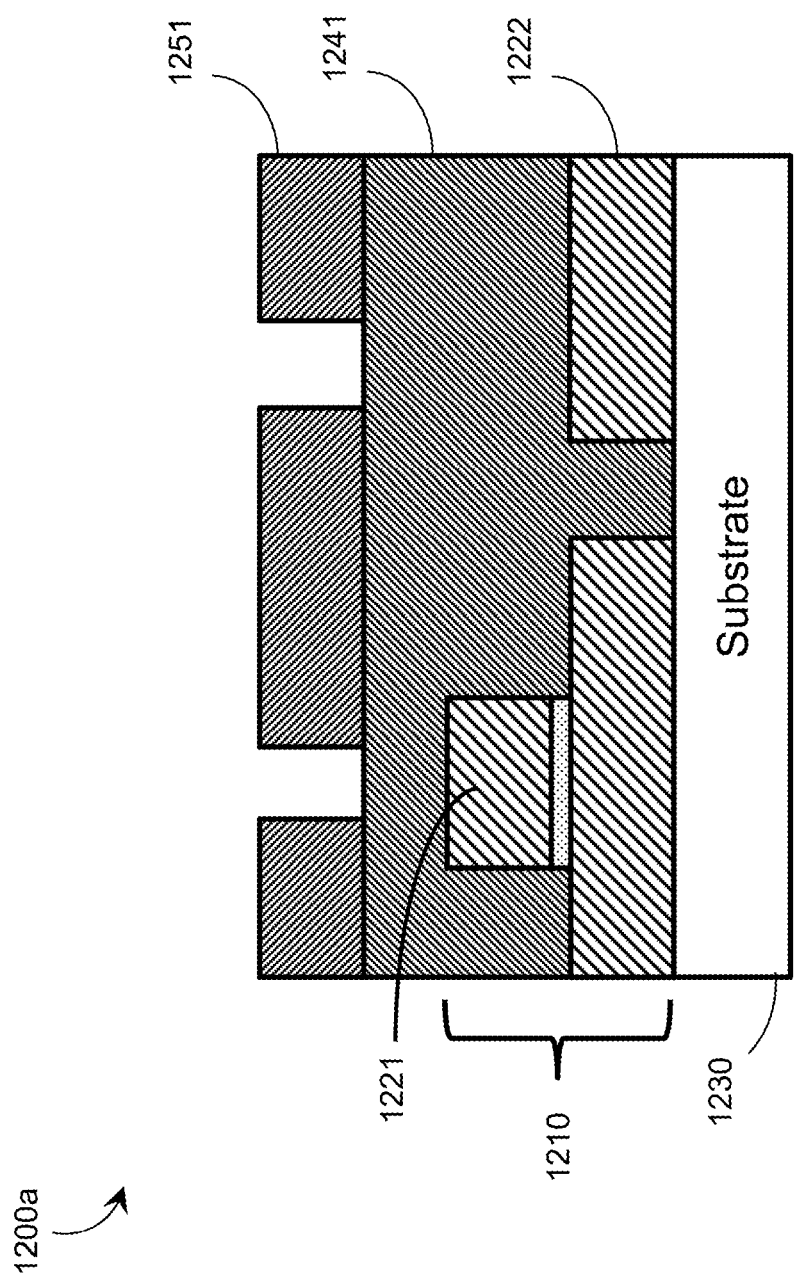
FIG. 12A is an elevational, partially sectioned, view of a portion of a superconducting integrated circuit during a via masking stage of a superconducting dual Damascene process, according to one illustrated embodiment.

FIG. 12A is a sectional view of a portion of an exemplary superconducting integrated circuit 1200a during a via masking stage of a superconducting dual Damascene process in accordance with the present systems and methods. Integrated circuit 1200a includes a Nb—AlOx-Nb trilayer 1210 carried on or by a substrate 1230 and a dielectric layer 1241. Integrated circuit 1200a is depicted at an intermediate stage in a fabrication process at which trilayer 1210 has already been patterned (via, for example, a photoresist masking and plasma etching technique) to define a Josephson junction 1221 and a wiring component 1222. At the via masking stage depicted in FIG. 12A, integrated circuit 1200a further includes a negative photoresist mask layer 1251 that overlies dielectric layer 1241. Mask 1251 effectively traces out the negative or inverse of the desired locations for via connections to trilayer 1210. In other words, the desired via locations correspond to regions of dielectric layer 1241 that are not covered by photoresist mask 1251. Those regions of dielectric layer 1241 that are not directly covered by mask 1251 will be etched away to form open holes exposing trilayer 1210 while those regions of dielectric layer 1241 that are directly covered by mask 1251 will remain after etching.

Figure 12B:
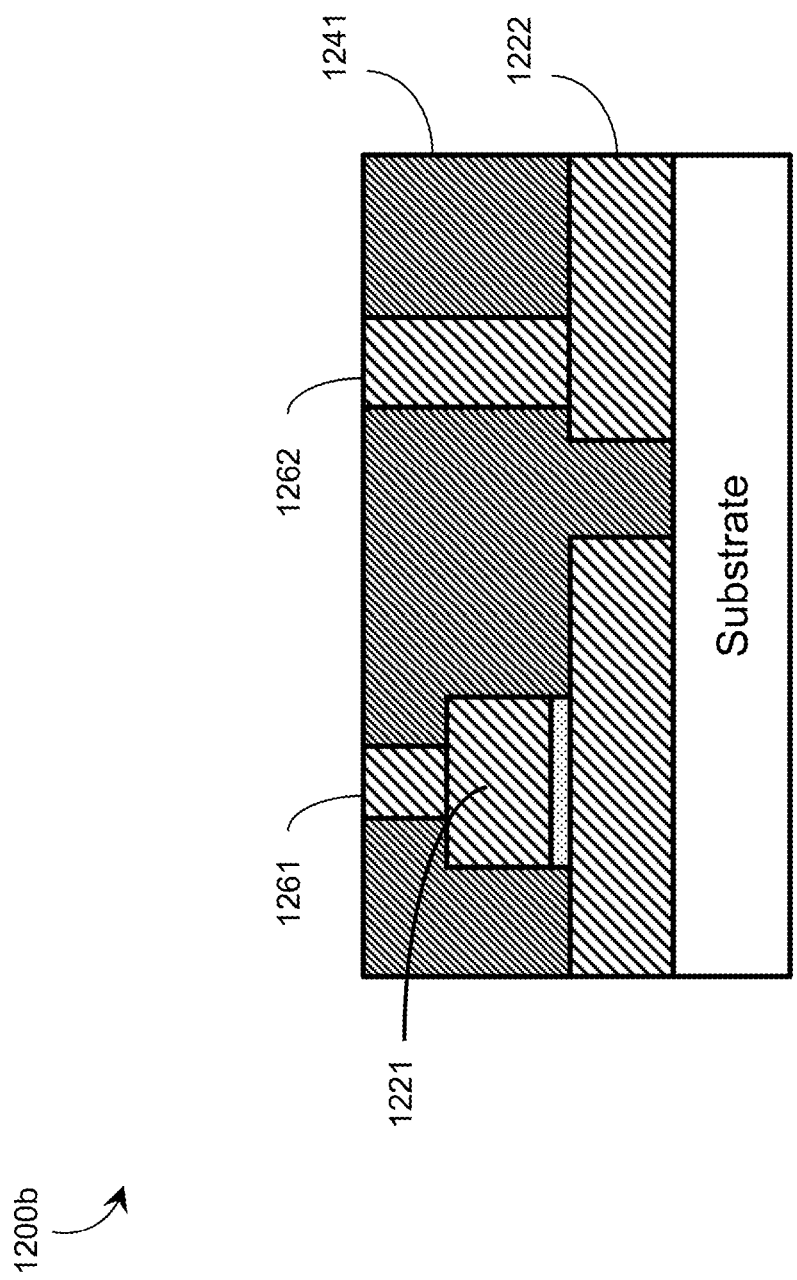
FIG. 12B is an elevational, partially sectioned, view of the portion of the superconducting integrated circuit of FIG. 12A after dielectric etching, metal deposition, and metal planarization/polishing stages of an additive patterning process, according to one illustrated embodiment.

FIG. 12B is a sectional view of a portion of an exemplary superconducting integrated circuit 1200b in accordance with the present systems and methods. FIG. 12B depicts superconducting integrated circuit 1200a from FIG. 12A after dielectric etching, metal deposition, and metal planarization/polishing stages of an additive patterning process, similar to the operations or acts described in FIGS. 10B through 10D. Photoresist mask 1251 and those regions of dielectric layer 1241 that were not directly covered by photoresist mask 1251 have been etched away (i.e., in a similar way to that described in going from FIG. 10A to FIG. 10B). The resulting holes in dielectric layer 1241 have been filled with superconducting metal (i.e., in a similar way to that described in going from FIG. 10B to 10C) to produce first portions of vias 1261 and 1262 that provide superconducting connections to Josephson junction 1221 and wiring 1222, respectively. The first portions of superconducting vias 1261 and 1262 may, for example, be filled with niobium using a niobium electroplating process and may have aspect ratios of approximately 0.7:1, less than 0.7:1, or (as enabled by the electroplating fill process) greater than 0.7:1. Excess niobium deposited above the upper surface of dielectric layer 1241 has been removed via a CMP process (i.e., in a similar way to that described in going from FIGS. 10C to 10D). As will be described in FIGS. 12C through 12G, FIG. 12B shows only respective first portions of superconducting vias 1261 and 1262. Further processing operations or acts may be employed to add to the structure of vias 1261 and 1262.

Figure 12C:
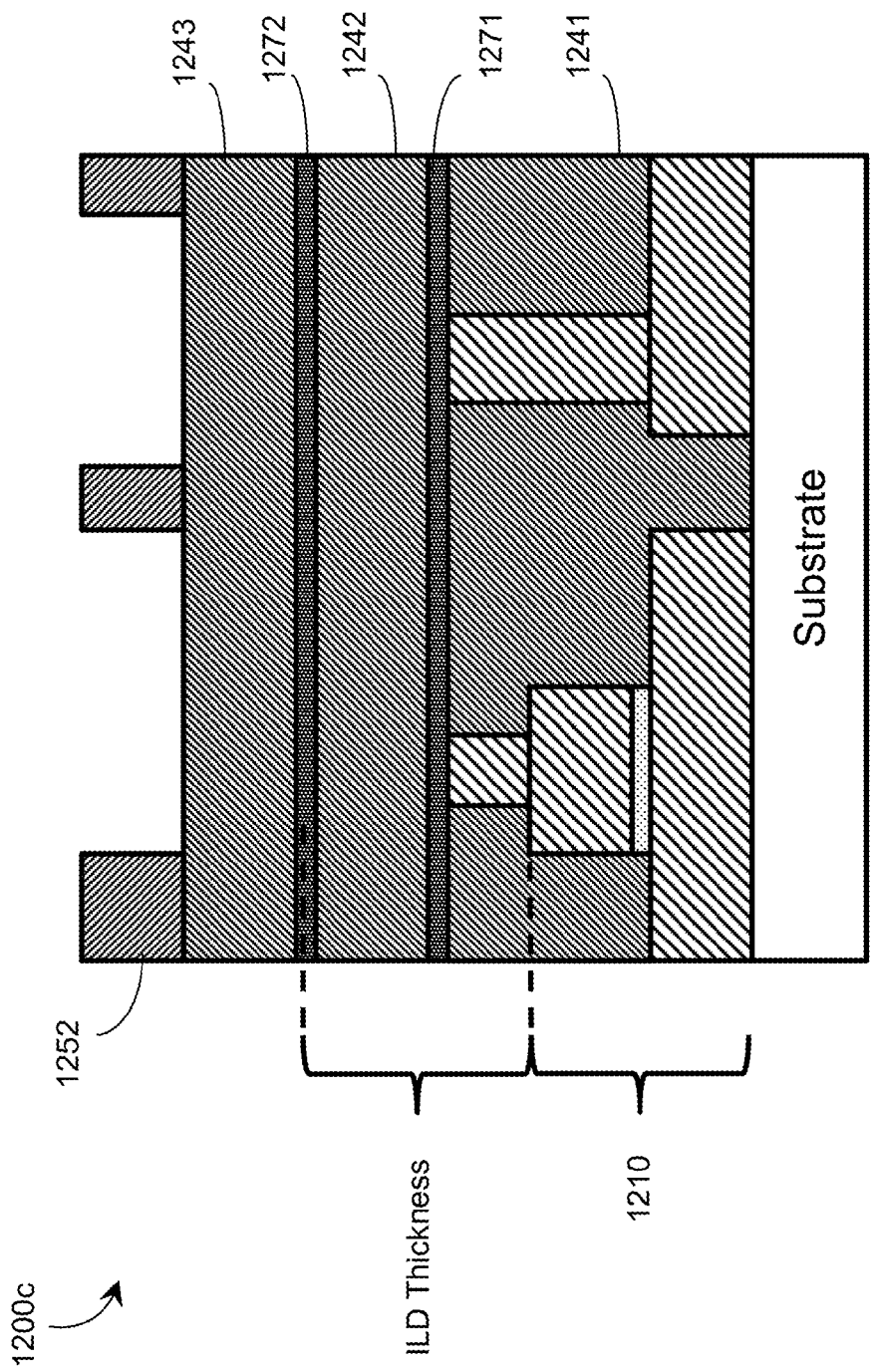
FIG. 12C is an elevational, partially sectioned, view of the portion of the superconducting integrated circuit of FIG. 12B during a wiring masking stage of a dual Damascene process after etch stop layers and dielectric layer have been deposited, according to one illustrated embodiment.

FIG. 12C is a sectional view of a portion of an exemplary superconducting integrated circuit 1200c in accordance with the present systems and methods. FIG. 12C depicts circuit 1200b from FIG. 12B during a wiring masking stage of a dual Damascene process after etch stop layers 1271, 1272 and dielectric layers 1242, 1243 have been deposited. Etch stop layer 1271 is deposited on or over dielectric layer 1241 via, for example, a CVD, PVD, or ALD process and may comprise, for example, SiN. Dielectric layer 1242 is deposited on or over etch-stop layer 1271 via, for example, a CVD, PVD, or ALD process and may comprise, for example, $SiO_2$. The deposition of dielectric layer 1242 may be used to control the thickness of the resulting ILD that separates trilayer 1210 from the next metal layer up (not yet shown—see metal layer 1290 in FIG. 12G). In accordance with the present systems and methods, the additive patterning approach provides improved ILD thickness control because the thickness of a dielectric layer may be more precisely controlled through a deposition process compared to a planarization/polishing process. Etch stop layer 1272 is deposited on or over dielectric layer 1242 via, for example, a CVD, PVD, or ALD process and may comprise, for example, SiN. Dielectric layer 1243 is deposited on or over etch-stop layer 1272 via, for example, a CVD, PVD, or ALD process and may comprise, for example, $SiO_2$. At the wiring masking stage depicted in FIG. 12C, integrated circuit 1200c further includes a negative photoresist mask layer 1252 that overlies dielectric layer 1243. In this additive patterning process, mask 1252 effectively traces out the negative or inverse of a desired circuit pattern in dielectric layer 1243. In other words, the desired circuit pattern corresponds to regions of dielectric layer 1243 that are not covered by negative photoresist mask 1252. Those regions of dielectric layer 1243 that are not directly covered by mask 1252 will be etched away to form open features (e.g., trenches) while those regions of dielectric layer 1243 that are directly covered by mask 1252 will remain after etching. Mask 1252 defines a circuit pattern for a metal wiring layer (not shown, see metal layer 1290 in FIG. 12G) that will lie above trilayer 1210.

Figure 12D:
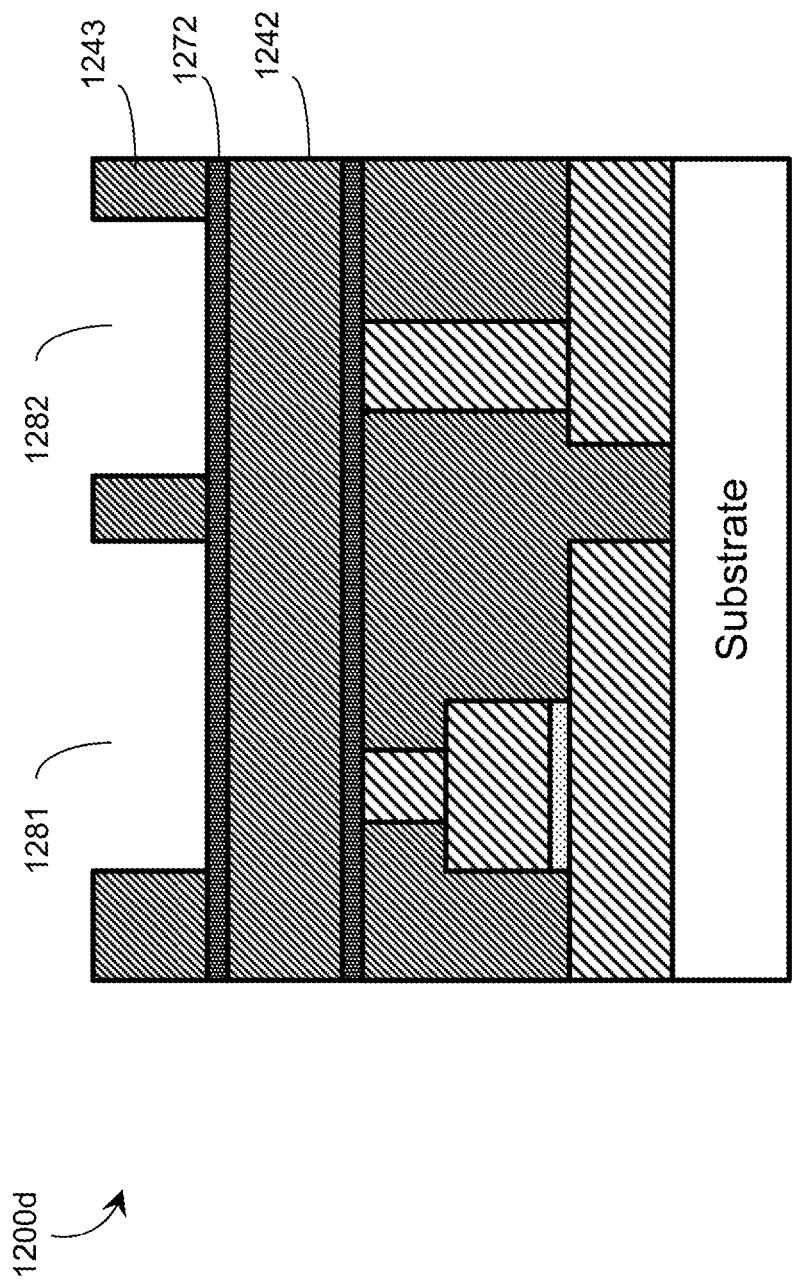
FIG. 12D is an elevational, partially sectioned, view of the portion of the superconducting integrated circuit of FIG. 12C after a wiring etching stage of an additive patterning process, according to one illustrated embodiment.

FIG. 12D is a sectional view of a portion of an exemplary superconducting integrated circuit 1200d in accordance with the present systems and methods. FIG. 12D depicts superconducting integrated circuit 1200c from FIG. 12C after a wiring etching stage of an additive patterning process. Photoresist mask 1252 from FIG. 12C has been stripped away and dielectric layer 1243 has been etched to produce open features (e.g., trenches) 1281 and 1282 that trace out the desired circuit pattern into dielectric layer 1243. Those regions of dielectric layer 1243 that were directly covered by photoresist mask 1252 remain unetched. The etching into dielectric layer 1243 is controlled by etch-stop layer 1272, which provides an interface between dielectric layer 1243 and dielectric layer 1242 through which the etch will not pass, thereby ensuring that the ILD thickness described in FIG. 12C remains unaffected by this etch.

Figure 12E:
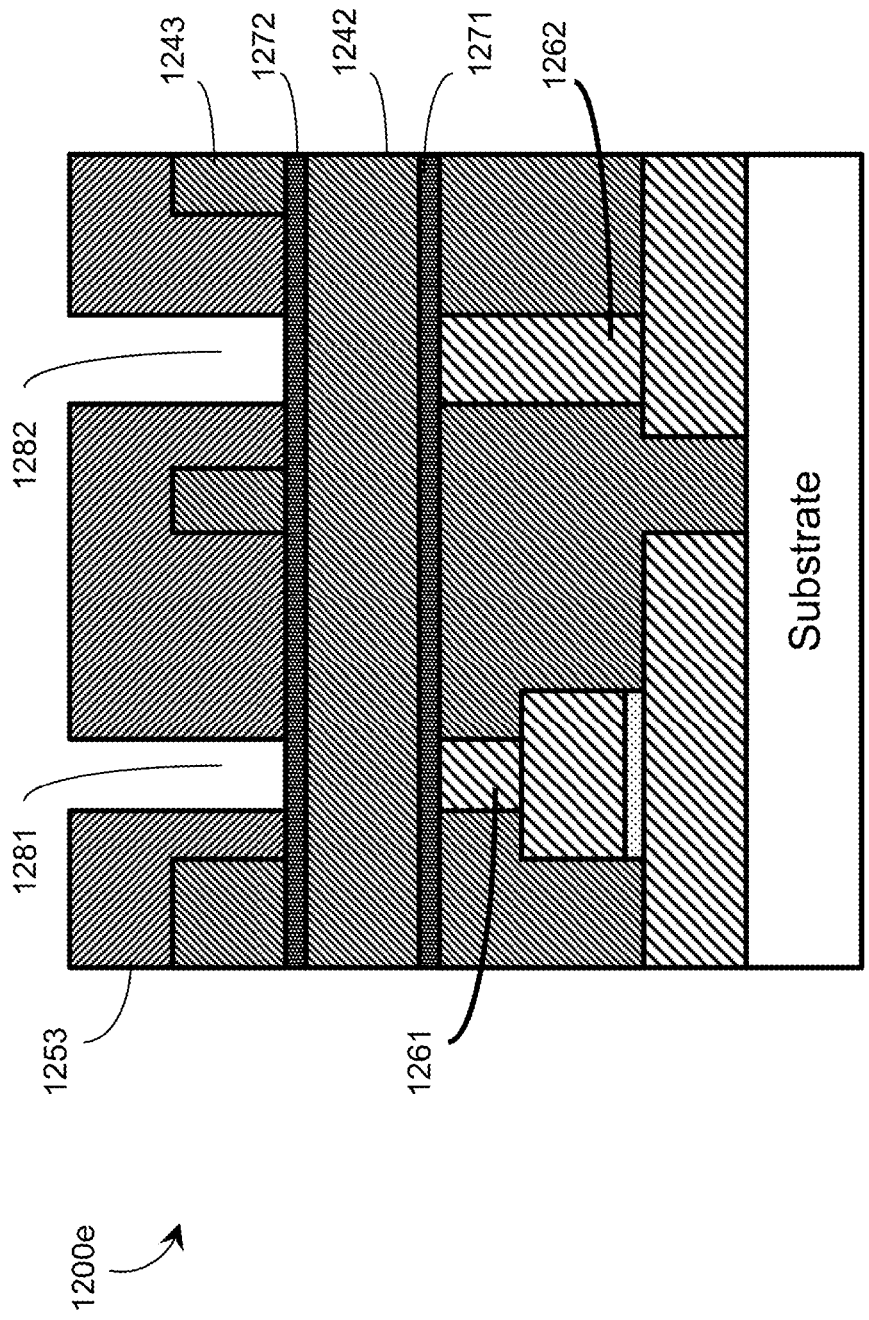
FIG. 12E is an elevational, partially sectioned, view of the portion of the superconducting integrated circuit of FIG. 12D during a via masking stage of a dual Damascene process, according to one illustrated embodiment.

FIG. 12E is a sectional view of a portion of an exemplary superconducting integrated circuit 1200e in accordance with the present systems and methods. FIG. 12E depicts superconducting integrated circuit 1200d from FIG. 12D during a via masking stage of a dual Damascene process. Integrated circuit 1200e includes negative photoresist mask 1253 that overlies patterned dielectric layer 1243 and effectively traces out the negative or inverse of the locations for respective second portions of via connections 1261 and 1262 such that vias 1261 and 1262 may be extended up to dielectric layer 1243. Etching for the second portions of vias (e.g., vias 1261 and 1262) may employ an etch chemistry (i.e., a "slurry") that etches through etch-stop layers 1272 and 1271 as well as dielectric layer 1242 all at once. Alternatively, etching for the second portions of vias (e.g., vias 1261 and 1262) may be completed in stages, with a first stage employing an etch chemistry that etches through etch-stop layer 1272, a second stage employing an etch chemistry that etches through dielectric layer 1242, and a third stage employing an etch chemistry that etches through etch-stop layer 1271. Whether the etching is performed in a single operation or act or in multiple operations or acts, the etching may be designed to stop when the existing metal of the respective first portions of vias 1261 and 1262 is exposed. The locations of vias 1261 and 1262 correspond to regions of etch-stop layer 1272 (above dielectric layer 1242 and etch stop layer 1271) within open features 1281 and 1282, respectively, of dielectric layer 1243 that are not covered by photoresist mask 1253. Those regions of etch-stop layer 1272 (as well as dielectric layer 1242 and etch-stop layer 1271) that are not directly covered by mask 1253 will be etched away to form open holes exposing the metal of the first portions of vias 1261 and 1262, while those regions of etch-stop layer 1272 (as well as dielectric layer 1242 and etch-stop layer 1271) that are directly covered by mask 1253 will remain after etching. Thus, the superconducting dual Damascene process employs additive patterning to define open features in dielectric layers (in the same way as the superconducting Damascene process described in FIGS. 10A through 10K) and further provides masking and etching of via connections within the open features in the dielectric layers. Vias may be filled in stages, where a second stage provides a superconducting extension to a first stage.

Figure 12F:
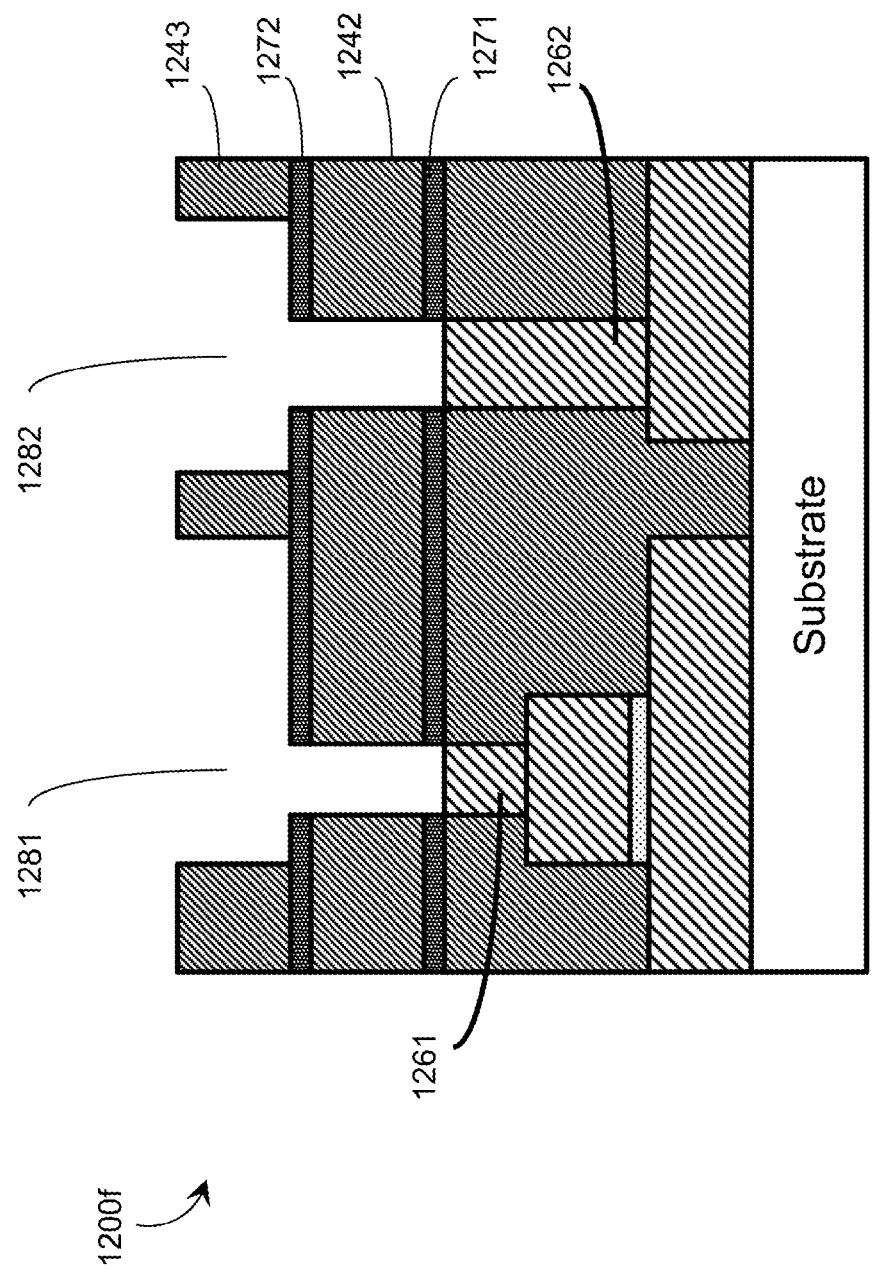
FIG. 12F is an elevational, partially sectioned, view of the portion of the superconducting integrated circuit of FIG. 12E after a via etching stage of a dual Damascene process, according to one illustrated embodiment.

FIG. 12F is a sectional view of a portion of an exemplary superconducting integrated circuit 1200f in accordance with the present systems and methods. FIG. 12F depicts superconducting integrated circuit 1200e from FIG. 12E after a via etching stage of a dual Damascene process. Etch-stop layer 1272, dielectric layer 1242, and etch-stop layer 1271 have all been etched (either all at once or in series as described above) to expose the existing metal in the respective first portions of vias 1261 and 1262 and provide respective connections between open features 1281 and 1282 in dielectric layer 1243 and the first portions of vias 1261 and 1262. Photoresist mask 1253 from FIG. 12E has been stripped away. Those regions of dielectric layer 1243 and etch-stop layer 1272 (as well as dielectric layer 1242 and etch-stop layer 1271) that were directly covered by photoresist mask 1253 remain unetched. Thus, in the superconducting dual Damascene process, second portions of vias 1261 and 1262 may be etched into open features 1281 and 1282 in a dielectric layer 1243. This enables both the second portions of vias 1261 and 1262 and the open features 1281 and 1282 in dielectric layer 1243 to subsequently be filled with superconducting metal simultaneously.

Figure 12G:
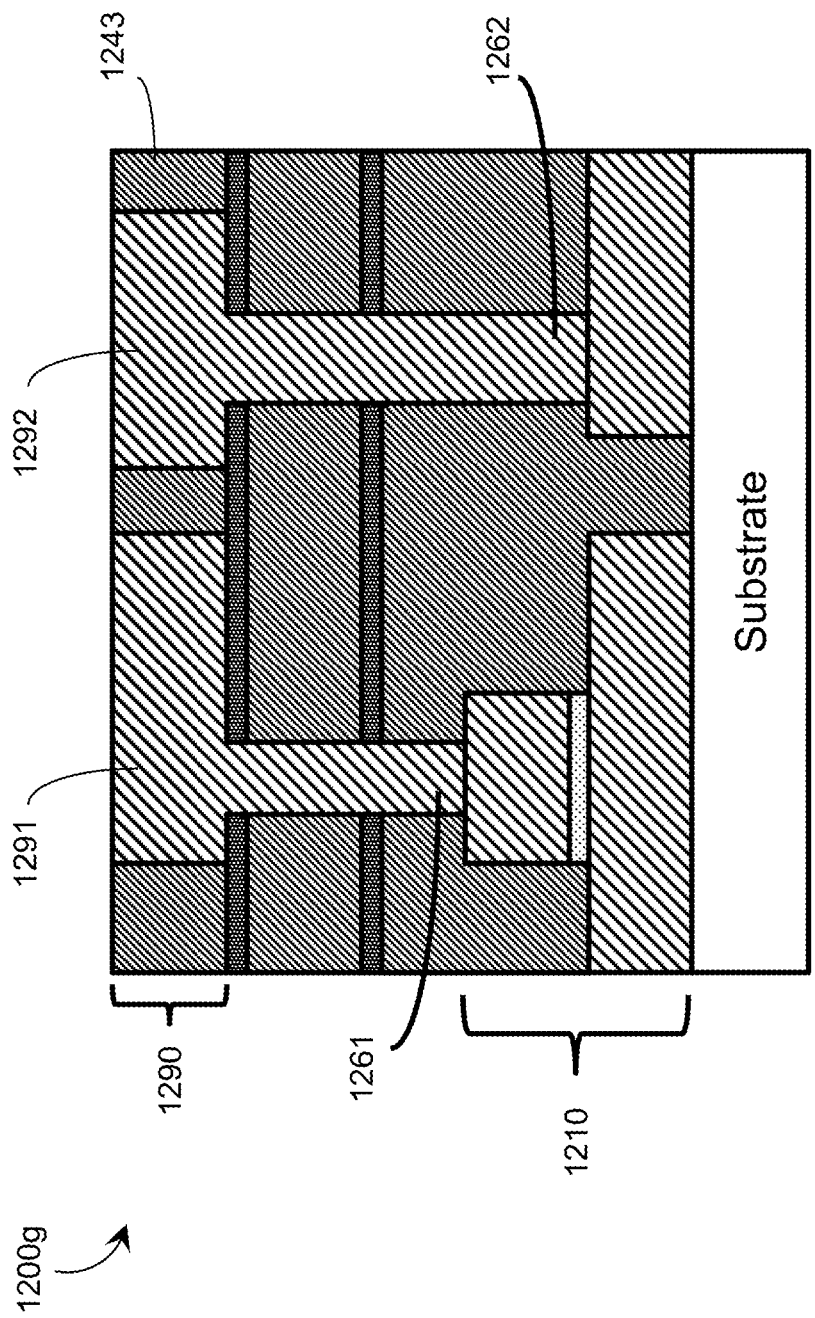
FIG. 12G is an elevational, partially sectioned, view of the portion of the superconducting integrated circuit of FIG. 12F after superconducting metal deposition and planarization has been completed, according to one illustrated embodiment.

FIG. 12G is a sectional view of a portion of an exemplary integrated circuit 1200g in accordance with the present systems and methods. FIG. 12G depicts superconducting integrated circuit 1200f from FIG. 12F after superconducting metal deposition and planarization operations or acts have been completed. Superconducting metal (e.g., niobium) is deposited on or over dielectric layer 1243 to fill the respective portions of superconducting vias 1261 and 1262 and also fill the open features (1281 and 1282 from FIG. 12F) in dielectric layer 1243 to produce wiring features 1291 and 1292. As previously described, the superconducting metal (e.g., niobium) may be deposited by an electroplating process that enables sufficient fill of the second portions of via 1261 and 1262 such that the second portions of via 1261 and 1262 (and/or vias 1261 and 1262 in their entirety, i.e., the combined length of the first and second portions of via 1261 and the combined length of the first and second portions of via 1262) may have any aspect ratio, including an aspect ratio greater than approximately 0.7:1. In order to completely fill open features 1281 and 1282 from FIG. 12F, excess metal above the upper surface of dielectric layer 1243 may be deposited. This excess metal may be removed down to the level of dielectric layer 1243 via a planarization/polishing process (e.g., CMP, as described in going from FIGS. 10J to 10K). Thus, the metal deposition and planarization operations or acts define a patterned metal wiring layer 1290 that fills the open features 1281 and 1282 from FIG. 12F in dielectric layer 1243 and also fills second portions of vias 1261 and 1262 to provide complete via connections between wiring layer 1290 and trilayer 1210.

The acts described in FIGS. 12A-12G may be repeated for additional dielectric and wiring layers (with additional via connections as desired) above layers 1243 and 1290 to provide as many layers as necessary in any specific integrated circuit design. The operations or acts or steps described in FIGS. 12A-12G are summarized in FIG. 13.

Figure 13:
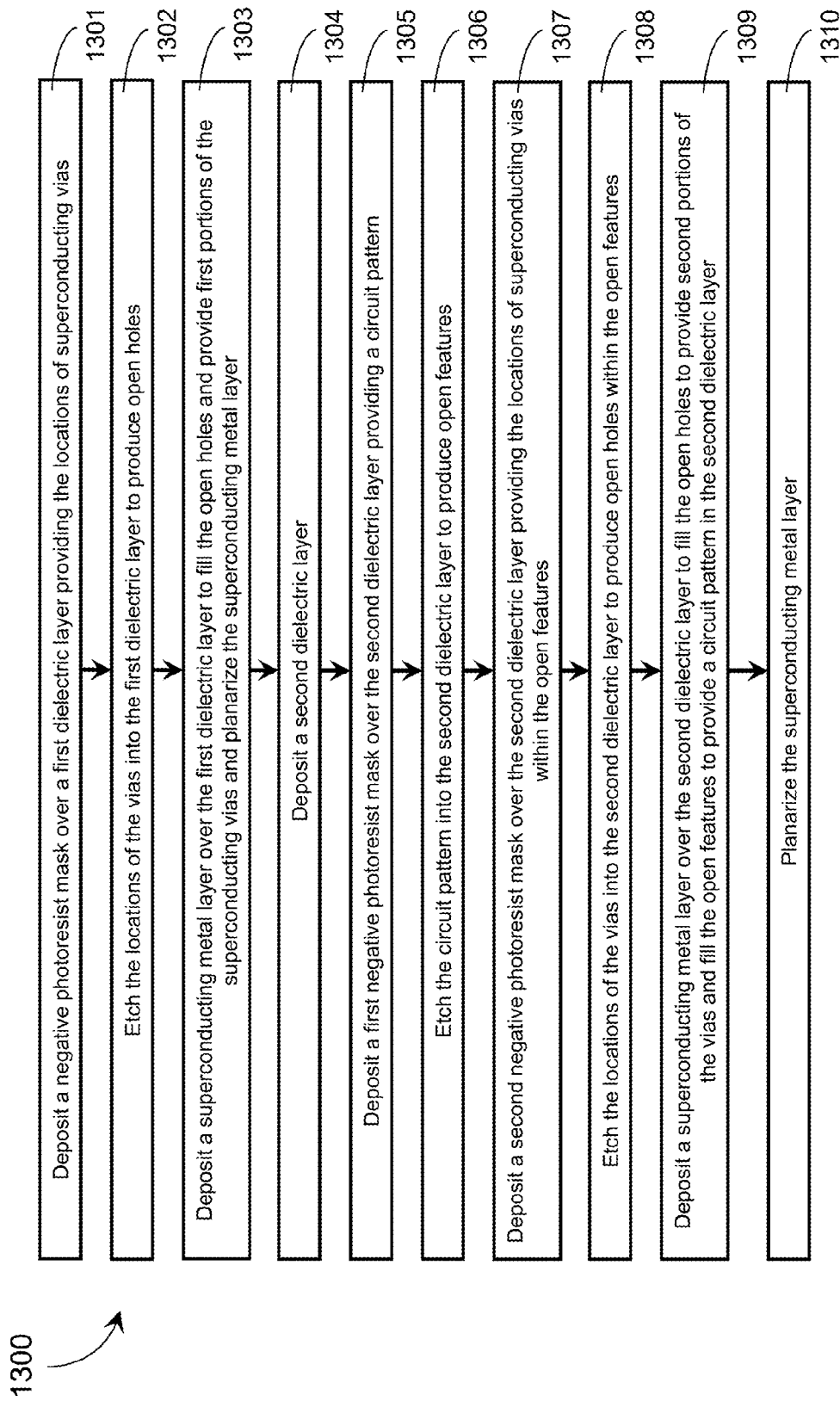
FIG. 13 is a flow diagram showing a method of implementing a superconducting dual Damascene process, according to one illustrated embodiment.

FIG. 13 is a flow-diagram of a method 1300 for implementing a superconducting dual Damascene process in accordance with the present systems and methods. Method 1300 includes ten operations or acts 1301-1310, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 1301, a negative photoresist mask is deposited on or over a first dielectric layer, where the negative photoresist mask provides the locations of superconducting vias. The first dielectric layer may overlie a superconducting metal layer, such as a Nb—AlOx-Nb trilayer, as depicted in FIG. 12A. At 1302, the locations of the vias are etched into the first dielectric layer to produce open holes. The open holes may expose superconducting metal in a superconducting metal layer beneath the first dielectric layer. At 1303, a superconducting metal layer is deposited on or over the first dielectric layer to fill the open holes and thereby provide first portions of the superconducting vias. As previously described, the superconducting metal may include niobium and may be deposited, for example, by an electroplating process. The superconducting metal layer is then planarized (e.g., by CMP) until the upper surface of the first dielectric layer is exposed. At 1304, a second dielectric layer is deposited. The deposition of the second dielectric layer may be preceded by the deposition of at least one etch-stop layer. In some embodiments, the deposition of the second dielectric layer at 1304 may include, in sequence: depositing a first etch-stop layer, depositing an inner layer dielectric, depositing a second etch-stop layer, and depositing the second dielectric layer. As previously described, the thickness of the inner layer dielectric is determined by this deposition process and so can be more precisely controlled than in the subtractive patterning process, where ILD thickness is controlled by a planarization process. At 1305, a first negative photoresist pattern providing a circuit pattern is deposited on or over the second dielectric layer. At 1306, the circuit pattern is etched into the second dielectric layer to produce open features (e.g., trenches). When (as described) the deposition of the second dielectric layer at 1304 is preceded by the deposition of at least one etch-stop layer, the etch at 1306 may be configured to stop at the at least one etch-stop layer. The first negative photoresist pattern may then be stripped. At 1307, a second negative photoresist mask is deposited on or over the second dielectric layer providing the locations of superconducting vias within the open features in the second dielectric layer. For example, the superconducting vias from operations or acts 1301-1303 may be extended upwards to connect to the circuit pattern (1305) defined by the open features in the second dielectric layer. Thus, at 1307, the locations where the vias from acts 1301-1303 are to connect to the circuit pattern (1305) in the second dielectric layer are defined within the open features in the second dielectric layer. At 1308, the locations of the vias are etched into the second dielectric layer to produce open holes within the open features that extend downwards through at least the second dielectric layer and expose the tops of the first (filled) portions of the superconducting vias (from act 1303). The second negative photoresist mask may then be stripped. At 1309, a superconducting metal layer is deposited over the second dielectric layer to fill the open holes providing second portions of the vias and to fill the open features to provide a circuit pattern in the second dielectric layer. As previously described, the superconducting metal may include niobium and may be deposited by an electroplating process that facilitates filling the open holes and enables vias having any aspect ratio (e.g., an aspect ratio greater than about 0.7:1) to be produced. Act 1309 simultaneously forms wiring elements in the second dielectric layer and completes via connections from the wiring elements in the second dielectric layer (to, e.g., a wiring layer that lies beneath the first dielectric layer). At 1310, the superconducting metal layer is planarized or polished (e.g., by a CMP process) to remove any excess metal and expose the upper surface of the second dielectric layer. If necessary to produce additional layers in the integrated circuit, a third dielectric layer may be deposited and acts 1301-1310 may then be repeated on top of or over the third dielectric layer.

The superconducting Damascene and/or dual Damascene processes depicted in FIGS. 10A through to 10K, FIG. 11, FIGS. 12A through 12G, and FIG. 13 may be used to fabricate complete superconducting integrated circuits without ever needing to etch the superconducting metal itself. Such may be advantageous for circuits that employ niobium as the superconducting metal because techniques for etching niobium are less developed in the art than techniques for etching other materials, such as aluminum (due to the extensive use of aluminum in the semiconductor industry). Furthermore, etching of niobium can result in the formation of niobium oxides and/or other compounds that can adversely affect circuit operation and performance. Thus, the superconducting Damascene and/or dual Damascene approaches described herein have the additional benefit of reducing (and in some cases, eliminating) the formation of unwanted niobium oxides.

The superconducting Damascene and dual Damascene processes described above implement certain process changes compared to standard photoresist masking and plasma etching (i.e., standard subtractive patterning) which, when taken all together, can provide specific benefits to superconducting integrated circuit fabrication. However, in accordance with the present systems and methods, some of the processes described above may be individually incorporated into an otherwise standard photoresist masking and plasma etching process to realize certain benefits. For example, improved via fill and via critical current control may be achieved by employing electroplating to deposit niobium even in a subtractive patterning process. Such a process may involve little change from the process outlined in FIGS. 9A through 9E except that at the niobium deposition stage(s) an electroplating process is employed as opposed to a more typical CVD, PVD, or ALD process. As described above, depositing niobium via an electroplating process may better fill via connections (compared to depositing niobium via a CVD, PVD, or ALD-type process) and allow vias having high aspect ratios (e.g., greater than about 0.7:1) to be reliably fabricated.

Another example of an individual aspect of the superconducting Damascene and/or dual Damascene process described above that may be integrated into an otherwise standard subtractive patterning process is: defining ILD thickness by dielectric deposition as opposed to by dielectric planarization. In accordance with the present systems and methods, an otherwise typical subtractive patterning process (e.g., as shown in FIGS. 9A to 9E) may be modified such that ILD thickness is determined by a dielectric deposition process as opposed to by a dielectric planarization process. Such a modification may include, for example, extending the dielectric planarization portrayed in going from FIG. 9C to FIG. 9D by planarizing dielectric layer 940 all the way down to the top of metal layer 920. An additional dielectric deposition may then be employed to raise the level of dielectric layer 940 until the desired ILD thickness is reached (e.g., to the level depicted in FIG. 9E). As described previously, dielectric deposition may provide better thickness control than dielectric planarization. In some embodiments, planarizing dielectric layer 940 all the way down to the top of metal layer 920 may involve CMP and may employ a highly selective slurry ("HSS") as opposed to a standard slurry.

Throughout this specification, reference is often made to a substrate formed of, for example, silicon, silicon dioxide, sapphire, or a similar material (such as quartz). In the semiconductor industry, doped silicon is often employed as a substrate or carrier in an integrated circuit because doping can facilitate the fabrication process(es). However, in a superconducting integrated circuit, such dopants may be a source of unwanted noise and/or they may raise the heat capacity of the silicon substrate, which is particularly undesirable in superconducting circuits where an important function of the substrate is to help cool the conducting metals into the superconducting regime. Thus, it may be preferable to employ pure, undoped silicon as a substrate or carrier in a superconducting integrated circuit.

While many different materials may be employed as a substrate in a superconducting integrated circuit, silicon with a top layer of silicon dioxide is commonly used. A top layer of silicon dioxide is often added, at least in part, because silicon on its own is transparent, which can make it difficult to run standard lithographic processes. However, in superconducting circuits that are particularly sensitive to noise (e.g., in superconducting qubit circuits such as superconducting quantum processors), this silicon-to-silicon-dioxide interface can become an undesirable source of noise. In accordance with the present systems and methods, it can be advantageous in some applications to fabricate a superconducting integrated circuit on a substrate comprising silicon with a top layer of an alternative material, such as aluminum oxide, instead of silicon with a top layer of silicon dioxide.

Figure 14:
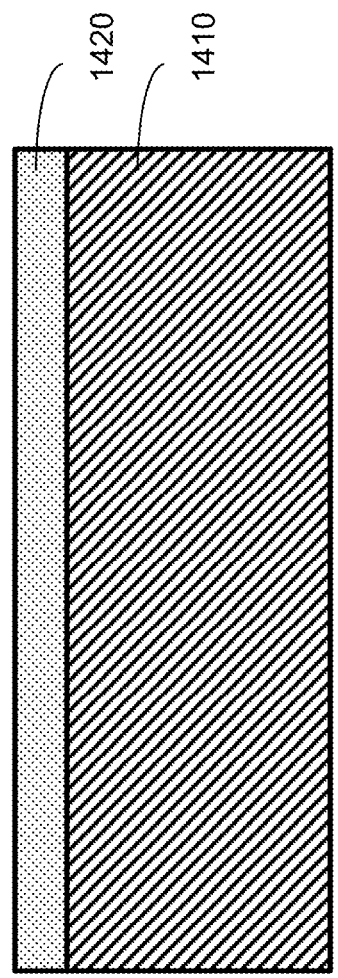
FIG. 14 is an elevational, partially sectioned, view of a portion of a substrate for use in a superconducting integrated circuit, according to one illustrated embodiment.

FIG. 14 is a sectional view of a portion of a substrate 1400 for use in a superconducting integrated circuit in accordance with the present systems and methods. Substrate 1400 comprises two layers: a base layer 1410 of silicon (e.g., standard doped silicon or pure, undoped silicon as described above) and a top layer 1420 of aluminum oxide. In some embodiments, base layer 1410 may comprise sapphire, quartz, or any alternative material suitable as a substrate. Aluminum oxide layer 1420 is non-transparent (e.g., translucent, semi-transparent, or opaque) and therefore facilitates the use of substrate 1400 in conjunction with standard lithographic processing techniques. Furthermore, the silicon-to-aluminum-oxide interface may provide improved noise characteristics (i.e., act as a lesser source of noise) compared to the silicon-silicon-dioxide interface commonly employed in substrates. An additional benefit of aluminum oxide top layer 1420 is that aluminum oxide may serve as a better etch-stop compared to silicon dioxide and therefore enable more precise etching and patterning of material (e.g., superconducting metal, such as niobium) deposited over aluminum oxide top layer 1420.

As described previously, the quality of a trilayer Josephson junction may be degraded (specifically, the quality of the insulating barrier, e.g., AlOx, may be degraded) if the junction is heated above approximately 200° C. This means that once a Josephson junction trilayer has been deposited in a superconducting integrated circuit, it can be advantageous to perform all subsequent processing operations or acts at lower-than-standard temperatures (i.e., <200° C.) to preserve Josephson junction quality. In the semiconductor industry, dielectrics are typically deposited at high temperature (e.g., above 400° C.) to improve purity and smoothness. However, in superconducting integrated circuits employing Josephson junctions, depositing a dielectric layer over a Josephson junction at such a high temperature may adversely affect the Josephson junction itself. Accordingly, it can be advantageous to employ lower-temperature dielectric deposition processes in circuits that include Josephson junction trilayers. An example of a lower temperature dielectric process is a low temperature tetraethyl orthosilicate ("TEOS") dielectric deposition process. TEOS is often used in the art as a precursor to silicon dioxide, but at temperatures (e.g., 650-850° C.) that may adversely affect Josephson junction quality. In accordance with the present systems and methods, a TEOS dielectric deposition process (e.g., a CVD TEOS process or a plasma-enhanced CVD TEOS process) may be performed at significantly lower temperature (e.g., around 200° C.) when applied over a trilayer Josephson junction in order to preserve Josephson junction quality.

Many of the embodiments described herein are directed towards applications in superconducting quantum computation. Those of skill in the art will appreciate that the requirements (e.g., tolerable levels of noise) for manipulating quantum information may be more stringent than the requirements for manipulating non-quantum information. Thus, while the various embodiments described herein are particularly well-suited for use in the fabrication of a superconducting quantum processor, these teachings may be applied to any application incorporating superconducting integrated circuitry (including applications for which the performance criteria are less stringent). For example, the various teachings provided herein may be applied in single-flux quantum (SFQ) circuits or any circuit employing a Josephson junction. In some instances, applying the present systems and methods in non-quantum computing applications may allow certain constraints to be relaxed. An application of SFQ is likely to be less sensitive to noise than a quantum computing application, and as such a lower temperature dielectric process may readily be applied to an SFQ circuit in order to preserve Josephson junction quality with less regard for the resultant increase in dielectric defects.

In addition to lower-temperature dielectric deposition processes, metal deposition processes that occur after (e.g., on top of or above) a Josephson junction trilayer can also cause the junction to heat to the point of insulating barrier degradation. In accordance with the present systems and methods, unwanted heating of a Josephson junction trilayer by a subsequent metal deposition process may be avoided by performing a metal deposition process in multiple stages and allowing the system to cool in between stages.

Figure 15:
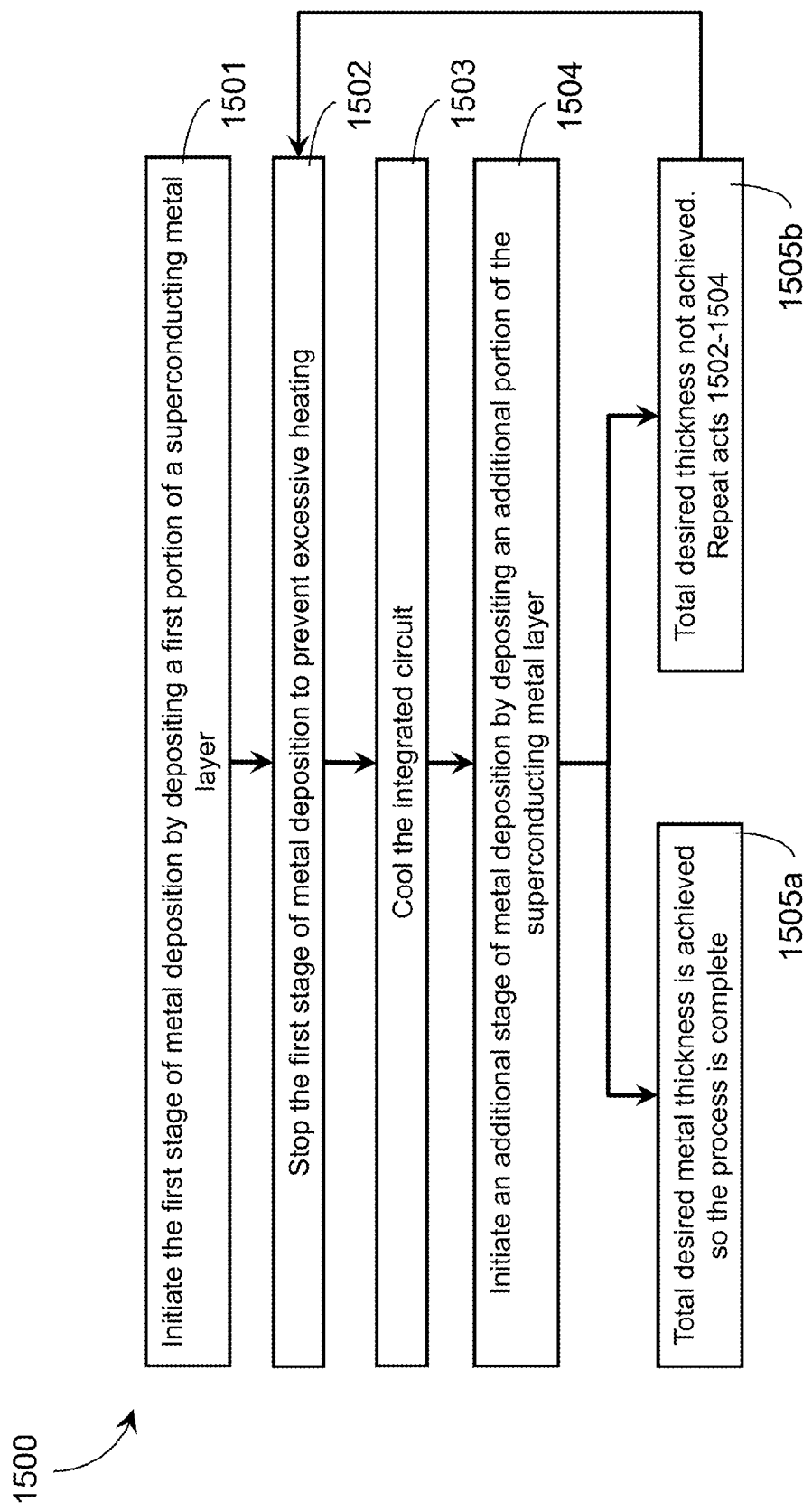
FIG. 15 is a flow diagram showing a method of performing multi-staged metal deposition, according to one illustrated embodiment.

FIG. 15 shows a method 1500 for performing multi-staged metal deposition in accordance with the present systems and methods. Method 1500 includes five operations or acts 1501-1505, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 1501, a first stage of the metal deposition process is initiated to deposit a first portion of a metal layer on an integrated circuit. The metal being deposited may be a superconducting metal such as niobium or aluminum and the metal deposition process may employ any deposition technique, such as CVD, PVD, or ALD. The process of depositing the metal may cause the integrated circuit to heat. At 1502, the first stage of the metal deposition process is stopped to prevent the integrated circuit from heating to the point where any existing components that are sensitive to high temperatures (e.g., Josephson junction trilayers) may be damaged. The temperature of the integrated circuit (or the temperature of the chamber in which the deposition takes place) may be monitored during the first stage of the metal deposition and the metal deposition process may be stopped when the temperature being monitored is seen to approach or exceed a predetermined threshold. Alternatively, a target deposition time may be determined in advance based on previous data and/or calculations and the first stage of the metal deposition process may be stopped once the pre-defined target deposition time has elapsed. At 1503, the integrated circuit is cooled. Since the metal deposition process has been stopped, the circuit may cool passively with the passage of time and act 1503 may simply involve waiting until the circuit has cooled. In some embodiments, the circuit may be cooled actively by filling the deposition chamber with an inert gas, such as argon. In general, the higher the pressure of the gas the better thermalization it will provide, but of course the pressure is limited by factors such as the strength of the chamber, the cooling time, etc. At 1504, an additional stage of the metal deposition process is initiated to deposit an additional portion of the metal layer (i.e., to resume depositing the metal layer) on top of or over the previous portion of the metal layer. The additional stage of the metal deposition may continue until either the total desired metal layer thickness (i.e., the sum of the thickness of the first portion of the metal layer plus the thickness of the additional portion(s) of the metal layer) is deposited or until the threshold temperature/time is reached again. At 1505a, the total desired metal layer thickness is achieved and the multi-stage metal layer deposition process is complete. At 1505b, the temperature of the circuit reaches the threshold temperature before the total desired metal thickness is achieved so acts 1502-1505 are repeated until the total desired metal layer thickness is achieved.

The various embodiments described herein provide systems and methods for the fabrication of multilayered superconducting integrated circuits. Such circuits are typically fabricated layer by layer (e.g., one layer at a time, and with via connections between layers), thus it is important to ensure that the features in each layer are properly aligned with the features of the layer or layers above and/or below. For example, a feature in a second layer that is to be connected by a via connection to a feature in a first layer (where the second layer is above the first layer) typically needs to be properly aligned above the feature in the first layer. Throughout the semiconducting fabrication industry, a process known as "open frame mask and etch" is often employed to provide this alignment. The open frame mask and etch technique involves marking the substrate with a "zero mark" or "alignment mark" before any conducting or insulating layers are deposited therein. The zero mark then needs to be "seen" before each subsequent layer is deposited over the substrate. This means that after a conducting layer has been deposited, the region of the conducting layer that overlies the zero mark in the substrate needs to be etched away to expose the zero mark so that the patterning of the conducting layer can be properly aligned. Thin dielectric layers (e.g., SiO$_2$) are typically sufficiently transparent to enable the zero mark to be seen without etching.

Thus, in a superconducting version of the open frame mask and etch alignment technique, a superconducting metal layer is deposited and a first photoresist mask layer is deposited on or over the superconducting metal layer that completely covers the surface of the superconducting metal layer except for an open region in the vicinity of the zero mark. An etch is then applied that etches away the exposed region in the superconducting metal layer to reveal the zero mark in the substrate. Any remaining photoresist is then stripped away, and a second photoresist mask layer is then deposited on or over the superconducting metal layer, where the second photoresist mask layer provides the circuit pattern for the superconducting metal layer, aligned to the exposed zero mark in the substrate. This process is repeated for each subsequent superconducting metal layer in the integrated circuit stack. As stated above, the open frame mask and etch process is commonly used in the semiconducting industry; unfortunately, when the same technique is applied using superconducting metal such as niobium, it has been found that exposing the same superconducting (e.g., niobium) metal layer to two photoresist masking and etching operations (i.e., a first for exposing the zero mark and then a second for applying the circuit pattern aligned to the zero mark) can result in the formation of undesirable residues (e.g., photoresist residues and/or metallic residues, Nb defects, etc.) on the surface of the superconducting metal layer which can adversely affect the performance of the integrated circuit. Thus, there is a need in the art for an alternative method of aligning the multiple layers in a superconducting integrated circuit that reduces the number of masking and etching operations per superconducting metal layer.

In accordance with the present systems and methods, the layers of a multilayered superconducting integrated circuit may be properly aligned during fabrication by etching a respective alignment mark into each dielectric layer. In this approach, no zero markings are required on the substrate. Instead, a first superconducting metal layer may be patterned to include circuit wiring and an alignment mark. A dielectric layer may be deposited on or over the first superconducting metal layer. The dielectric layer, for example SiO$_2$, may be sufficiently transparent to enable the alignment mark in the first superconducting metal layer to be discerned through the dielectric layer. The dielectric layer may then be patterned and etched to provide holes that expose specific portions of the first superconducting metal layer, where these holes will ultimately correspond to superconducting via connections to the first superconducting metal layer. Such patterning and etching of the dielectric layer is standard. However, in accordance with the present systems and methods, the pattern in the dielectric layer may also include an alignment mark that overlies the alignment mark in the first superconducting metal layer. This alignment mark is etched into the dielectric layer and can easily be made to overlie the alignment mark in the first superconducting metal layer because the dielectric layer is sufficiently transparent. A second superconducting metal layer is then deposited on top of or over the dielectric layer. The deposition of the second superconducting metal layer fills (or at least, partially fills) the patterned holes in the dielectric layer to provide superconducting via connections to the first superconducting metal layer. The deposition of the second superconducting metal layer also at least partially fills the alignment mark etched into the dielectric layer. The alignment mark may be designed (e.g., in size and/or in shape) so that the fact that it is filled by the deposition of the second superconducting metal layer causes the alignment mark to be discernible in the upper surface of the second superconducting metal layer. For example, if the alignment mark is sufficiently large, an impression of the alignment mark may be discernible in the upper surface of the second superconducting metal layer as the metal "sinks in" to fill the mark. Thus, an alignment mark in the first superconducting metal layer is recreated in the overlying dielectric layer such that it leaves an impression in the second superconducting metal layer. The photoresist mask providing the pattern for the second superconducting metal layer may then be deposited and aligned to the impression of the alignment mark. This process may then be repeated for any number of additional layers.

Figure 16:
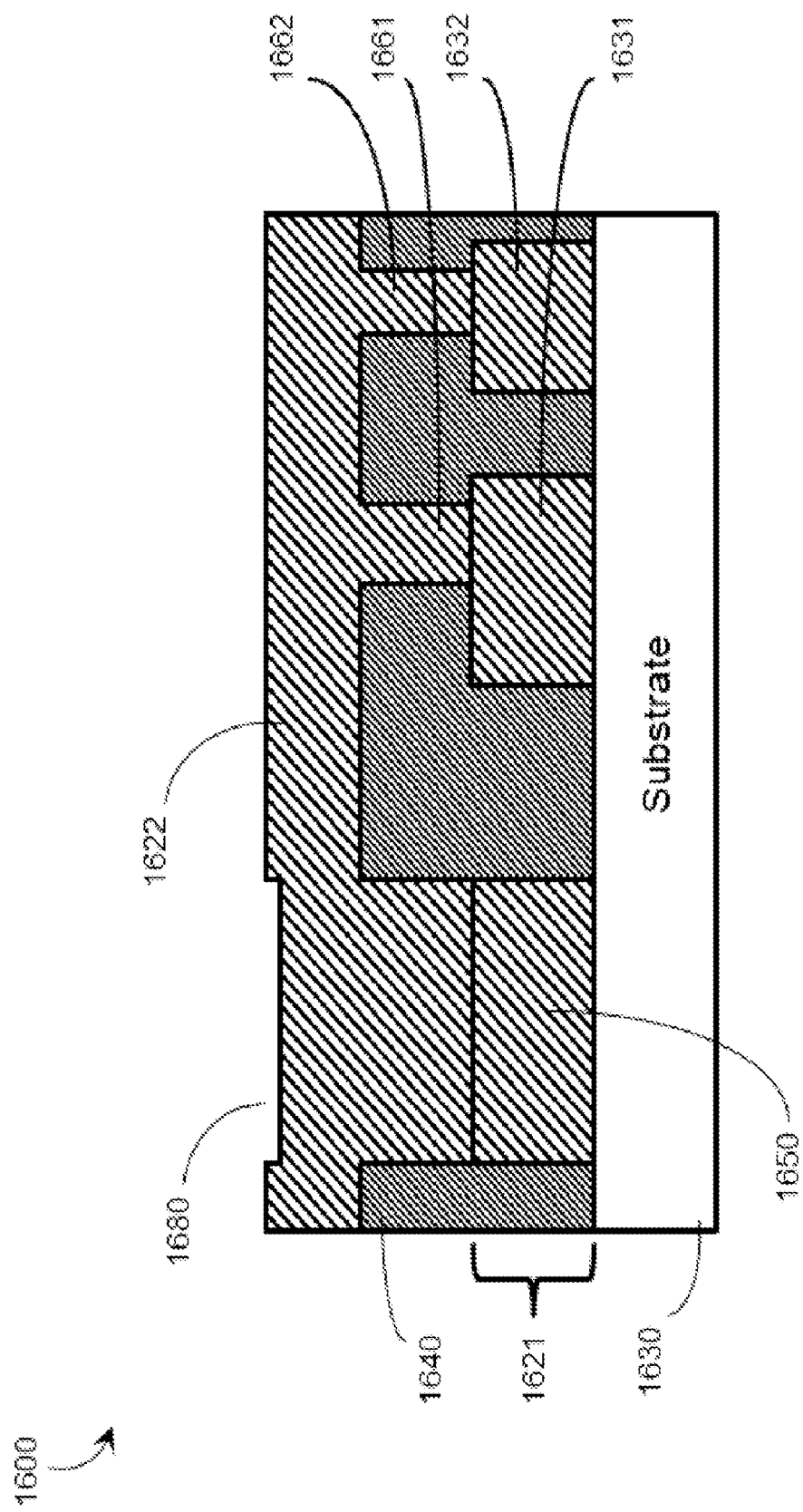
FIG. 16 is an elevational, partially sectioned, view of a portion of an integrated circuit showing an impression of an alignment mark in a superconducting metal layer, according to one illustrated embodiment.

FIG. 16 is a sectional view of a portion of an exemplary superconducting integrated circuit 1600 showing an impression 1680 of an alignment mark in a superconducting metal layer 1622. Circuit 1600 includes substrate 1630, upon which is deposited a first superconducting metal layer 1621. Layer 1621 has been patterned (by, for example, masking and etching) to define wiring features 1631, 1632 and an alignment mark 1650. Dielectric layer 1640 has been deposited over patterned metal layer 1621. Dielectric layer 1640 has also been patterned (e.g., by masking and etching) to expose alignment mark 1650 and wiring features 1631, 1632 of metal layer 1621. Metal layer 1622 has been deposited over dielectric layer 1640 and filled the open features in dielectric layer 1640 to produce superconducting vias 1661, 1662 and an impression 1680 in the upper surface of metal layer 1622 that overlies alignment mark 1650. Impression 1680 may arise due to the size and/or shape of alignment mark 1650. In various embodiments and depending on the nature of alignment mark 1650, impression 1680 may include at least one recess, at least one protrusion, multiple recesses, multiple protrusions, and/or a combination of at least one recess and at least one protrusion. Impression 1680 may be discernible during subsequent lithographic processing of metal layer 1622 and thereby serves as a point of reference for aligning the deposition of a photoresist mask layer on top of metal layer 1622. If an additional metal layer (not shown) is to be deposited on top of or over metal layer 1622 (e.g., after deposition of an additional dielectric layer) then impression 1680 may be patterned into a new alignment mark in metal layer 1622 (or, alternatively, impression 1680 may be etched away and a new alignment mark may be patterned elsewhere into metal layer 1622). This process of patterning alignment marks into dielectric layers to leave impressions in overlying metal layers allows multiple layers to be aligned in a stack without the additional metal-patterning operations or acts associated with open frame mask and etch alignment techniques. In this way, potentially undesirable photoresist and/or metallic residues may be avoided or reduced. In some embodiments, the alignment mark(s) 1650 may be designed to provide a distinctive impression in 1680 that may be easily distinguished from other surface features inherent to the fabrication process. For example, the alignment mark(s) may be significantly (e.g., multiple times) larger than features in the circuit pattern itself and/or may embody a distinct shape or shapes. The process described in the context of FIG. 16 is summarized in FIG. 17.

Figure 17:
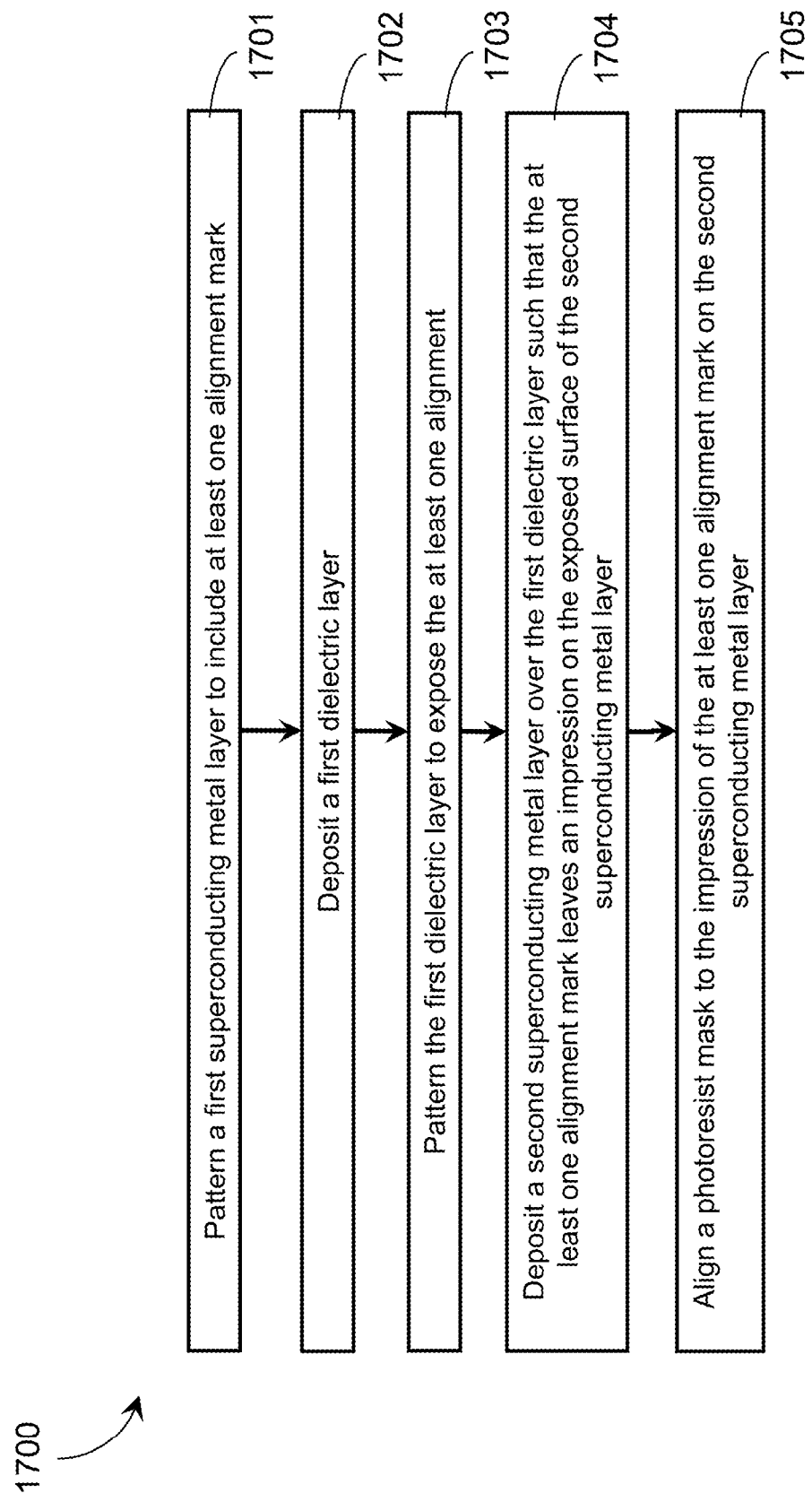
FIG. 17 is a flow diagram showing a method of aligning multiple layers in a multi-layered superconducting integrated circuit without using an open frame and match technique, according to one illustrated embodiment.

FIG. 17 shows a method 1700 for aligning multiple layers in a multi-layered superconducting integrated circuit without using an open frame and match technique in accordance with the present systems and methods. Method 1700 includes five operations or acts 1701-1705, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 1701, a first superconducting metal layer is patterned to include at least one alignment mark. As previously described, the alignment mark may be large or otherwise specifically designed to leave a recognizable impression in an overlying metal layer such that the impression may be discerned during a subsequent lithography stage. At 1702, a first dielectric layer is deposited on or over the first superconducting metal layer. At 1703, the first dielectric layer is patterned (e.g., masked and etched) to define open holes at the locations of vias and to expose the at least one alignment mark. The first dielectric layer may be at least partially transparent and the at least one alignment mark may be discernible through the first dielectric layer. At 1704, a second superconducting metal layer is deposited on or over the first dielectric layer to at least partially fill open holes and provide via connections. The second superconducting metal layer also covers the at least one alignment mark, which leaves a corresponding impression on the opposite (i.e., the exposed) surface of the second superconducting metal layer. At 1705, a photoresist mask is aligned to the impression of the alignment mark on the second superconducting metal layer (e.g., on the exposed surface of the second superconducting metal layer). The photoresist mask may then be deposited on or over the second superconducting metal layer, and acts 1701-1705 may be repeated if additional superconducting metal layers are required. The alignments marks in subsequent layers may overlie the alignment mark in the first superconducting metal layer, or the alignment marks in subsequent metal layers may be positioned in locations that do not overlie the alignment mark in the first superconducting metal layer.

The issues of alignment described above may, in some instances, be avoided if an additive patterning process (such as a Damascene process or a dual Damascene process) is employed.

US Patent Publication 2011-0089405 describes the use of platinum as a resistor material in superconducting integrated circuits. In accordance with the present systems and methods, platinum may be deposited via a sputter process and a thin layer of an intermediate material, such as titanium, may be used to improve adhesion between the platinum and the surface upon which the platinum is being deposited. That is, if the platinum is to be used as a resistor deposited on or over a dielectric material such as $SiO_2$, a thin "adhesion layer" (formed of, e.g., titanium) may first be deposited (via, e.g., a sputter process) on the dielectric surface and the platinum may then be deposited directly on the adhesion layer. The titanium-platinum (TiPt) stack may then be patterned and etched via a lithographic process using, for example, $Cl_2$ and $SF_6$ chemistry in the etchant.

As previously described, some superconducting metals, including niobium, do not naturally fill via holes very well. This can result in poor electrical contacts between wiring layers of superconducting integrated circuits that employ vias. In accordance with the present systems and methods, via-fill may be improved by changing the etch profile of the via hole. Typically, a via hole is etched to form substantially smooth, substantially vertical sidewalls (see, e.g., vias 1261 and 1262 in FIGS. 12E to 12G and vias 1661 and 1662 in FIG. 16). In accordance with the present systems and methods, forming via holes having textured and/or non-vertical sidewalls may improve via fill when superconducting metal, such as niobium, is subsequently deposited. Via holes having textured and/or non-vertical sidewalls may therefore improve electrical connections between wiring layers in multilayered superconducting integrated circuits and/or enable higher aspect ratio vias (e.g., aspect ratios greater than about 0.7:1) to be fabricated. An example of a via having non-vertical sidewalls is a tapered via. Techniques for fabricating tapered vias are generally known in the semiconductor industry and, in accordance with the present systems and methods, many of the same techniques (e.g., etchant chemistry, etc.) may be employed in the fabrication of superconducting vias to improve superconducting electrical connections between layers in a superconducting integrated circuit.

Figure 18:
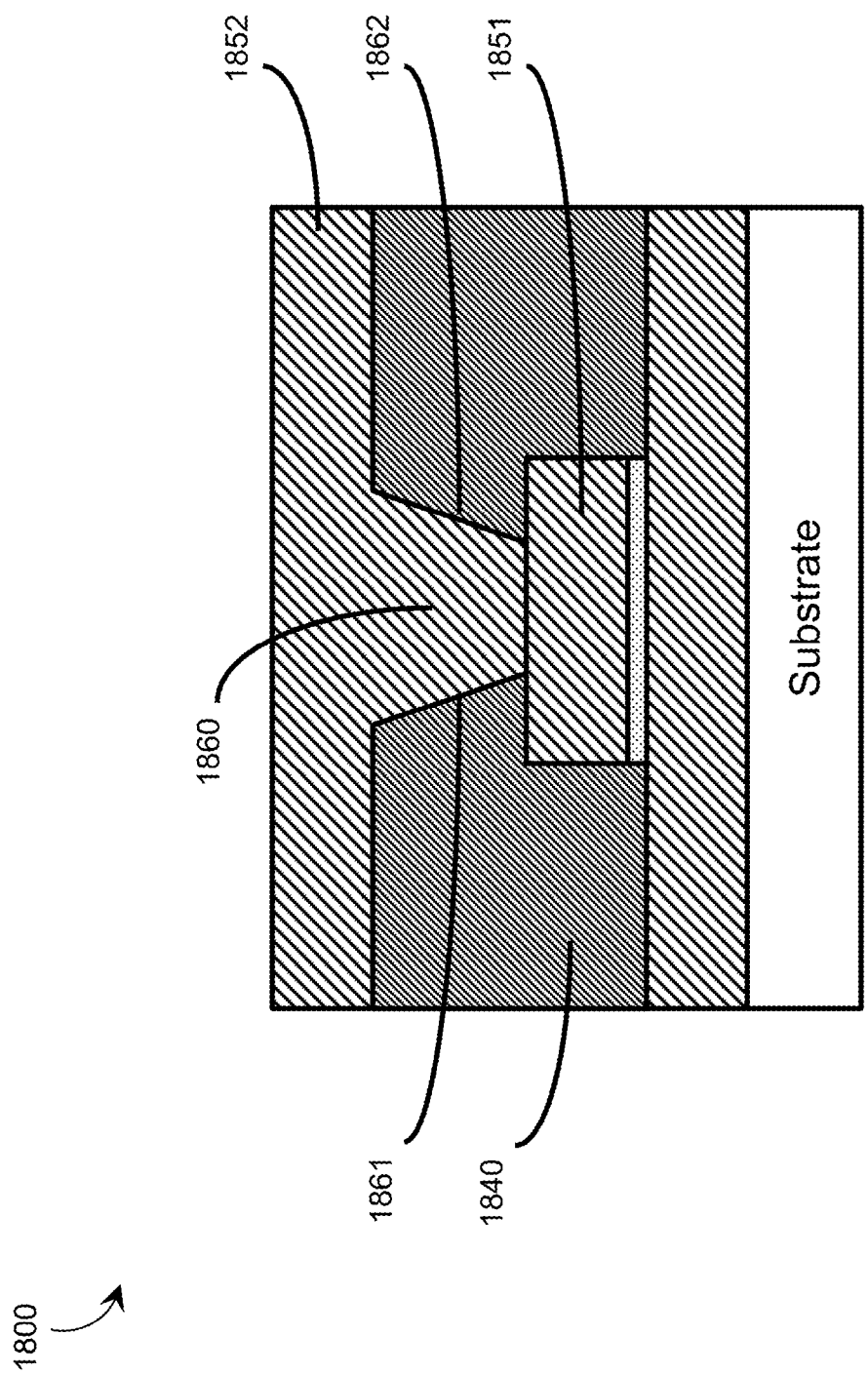
FIG. 18 is a sectional view of a portion of an exemplary superconducting integrated circuit showing a superconducting via having non-vertical sidewalls, according to one illustrated embodiment.

FIG. 18 is a sectional view of a portion of an exemplary superconducting integrated circuit 1800 showing superconducting via 1860 having non-vertical sidewalls 1861 and 1862, in accordance with the present systems and methods. As illustrated in FIG. 18, sidewalls 1861 and 1862 are tapered such that via 1860 is wider at the top and narrower at the bottom. Tapered superconducting via 1860 provides a superconducting electrical connection between superconducting wiring layer 1852 and superconducting wiring layer 1851. As illustrated, superconducting wiring layer 1851 provides the top/counter electrode of a Josephson junction. While tapered superconducting via 1860 may be etched according to known techniques for etching tapered vias in the semiconductor industry, in accordance with the present systems and methods, the superconducting metal of superconducting wiring layer 1851 (e.g., niobium) may be used as an etch stop in the etching of tapered via 1860 (as opposed to materials more commonly used as an etch stop in the semiconductor industry). Once the tapered profile of via 1860 is etched into dielectric layer 1840, superconducting metal (e.g., niobium) 1852 may be deposited over dielectric layer 1840 to fill via 1860. The tapered profile of sidewalls 1861 and 1862 may facilitate improved filling of via 1860 with superconducting metal 1852 compared to, for example, a via profile having vertical sidewalls. An improved superconducting electrical connection between superconducting metal layer 1852 and superconducting metal layer 1851 may thus be established, where superconducting metal layer 1851 (e.g., niobium) serves as both an etch-stop during etching of tapered via 1860 and as a superconducting wiring layer in circuit 1800.

In some cases, poor fill of superconducting vias may be a result of over-etching a via hole and digging into the underlying superconducting metal layer. Such over-etching can produce a trench in the metal (e.g., niobium) beneath the sidewalls of the via and, once the via is subsequently filled with superconducting metal (e.g., niobium), result in thin physical connections between the superconducting metal on the via sidewalls and the underlying superconducting metal beneath the via. Thin physical connections typically result in poor electrical connections. In accordance with the present systems and methods, over-etching into underlying superconducting metal may be reduced by depositing a protective cap layer over the underlying superconducting metal. For example, a superconducting metal layer may be capped with a thin layer of protective material (such as titanium nitride or silicon nitride). When a via is subsequently etched over top of the capped superconducting metal layer, the protective cap layer may prevent over-etching into the superconducting metal layer and ultimately provide better electrical connections between superconducting metal on the via sidewalls and the superconducting metal layer beneath. The protective cap layer may be superconducting material. Titanium nitride is particularly well-suited to provide a capping layer on niobium wiring layers because: titanium nitride can superconduct below about 4.2K, titanium nitride oxidizes less than niobium, and titanium nitride etches well with niobium etch chemistry but serves as a good etch stop for $SiO_2$ etch chemistry (i.e., during via etch). In some applications, it is advantageous to ensure that a protective capping layer formed of superconducting material does not create superconductive shorts between elements of a patterned superconducting metal layer (e.g., between superconductive paths or traces in a superconducting wiring layer). Such shorts may be avoided by, for example, depositing the protective capping layer over a superconducting metal layer prior to patterning the superconducting metal layer such that the capping layer is also patterned during the patterning process.

Figure 19:
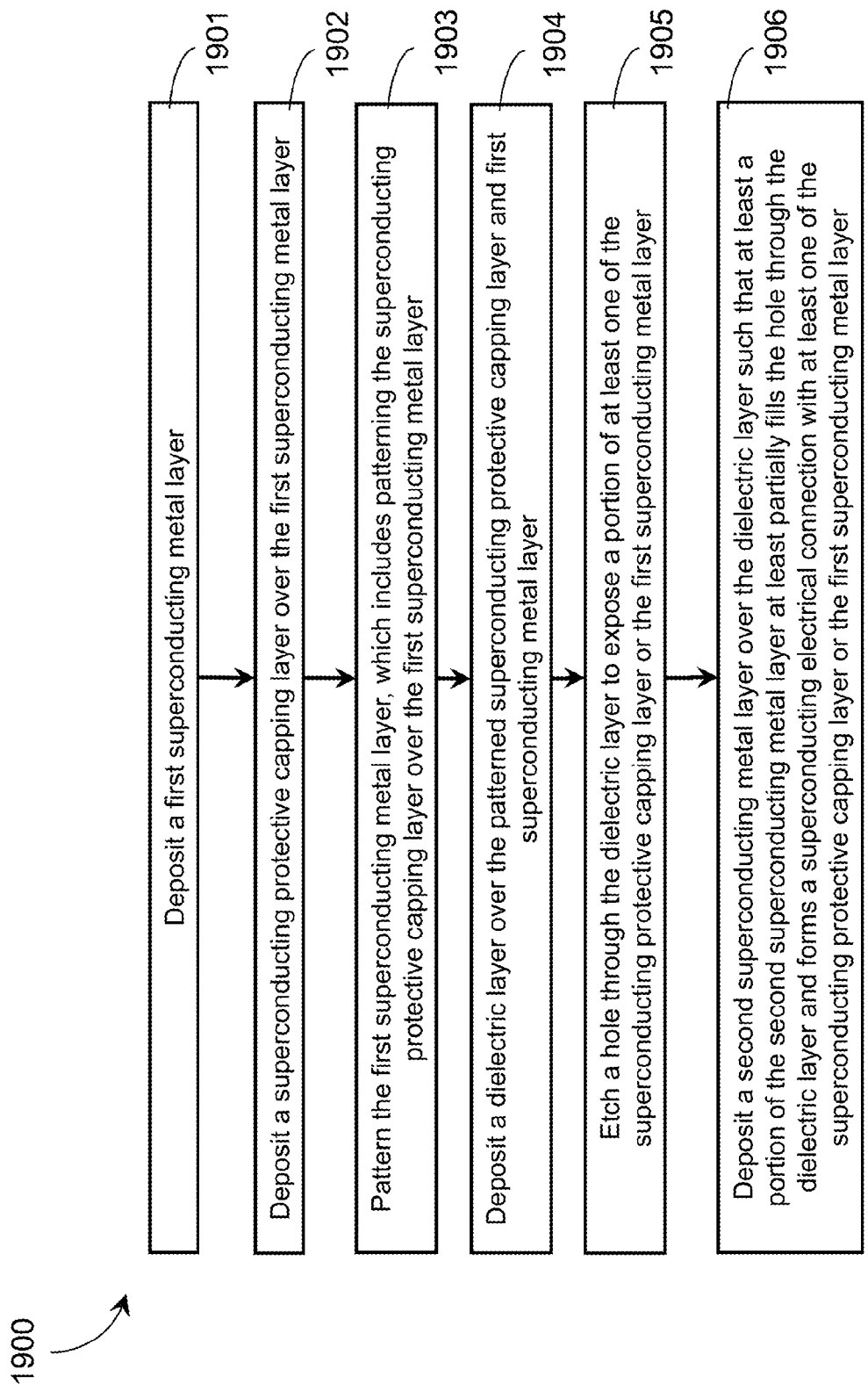
FIG. 19 shows a method for forming a superconducting via in accordance with the present systems and methods.

FIG. 19 shows a method 1900 for forming a superconducting via in accordance with the present systems and methods. Method 1900 includes six operations or acts 1901-1906, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 1901, a first superconducting metal layer is deposited. The first superconducting metal layer may comprise a superconducting metal, such as niobium or aluminum, and may be deposited over a substrate or dielectric layer, or over an insulating barrier such as an aluminum oxide layer. The first superconducting metal layer may, for example, be a superconducting wiring layer or a superconducting counter electrode layer in a Josephson junction. At 1902, a superconducting protective capping layer is deposited over the first superconducting metal layer. The superconducting protective capping layer may comprise, for example, titanium nitride, niobium titanium nitride, or any other suitable material. At 1903, the first superconducting metal layer is patterned (via, for example, a photoresist mask and etching process as described previously). Patterning the first superconducting metal layer necessarily includes patterning the superconducting protective capping layer with the same pattern such that the portions of the first superconducting metal layer that remain after the patterning process (e.g., a wiring pattern in the superconducting metal layer, and/or the definitions of Josephson junction counter electrodes in the superconducting metal layer) retain the superconducting protective capping layer thereover. At 1904, a dielectric layer is deposited over the patterned superconducting protective capping layer and first superconducting metal layer. The dielectric layer may comprise, for example, silicon dioxide or a hybrid dielectric layer as described previously. At 1905, a hole is etched through the dielectric layer to expose a portion of at least one of the superconducting protective capping layer and the first superconducting metal layer. The etching process may stop when the superconducting protective capping layer is exposed, or the etching process may continue at least partially into the superconducting protective capping layer, or the etching process may stop when the first superconducting metal layer is exposed. In any case, the superconducting protective capping layer may help to maintain the shape of the hole during the etching process and prevent over-etching into the first superconducting metal layer. At 1906, a second superconducting metal layer is deposited over the dielectric layer. The second superconducting metal layer may at least partially fill the hole through the dielectric layer and form a superconducting electrical connection (i.e., a superconducting via) with at least one of the superconducting protective capping layer and the first superconducting metal layer.

Figure 20:
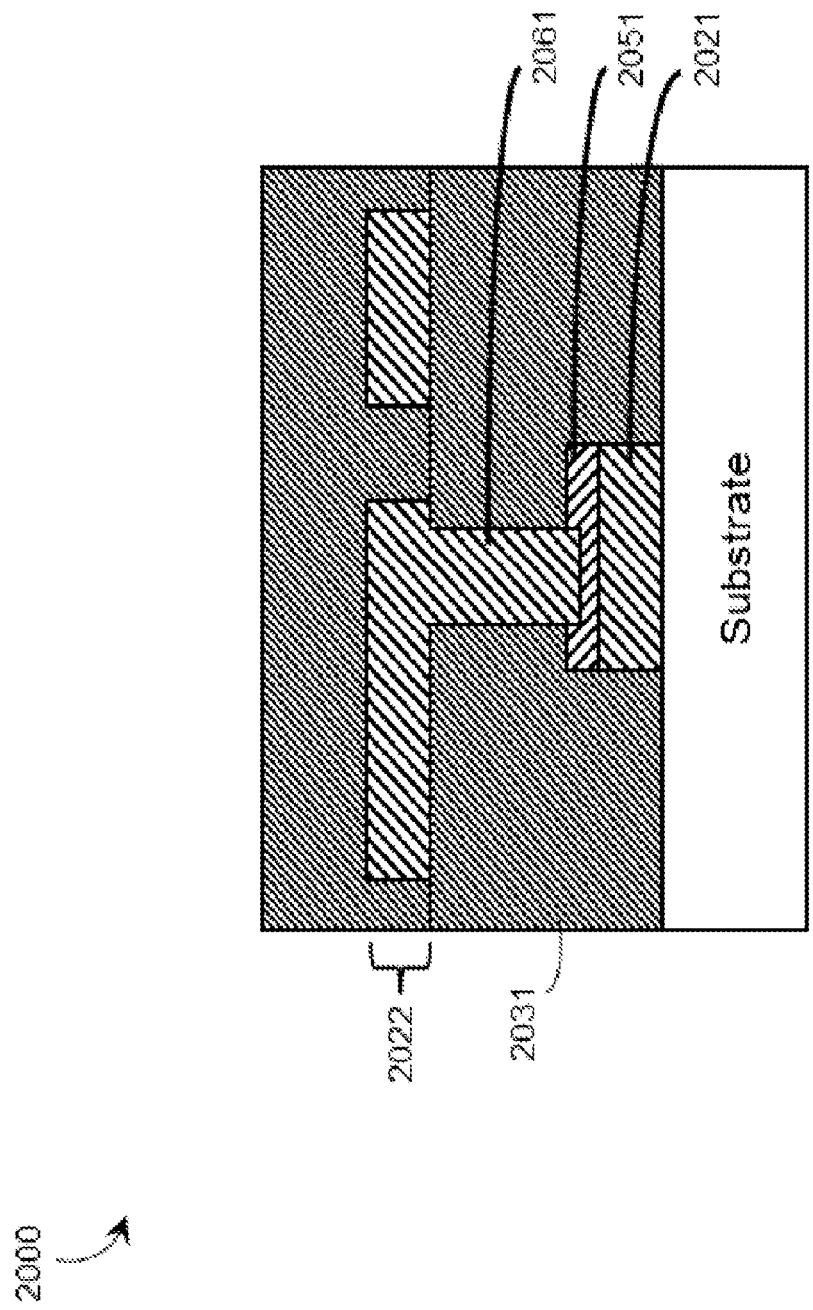
FIG. 20 is a sectional view of a portion of a superconducting integrated circuit including a superconducting protective capping layer over a superconducting metal layer in accordance with the present systems and methods.

FIG. 20 is a sectional view of a portion of a superconducting integrated circuit 2000 including a superconducting protective capping layer 2051 over a superconducting metal layer 2021 in accordance with the present systems and methods. Superconducting integrated circuit 2000 further includes superconducting metal layer 2022 that is separated from superconducting metal layer 2021 by dielectric layer 2031. Superconducting metal layers 2021 and 2022 may each include, for example, niobium. Superconducting metal layer 2021 is superconductively coupled to superconducting metal layer 2022 through superconducting via 2061. In FIG. 19, via 2061 is shown partially etched into superconducting protective capping layer 2051 without exposing superconducting metal layer 2021. As described above, superconducting protective capping layer 2051 may prevent over-etching into superconducting metal layer 2021 during the formation of superconducting via 2061 and thereby improve the superconducting electrical connection between superconducting metal layers 2021 and 2022. Superconducting protective capping layer 2051 may include, for example, titanium nitride, niobium titanium nitride, or any suitable material as described above.

As described previously, the behavior of a Josephson junction is influenced by a property called its critical current. The critical current of a Josephson junction is the maximum amount of current (for a given external magnetic field, typically reported at zero external magnetic field) that can flow through the junction without causing the junction to switch into the voltage state. The critical current of a Josephson junction is dependent on a number of factors, including the area of the junction and the thickness of the insulating barrier. For a given thickness of insulating barrier, the larger the area of the junction the larger its critical current. Likewise, for a given area of junction, the larger the thickness of the insulating barrier the lower its critical current. In superconducting integrated circuits that employ trilayer Josephson junctions, a single trilayer having a uniform barrier thickness is typically deposited and junctions of different critical currents are realized by patterning the trilayer to form junctions of different areas. For example, if a circuit requires a first Josephson junction having a first critical current and a second Josephson junction having a second critical current where the second critical current is larger than the first critical current, then the second Josephson junction may be designed and laid out to have a larger area than the first Josephson junction. This approach is suitable for relatively small circuits and/or for circuits that employ Josephson junctions having similar critical currents, but can be problematic for large complicated circuits and/or circuits that employ Josephson junctions spanning a wide range of critical currents. For example, in a circuit that makes use of a single trilayer to form a first set of Josephson junctions having a first critical current and a second set of Josephson junctions having a second critical current, where the second critical current is much larger than the first critical current, the area of each junction in the second set of junctions needs to be much larger than the area of each junction in the first set of junctions. The large areas of the junctions in the second set of Josephson junctions may undesirably increase the total footprint (i.e., area) of the integrated circuit itself, which can introduce complications in connecting the circuit to an electrical input/output system and/or in shielding the circuit from ambient magnetic fields, and can ultimately render the integrated circuit too large for its intended application. In some applications, it may be possible to overcome these problems by depositing a separate trilayer within the integrated circuit, where the second trilayer employs an insulating barrier thickness that is different from that of the first trilayer. However, depositing a second trilayer significantly increases the number of layers in the integrated circuit stack and, accordingly, the number of processing steps required in the fabrication of the stack. Such can increase the likelihood of defects and generally reduce the likelihood of yielding a fully functional circuit. It can also be very challenging to achieve a uniform insulating barrier thickness in a second trilayer because the second trilayer must necessarily be deposited at a higher layer in the circuit stack (i.e., the first and second trilayers cannot both be deposited on the substrate) where the surface upon which the second trilayer is deposited may be less smooth and less level than the substrate.

The thickness of the insulating barrier in a Josephson junction influences a parameter known as the "critical current density," or "$J_c$," of the Josephson junction. $J_c$ is essentially a measure of the critical current per area of the Josephson junction, where a thicker insulating barrier typically produces a lower $J_c$ and a thinner insulating barrier typically produces a higher $J_c$.

In accordance with the present systems and methods, Josephson junctions having different critical currents may be realized in a single superconducting integrated circuit by replacing the Josephson junction trilayer with a Josephson junction "pentalayer" having two insulating barriers of different thicknesses. A Josephson junction "pentalayer" may comprise five layers: a first layer of superconducting material (e.g., niobium) serving as a first base electrode, a first insulating barrier (e.g., aluminum oxide, including aluminum oxide grown on aluminum as described previously) having a first $J_c$, a second layer of superconducting material (e.g., niobium) serving as both a first counter electrode and a second base electrode, a second insulating barrier (e.g., aluminum oxide, including aluminum oxide grown on aluminum) having a second $J_c$ that is different from the first $J_c$, and a third layer of superconducting material (e.g., niobium) serving as a second counter electrode. As will be described in more detail, in general it may be advantageous for the second insulating barrier to be thicker than the first insulating barrier such that the second $J_c$ is less than the first $J_c$.

Figure 21A:
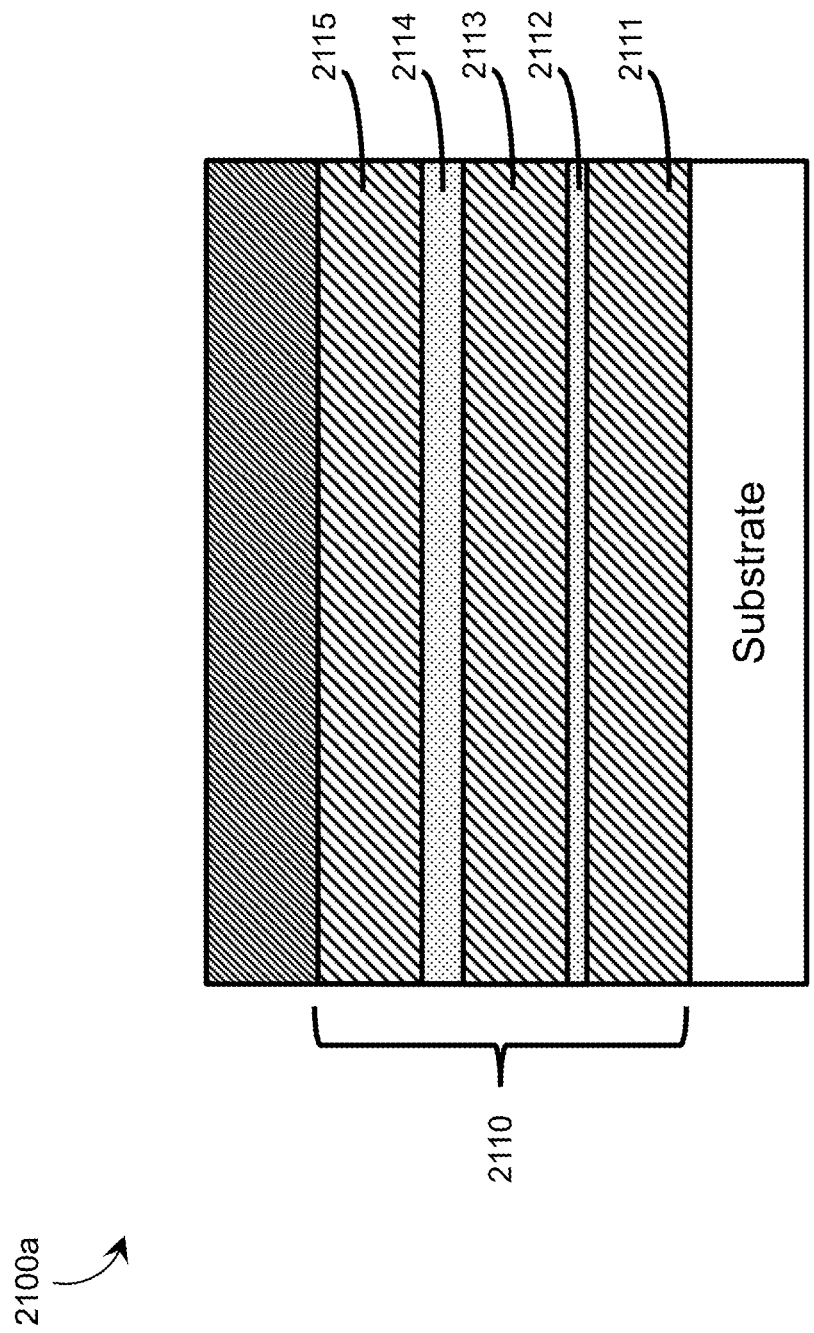
FIG. 21A is a sectional view of a portion of a superconducting integrated circuit including a Josephson junction pentalayer in accordance with the present systems and methods.

FIG. 21A is a sectional view of a portion of a superconducting integrated circuit 2100a including a Josephson junction pentalayer 2110 in accordance with the present systems and methods. Pentalayer 2110 comprises: first base electrode 2111 formed of niobium, first insulating barrier 2112 formed of aluminum oxide (as described previously, a layer of aluminum may be positioned in between first base electrode 2111 and first insulating barrier 2112 for the purpose of growing first insulating barrier 2112), first counter electrode 2113 formed of niobium, where first counter electrode 2113 may also serve as a second base electrode, second insulating barrier 2114 formed of aluminum oxide (as described previously, a layer of aluminum may be positioned in between first counter electrode 2113 and second insulating barrier 2114 for the purpose of growing second insulating barrier 2114), and second counter electrode 2115 formed of niobium. As illustrated in FIG. 21A, first insulating barrier 2112 is substantially thinner than second insulating barrier 2114. As a result, first insulating barrier 2112 has a substantially higher $J_c$ than second insulating barrier 2114. In accordance with the present systems and methods, pentalayer 2110 may be patterned to form Josephson junctions whose critical currents are determined by either insulating barrier 2112 or insulating barrier 2114. Therefore, pentalayer 2110 enables multiple $J_c$s to be used in defining Josephson junction circuit elements while employing fewer layers and fewer processing steps compared to a complete second trilayer. Furthermore, pentalayer 2110 minimizes the number of layers between second insulating barrier 2114 and the substrate so that second insulating barrier 2114 may be more level and more uniform in thickness than if it was deposited higher in the circuit stack.

As described above, first insulating barrier 2112 has a substantially higher $J_c$ (i.e., is thinner) than second insulating barrier 2114. In accordance with the present systems and methods, for most applications it is advantageous for the higher-$J_c$ barrier in a Josephson junction pentalayer to be positioned below the lower-$J_c$ barrier (or alternatively, for the lower-$J_c$ barrier to be positioned above the higher-$J_c$ barrier). This is because, just as in a trilayer stack, current flows "vertically" through the layers of a pentalayer stack. In an individual Josephson junction that includes both first insulating barrier 2112 and second insulating barrier 2114, the two insulating barriers are effectively in series with one another and the critical current of the junction is determined by the lower of the two $J_c$s. Due to the nature of the photoresist masking and etching techniques used to pattern Josephson junctions, it is straightforward to remove the topmost insulating barrier (i.e., second insulating barrier 2114) from a pentalayer stack while leaving the bottommost insulating barrier (i.e., first insulating barrier 2112) in place to define a Josephson junction, but it is considerably more difficult to remove the bottommost insulating barrier while leaving the topmost insulating barrier in place. Therefore, a Josephson junction patterned in pentalayer 2110 will generally include either; i) both first insulating barrier 2112 and second insulating barrier 2114 such that the critical current of the junction is determined by the insulating barrier with the lower $J_c$ (i.e., by second insulating barrier 2114), or ii) only first insulating barrier 2112 such that the critical current of the junction is determined by insulating barrier 2112. When only first insulating barrier 2112 is present, the critical current of the Josephson junction is determined by the $J_c$ of first insulating barrier 2112. However, when both first insulating barrier 2112 and second insulating barrier 2114 are present, the critical current of the Josephson junction is determined by the lower of the two $J_c$s (in this case, the critical current is determined by second insulating barrier 2114). Thus, it is advantageous for the $J_c$ of the topmost insulating barrier (i.e., second insulating barrier 2114) to be lower than the $J_c$ of the bottommost insulating barrier (i.e., first insulating barrier 2112) to enable Josephson junctions of two different critical currents to be formed. If the bottommost insulating barrier (i.e., first insulating barrier 2112) had the lower $J_c$ of the two, then only junctions having a critical current defined by the bottommost insulating barrier (i.e., first insulating barrier 2112) could practically be formed.

Figure 21B:
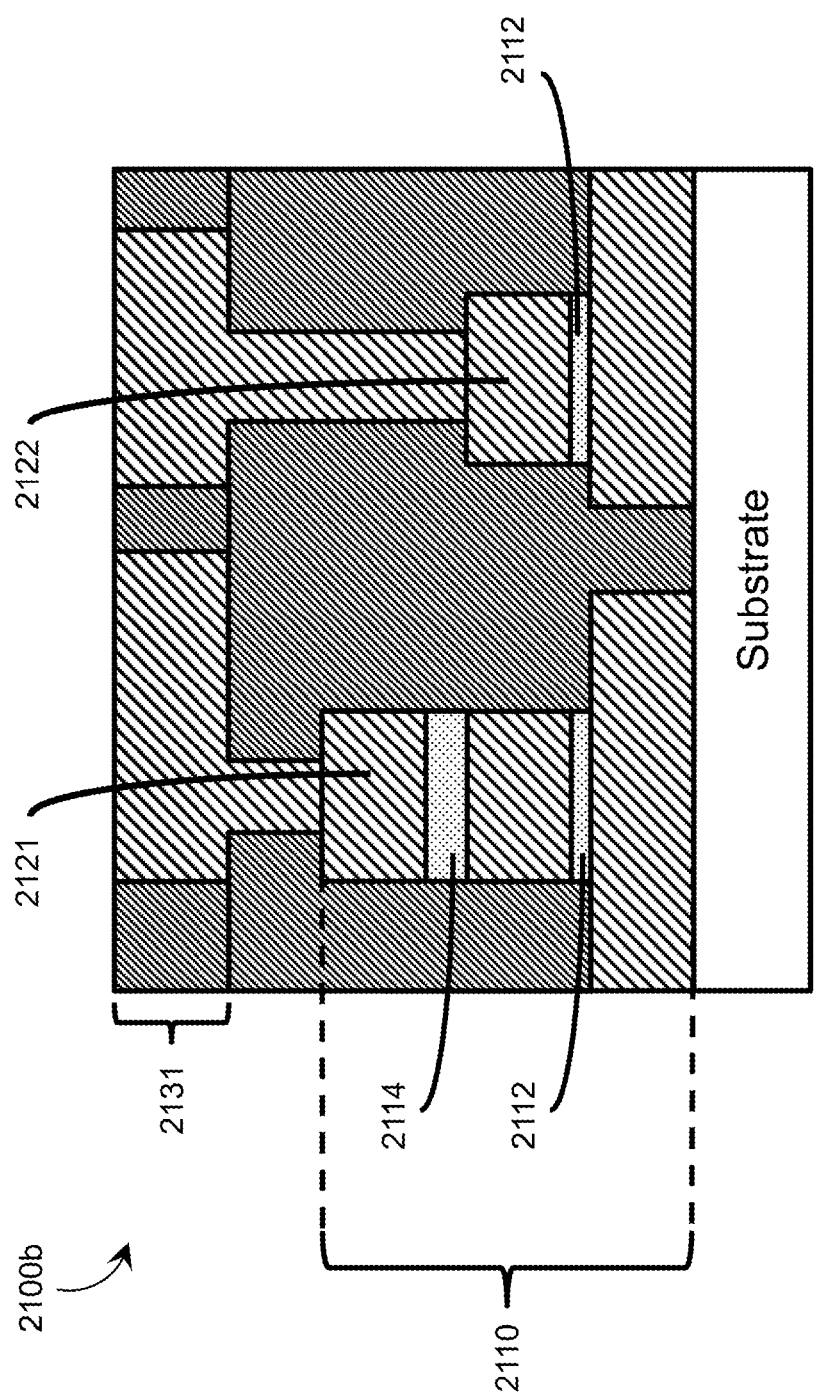
FIG. 21B is a sectional view of a portion of an exemplary superconducting integrated circuit in accordance with the present systems and methods.

FIG. 21B is a sectional view of a portion of an exemplary superconducting integrated circuit 2100*b* in accordance with the present systems and methods. FIG. 21B depicts superconducting integrated circuit 2100*a* from FIG. 21A after two Josephson junctions 2121 and 2122 have been defined using pentalayer 2110. Junction 2121 includes patterned portions of both first insulating barrier 2112 and second insulating barrier 2114, whereas junction 2122 includes only a patterned portion of first insulating barrier 2112. Thus, the critical current of junction 2122 is determined by the $J_c$ of first insulating barrier 2112, while the critical current of junction 2121 is determined by the lower $J_c$ between that of first insulating barrier 2112 and that of second insulating barrier 2114. Second insulating barrier 2114 is thicker than first insulating barrier 2112 and therefore second insulating barrier 2114 has a lower $J_c$ than first insulating barrier 2112. The critical current of junction 2121 is therefore determined by the $J_c$ of second insulating barrier 2114. Note, however, that if the $J_c$ of second insulating barrier 2114 were higher than that of first insulating barrier 2112, then the critical current of junction 2121 would be determined by the $J_c$ of first insulating barrier 2112 and both junction 2121 and junction 2122 would have the same critical current (for the same junction area) despite the presence of second insulating barrier 2114.

An example of a superconducting integrated circuit in which it is desirable to include Josephson junctions having substantially different critical currents is a superconducting quantum processor having local, on-chip memory and/or control circuitry. In such a circuit, superconducting qubits may employ Josephson junctions having a first critical current (or first range of critical currents) and on-chip memory/control circuitry may employ Single Flux Quantum (SFQ), Quantum Flux Parametron (QFP), or other superconducting logic circuitry (including but not limited to the schemes described in U.S. Pat. No. 8,098,179, U.S. Pat. No. 7,876,248, U.S. Pat. No. 8,035,540, U.S. Pat. No. 7,843,209, U.S. Pat. No. 8,018,244, and US Patent Publication Number 2011-0065586, each of which is incorporated herein by reference in its entirety) that may employ Josephson junctions having a second critical current (or second range of critical currents) that is substantially different from the first critical current (or first range of critical currents). By employing a Josephson junction pentalayer, memory/control circuitry may be integrated into the quantum processor architecture without requiring large-area Josephson junctions, and such may reduce the area of the processor and, for example, enable qubit size to be minimized (qubit size is advantageously minimized in quantum processors in order to reduce the coupling of noise into the qubit circuits).

Figure 22:
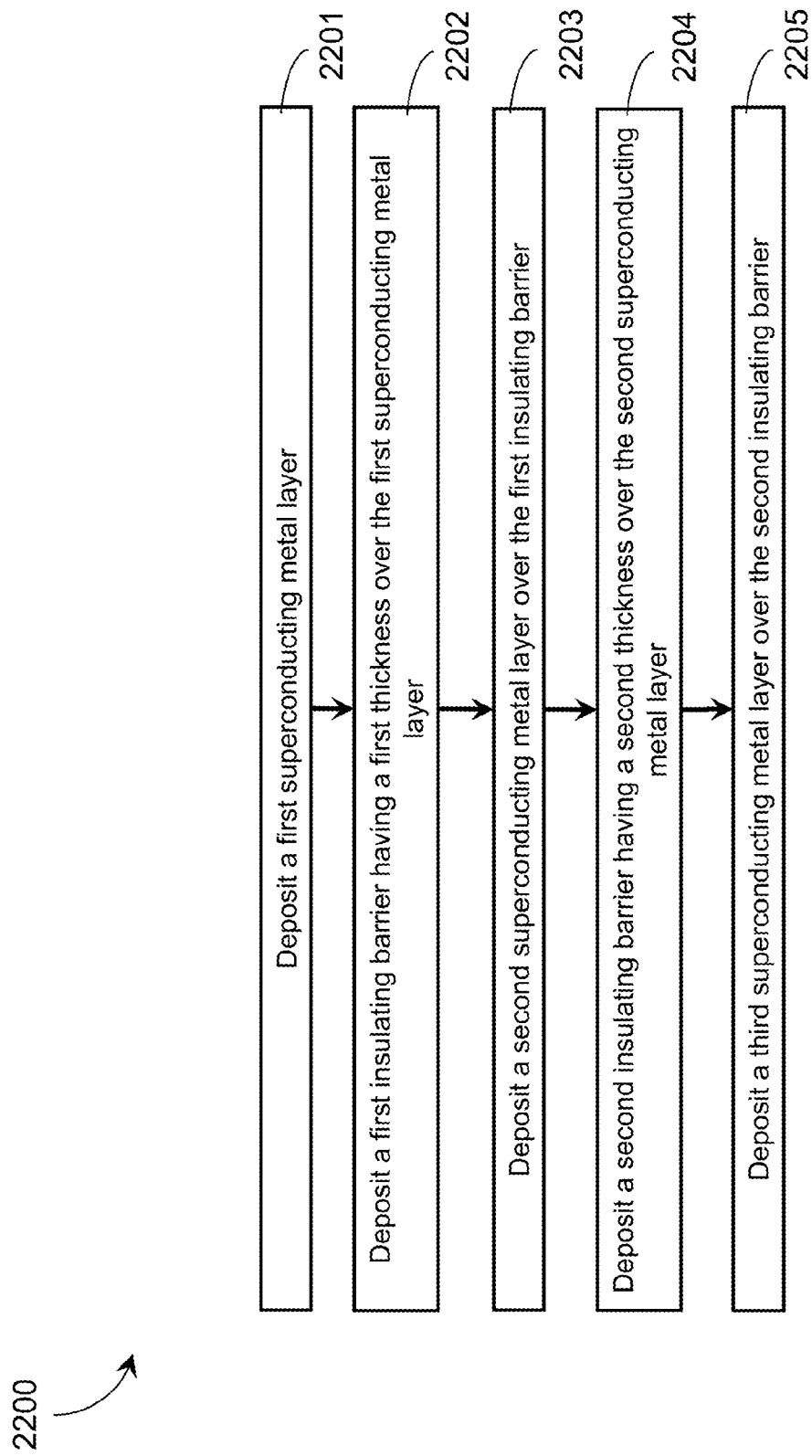
FIG. 22 shows a method for forming a Josephson junction pentalayer in accordance with the present systems and methods.

FIG. 22 shows a method 2200 for forming a Josephson junction pentalayer in accordance with the present systems and methods. Method 2200 includes five operations or acts 2201-2205, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 2201, a first superconducting metal layer is deposited. The first superconducting metal layer may comprise, for example, niobium and may be deposited on a dielectric layer or substrate. At 2202, a first insulating barrier is deposited over the first superconducting metal layer. The first insulating barrier may comprise, for example, aluminum oxide and depositing the first insulating barrier over the first superconducting metal layer may include depositing a layer of aluminum on top of the first superconducting metal layer and growing a layer of aluminum oxide on the layer of aluminum. The first insulating barrier may have a first thickness that provides a first critical current density, $J_{c1}$. At 2203, a second superconducting metal layer is deposited over the first insulating barrier. The second superconducting metal layer may comprise, for example, niobium. At 2204, a second insulating barrier is deposited over the second superconducting metal layer. The second insulating barrier may comprise, for example, aluminum oxide and depositing the second insulating barrier over the second superconducting metal layer may include depositing a layer of aluminum on top of the second superconducting metal layer and growing a layer of aluminum oxide on the layer of aluminum. The second insulating barrier may have a second thickness that provides a second critical current density, $J_{c2}$. At 2205, a third superconducting metal layer is deposited over the second insulating barrier. The third superconducting metal layer may comprise, for example, niobium. In accordance with the present systems and methods, the second thickness of the second insulating barrier may be substantially different from the first thickness of the first insulating barrier (such that $J_{c1}$ is substantially different from $J_{c2}$) in order to facilitate the fabrication of Josephson junctions having substantially different critical currents in, for example, applications of superconducting quantum processors. As described previously, it may be advantageous to ensure that the second thickness of the second insulating barrier is substantially greater than the first thickness of the first insulating barrier such that the critical current density $J_{c2}$ of the second insulating barrier is substantially less than the critical current density $J_{c1}$ of the first insulating barrier. The pentalayer formed by method 2200 may then be patterned to form Josephson junctions having substantially different critical currents without requiring that the Josephson junctions have substantially different areas in accordance with the present systems and methods.

Certain aspects of the present systems and methods may be realized at room temperature, and certain aspects may be realized at a superconducting temperature. Thus, throughout this specification and the appended claims, the term "superconducting" when used to describe a physical structure such as a "superconducting metal" is used to indicate a material that is capable of behaving as a superconductor at an appropriate temperature. A superconducting material may not necessarily be acting as a superconductor at all times in all embodiments of the present systems and methods.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other superconductive circuits and structures, not necessarily the exemplary superconductive circuits and structures generally described above.

The teachings of U.S. provisional patent application Ser. No. 61/608,379 filed Aug. 3, 2012 and U.S. provisional patent application Ser. No. 61/714,642 filed Oct. 16, 2012 are incorporated herein by reference, in their entirety.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications assigned D-Wave Systems Inc. referred to in this specification and/or listed in the Application Data Sheet, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of depositing a hybrid dielectric, the method comprising:
    depositing a first superconducting metal layer;
    depositing a first dielectric layer that directly overlies the first superconducting metal layer, the first dielectric layer comprising a first dielectric material;
    depositing a second dielectric layer over at least a portion of the first dielectric layer, the second dielectric layer comprising a second dielectric material; and
    depositing a third dielectric layer over at least a portion of the second dielectric layer, the third dielectric layer comprising a third dielectric material; and
    depositing a second superconducting metal layer, wherein the second superconducting metal layer directly overlies the third dielectric layer.

2. The method of claim 1 wherein:
    depositing a first dielectric layer comprising a first dielectric material includes depositing a first layer of silicon nitride that directly overlies the first superconducting metal layer;
    depositing a second dielectric layer comprising a second dielectric material includes depositing a layer of silicon dioxide that directly overlies the first layer of silicon nitride; and
    depositing a third dielectric layer comprising a third dielectric material includes depositing a second layer of silicon nitride that directly overlies the layer of silicon dioxide.

3. The method of claim 1 wherein depositing a first dielectric layer that directly overlies the first superconducting metal layer includes depositing a non-oxide dielectric that directly overlies the first superconducting metal layer.

4. The method of claim 3 wherein depositing a second dielectric layer over at least a portion of the first dielectric layer includes depositing an oxide dielectric over at least a portion of the first dielectric layer.

5. The method of claim 1 wherein depositing a second dielectric layer over at least a portion of the first dielectric layer includes depositing an oxide dielectric over at least a portion of the first dielectric layer.

6. The method of claim 1 wherein depositing a third dielectric layer over at least a portion of the second dielectric layer includes depositing a third dielectric layer comprising the first dielectric material.

* * * * *